(12) United States Patent
Ohashi et al.

(10) Patent No.: US 12,704,668 B2
(45) Date of Patent: Aug. 11, 2026

(54) DISPLAY ELEMENT AND DISPLAY APPARATUS

(71) Applicant: CANON KABUSHIKI KAISHA, Tokyo (JP)

(72) Inventors: Yoshihiro Ohashi, Tokyo (JP); Yutaka Yoshimasa, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 548 days.

(21) Appl. No.: 18/335,017

(22) Filed: Jun. 14, 2023

(65) Prior Publication Data

US 2023/0327058 A1 Oct. 12, 2023

Related U.S. Application Data

(63) Continuation of application No. PCT/JP2021/046058, filed on Dec. 14, 2021.

(30) Foreign Application Priority Data

Dec. 17, 2020 (JP) ................................ 2020-209074
Dec. 17, 2020 (JP) ................................ 2020-209075
Dec. 17, 2020 (JP) ................................ 2020-209076

(51) Int. Cl.

| | |
|---|---|
| ***G02B 5/22*** | (2006.01) |
| ***H10H 20/841*** | (2025.01) |
| ***H10H 20/851*** | (2025.01) |
| ***H10H 20/855*** | (2025.01) |
| ***H10K 59/80*** | (2023.01) |
| ***H10W 90/00*** | (2026.01) |

(52) U.S. Cl.

CPC ........... *G02B 5/223* (2013.01); *H10H 20/841* (2025.01); *H10H 20/8512* (2025.01); *H10H 20/8514* (2025.01); *H10H 20/855* (2025.01); *H10K 59/878* (2023.02); *H10K 59/879* (2023.02); *H10W 90/00* (2026.01); *H10K 59/877* (2023.02); *H10K 59/8792* (2023.02)

(58) Field of Classification Search

CPC .. G02B 5/223; H01L 25/0753; H10H 20/841; H10H 20/8512–8514; H10H 20/855–856; H10K 59/879; H10K 59/877; H10K 59/8792; H10K 59/38; H10K 59/878; G09F 9/33; G09F 9/335; H05B 33/02; H05B 33/12; H05B 33/24

See application file for complete search history.

(56) References Cited

U.S. PATENT DOCUMENTS

| | | | | |
|---|---|---|---|---|
| 2019/0121176 | A1 | 4/2019 | Lee et al. | |
| 2019/0267357 | A1* | 8/2019 | Iguchi | H01L 25/0753 |
| 2022/0077239 | A1* | 3/2022 | Kim | G02B 5/223 |
| 2024/0016022 | A1* | 1/2024 | Yan | H10K 59/126 |

FOREIGN PATENT DOCUMENTS

| | | | |
|---|---|---|---|
| JP | 2015008036 | A | 1/2015 |
| JP | 2019152851 | A | 9/2019 |
| JP | 2020086461 | A | 6/2020 |
| WO | 2016204166 | A1 | 12/2016 |

* cited by examiner

*Primary Examiner* — Anne M Hines
*Assistant Examiner* — Jose M Diaz
(74) *Attorney, Agent, or Firm* — Canon U.S.A., Inc. IP Division

(57) ABSTRACT

A display element includes a sub-pixel region including a wavelength conversion layer that converts a wavelength of excitation light, and further includes a low refractive index layer provided in a region between a wavelength conversion portion and an optical member.

19 Claims, 28 Drawing Sheets

REFLECTIVE LAYER B
WITH LOW REFRACTIVE INDEX LAYER
WITHOUT LOW REFRACTIVE INDEX LAYER
REFLECTANCE FOR 460 nm
1
0.9
0.8
0.7
0.6
0.5
0.4
0.3
0.2
0.1
0
0
10
20
30
40
50
60
70
80
90
ANGLE (°)

2-10
FIG. 2-6A
2-15 2-16 2-17
2-22
2-12
2-14
2-20
2-13
z
2-21
x
2-18 2-18
2-11 2-11 2-19 2-11
2-19
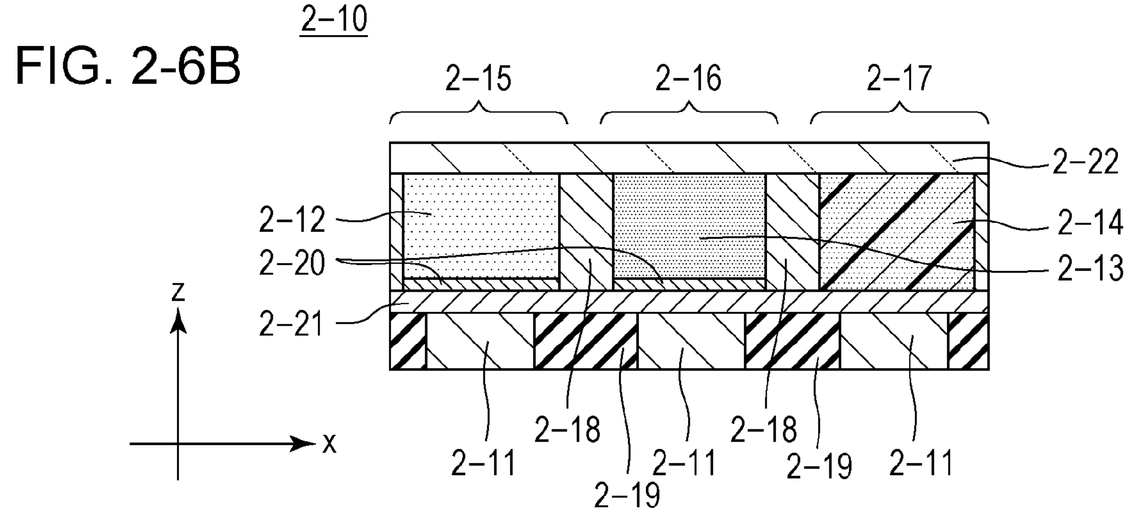
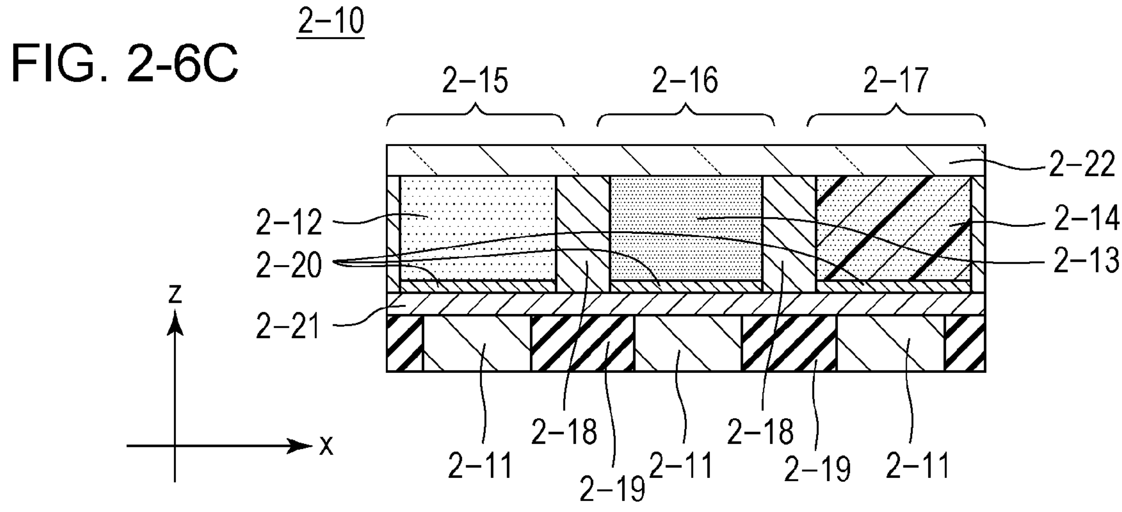

DISPLAY ELEMENT AND DISPLAY APPARATUS

CROSS-REFERENCE TO RELATED APPLICATIONS

This application is a Continuation of International Patent Application No. PCT/JP2021/046058, filed Dec. 14, 2021, which claims the benefit of Japanese Patent Application No. 2020-209076, filed Dec. 17, 2020, Japanese Patent Application No. 2020-209074, filed Dec. 17, 2020, and Japanese Patent Application No. 2020-209075, filed Dec. 17, 2020, all of which are hereby incorporated by reference herein in their entirety.

TECHNICAL FIELD

The present invention relates to a display element and a display apparatus.

BACKGROUND ART

There is a technology using quantum dots that exhibit emission with a narrow peak width at half height as a technique to implement color reproducibility compatible with wide color purity and high luminous efficiency in a display element and a display apparatus that display images. When a display element converts color with a wavelength conversion layer having quantum dots by using ultraviolet light or blue light as excitation light, the display element that achieves both color reproducibility and high luminous efficiency is implemented. A light emitting diode (LED), an organic light emitting diode (OLED), or the like can be used as a light source of excitation light. Particularly, a configuration in which a wavelength conversion layer made up of quantum dots that produce light in red and a wavelength conversion layer made up of quantum dots that produce light in green are patterned in sub-pixels and color conversion is performed in units of pixel by using blue excitation light has been proposed. With this configuration, the size of each sub-pixel is a pitch of a few micrometers for a small display element used in an electric view finder (EVF) or the like and is a pitch of a few tens of micrometers for a large-size high-resolution television.

Here, as the aspect ratio (the ratio of height to width) of the wavelength conversion layer formed in each sub-pixel increases, pattern formation becomes difficult and, therefore, miniaturization becomes difficult. For this reason, the thickness of the wavelength conversion layer ranges from a few micrometers to 10 micrometers. With this thickness, it is ideal that the wavelength conversion layer absorbs excitation light without any omission and converts the color into green or red. Actually, because of tradeoffs between the concentration of quantum dots and an optical absorption coefficient, it is difficult to completely suppress leakage of blue light. As a result, conversion efficiency in the wavelength conversion layer decreases, with the result that the luminance decreases.

A configuration in which an excitation light reflective layer made up of a dielectric multilayer film is provided on a fluorescent emission side of the wavelength conversion layer is described as a method of efficiently performing wavelength conversion with the wavelength conversion layer (PTL 1). When blue light that is excitation light is reflected by the reflective layer and returns to the wavelength conversion layer side, the reflected light is absorbed again by the wavelength conversion layer to illuminate, so it is possible to reduce leakage of blue light and to improve conversion efficiency.

CITATION LIST

Patent Literature

PTL 1 Japanese Patent Laid-Open No. 2019-152851

The inventors of the subject application diligently studied the configuration of PTL 1 and finally found a problem. A high reflectance is exhibited for excitation light that enters from the wavelength conversion layer at an angle smaller than or equal to 20 degrees with respect to a perpendicular axis to a film surface of the dielectric multilayer film. However, the inventors found that there was such a problem that the reflectance decreases for excitation light that enters at a high angle larger than or equal to 20 degrees with respect to the perpendicular axis and blue light penetrates through the dielectric multilayer film. As the reflectance of excitation light decreases, there occurs a problem, such as a decrease in luminous efficiency and a decrease in color purity.

The present invention is contemplated in view of the above-described problem, and it is an object of the present invention for a display element having a sub-pixel region including a wavelength conversion layer that converts the wavelength of excitation light to reduce leakage of excitation light in the sub-pixel region.

SUMMARY OF INVENTION

A display element according to an aspect of the present invention includes a light source portion that emits excitation light, a wavelength conversion portion that converts the excitation light to light with a wavelength longer than a wavelength of the excitation light, an excitation light reflective layer that reflects the excitation light having penetrated through the wavelength conversion portion, and an optical member that transmits light converted by the wavelength conversion portion, in this order. The wavelength conversion portion includes a first wavelength conversion layer that converts the excitation light to first wavelength converted light with a wavelength longer than the wavelength of the excitation light, and a second wavelength conversion layer that converts the excitation light to second wavelength converted light with a wavelength longer than the wavelength of the first wavelength converted light. The display element is a component of a pixel that includes a green sub-pixel region including the first wavelength conversion layer, a red sub-pixel region including the second wavelength conversion layer, and a blue sub-pixel region not including the first wavelength conversion layer or the second wavelength conversion layer. The display element further includes a low refractive index layer provided in a region between the wavelength conversion portion and the optical member. A surface of the low refractive index layer adjacent to the wavelength conversion portion is an interface at which the low refractive index layer is in contact with a region having a higher refractive index than the low refractive index layer.

A display element according to another aspect of the present invention includes a light source portion that emits excitation light, a wavelength conversion portion that converts the excitation light to light with a wavelength longer than a wavelength of the excitation light, and an optical member that transmits light converted by the wavelength conversion portion, in this order. The wavelength conversion portion includes a first wavelength conversion layer that converts the excitation light to first wavelength converted light with a wavelength longer than the wavelength of the excitation light, and a second wavelength conversion layer that converts the excitation light to second wavelength converted light with a wavelength longer than the wavelength of the first wavelength converted light. The display element is a component of a pixel that includes a green sub-pixel region including the first wavelength conversion layer, a red sub-pixel region including the second wavelength conversion layer, and a blue sub-pixel region not including the first wavelength conversion layer or the second wavelength conversion layer. The display element further includes a converted light reflective layer and a low refractive index layer that reflect light with a wavelength converted by the wavelength conversion portion in a region between the light source portion and the wavelength conversion portion. A surface of the low refractive index layer adjacent to the wavelength conversion portion is an interface at which the low refractive index layer is in contact with a region having a higher refractive index than the low refractive index layer.

A display element according to further another aspect of the present invention includes a light source portion that emits excitation light, a wavelength conversion portion that converts the excitation light to light with a wavelength longer than a wavelength of the excitation light, and an optical member that transmits light converted by the wavelength conversion portion, in this order. The wavelength conversion portion includes a first wavelength conversion layer that converts the excitation light to first wavelength converted light with a wavelength longer than the wavelength of the excitation light, and a second wavelength conversion layer that converts the excitation light to second wavelength converted light with a wavelength longer than the wavelength of the first wavelength converted light. The display element is a component of a pixel that includes a green sub-pixel region including the first wavelength conversion layer, a red sub-pixel region including the second wavelength conversion layer, and a blue sub-pixel region not including the first wavelength conversion layer or the second wavelength conversion layer. The display element further includes a partition wall provided between the first wavelength conversion layer and the second wavelength conversion layer. The display element further includes a converted light reflective layer and a low refractive index layer that reflect light with a wavelength converted by the wavelength conversion portion in a region between the partition wall and at least any one of the first wavelength conversion layer and the second wavelength conversion layer. A surface of the low refractive index layer adjacent to the wavelength conversion portion is an interface at which the low refractive index layer is in contact with a region having a higher refractive index than the low refractive index layer.

Further features of the present invention will become apparent from the following description of exemplary embodiments with reference to the attached drawings.

BRIEF DESCRIPTION OF DRAWINGS

FIG. 1-1B is an enlarged view of one of the display elements arranged in a two-dimensional array according to the first embodiment of the present invention.

FIG. 1-2 is a schematic sectional view taken along the line I-II-I-II in FIG. 1-1B.

FIG. 1-3 is a schematic diagram that shows a modification of the configuration shown in FIG. 1-2.

FIG. 1-4A is a schematic sectional view that shows a display element according to the first embodiment of the present invention.

FIG. 1-4B is a schematic sectional view that shows a display element according to the first embodiment of the present invention.

FIG. 1-5A is a schematic sectional view that shows a display element according to the first embodiment of the present invention.

FIG. 1-5B is a schematic sectional view that shows a display element according to the first embodiment of the present invention.

FIG. 1-6A is a schematic diagram that shows the configuration of a reflective layer according to the first embodiment of the present invention.

FIG. 1-6B is a schematic diagram that shows the configuration of a reflective layer according to the first embodiment of the present invention.

FIG. 1-7 is a measurement result that shows the incident angle dependence of a reflection spectrum of a reflective layer A according to an example (first embodiment) of the present invention.

FIG. 1-8 is a measurement result that shows the incident angle dependence of a reflection spectrum of a reflective layer B according to an example (first embodiment) of the present invention.

FIG. 2-1A is a plan view in which display elements according to a second embodiment of the present invention are arranged in a two-dimensional array.

FIG. 2-1B is an enlarged view of one of the display elements arranged in a two-dimensional array according to the second embodiment of the present invention.

FIG. 2-2 is a schematic sectional view taken along the line II-II-II-II in FIG. 2-1B.

FIG. 2-3 is a schematic diagram that shows a modification of the configuration shown in FIG. 2-2.

FIG. 2-4A is a schematic sectional view that shows a display element according to the second embodiment of the present invention.

FIG. 2-4B is a schematic sectional view that shows a display element according to the second embodiment of the present invention.

FIG. 2-4C is a schematic sectional view that shows a display element according to the second embodiment of the present invention.

FIG. 2-4D is a schematic sectional view that shows a display element according to the second embodiment of the present invention.

FIG. 2-5A is a schematic sectional view that shows a display element according to the second embodiment of the present invention.

FIG. 2-5B is a schematic sectional view that shows a display element according to the second embodiment of the present invention.

FIG. 2-5C is a schematic sectional view that shows a display element according to the second embodiment of the present invention.

FIG. 2-5D is a schematic sectional view that shows a display element according to the second embodiment of the present invention.

FIG. 2-6A is a schematic sectional view that shows a display element according to the second embodiment of the present invention.

FIG. 2-6B is a schematic sectional view that shows a display element according to the second embodiment of the present invention.

FIG. 2-6C is a schematic sectional view that shows a display element according to the second embodiment of the present invention.

FIG. 2-7A is a schematic sectional view that shows a display element according to the second embodiment of the present invention.

FIG. 2-7B is a schematic sectional view that shows a display element according to the second embodiment of the present invention.

FIG. 2-8 is a measurement result that shows the incident angle dependence of a reflection spectrum of a reflective layer C for a wavelength of 460 nm according to an example (second embodiment) of the present invention.

FIG. 2-9 is a measurement result that shows the incident angle dependence of a reflection spectrum of the reflective layer C for a wavelength of 530 nm according to the example (second embodiment) of the present invention.

FIG. 2-10 is a measurement result that shows the incident angle dependence of a reflection spectrum of the reflective layer C for a wavelength of 630 nm according to the example (second embodiment) of the present invention.

FIG. 2-11 is a schematic sectional view that shows a display element according to the second embodiment of the present invention.

FIG. 3-1A is a plan view in which display elements according to a third embodiment of the present invention are arranged in a two-dimensional array.

FIG. 3-1B is an enlarged view of one of the display elements arranged in a two-dimensional array according to the third embodiment of the present invention.

FIG. 3-2 is a schematic sectional view taken along the line III-II-III-II in FIG. 3-1B.

FIG. 3-3 is a schematic diagram that shows a modification of the configuration shown in FIG. 3-2.

FIG. 3-4A is a schematic sectional view that shows a display element according to the third embodiment of the present invention.

FIG. 3-4B is a schematic sectional view that shows a display element according to the third embodiment of the present invention.

FIG. 3-4C is a schematic sectional view that shows a display element according to the third embodiment of the present invention.

FIG. 3-4D is a schematic sectional view that shows a display element according to the third embodiment of the present invention.

FIG. 3-5A is a schematic sectional view that shows a display element according to the third embodiment of the present invention.

FIG. 3-5B is a schematic sectional view that shows a display element according to the third embodiment of the present invention.

FIG. 3-6A is a schematic sectional view that shows the configuration of a reflective layer according to a third example (third embodiment) of the present invention.

FIG. 3-6B is a schematic sectional view that shows the configuration of a reflective layer according to the third example (third embodiment) of the present invention.

FIG. 3-7A is a measurement result that shows the incident angle dependence of a reflection spectrum of a reflective layer D according to the example (third embodiment) of the present invention and is a result for 460 nm.

FIG. 3-7B is a measurement result that shows the incident angle dependence of a reflection spectrum of a reflective layer D according to the example (third embodiment) of the present invention and is a result for 530 nm.

FIG. 3-7C is a measurement result that shows the incident angle dependence of a reflection spectrum of a reflective layer D according to the example (third embodiment) of the present invention and is a result for 630 nm.

FIG. 3-8A is a measurement result that shows the incident angle dependence of a reflection spectrum of a reflective layer D (with a thin film thickness) according to the example (third embodiment) of the present invention and is a result for 460 nm.

FIG. 3-8B is a measurement result that shows the incident angle dependence of a reflection spectrum of a reflective layer D (with a thin film thickness) according to the example (third embodiment) of the present invention and is a result for 530 nm.

FIG. 3-8C is a measurement result that shows the incident angle dependence of a reflection spectrum of a reflective layer D (with a thin film thickness) according to the example (third embodiment) of the present invention and is a result for 630 nm.

DESCRIPTION OF EMBODIMENTS

Hereinafter, a display element according to embodiments of the present invention will be described in detail; however, the present invention is not limited thereto.

First Embodiment

Configuration

Figures 1, 1A:
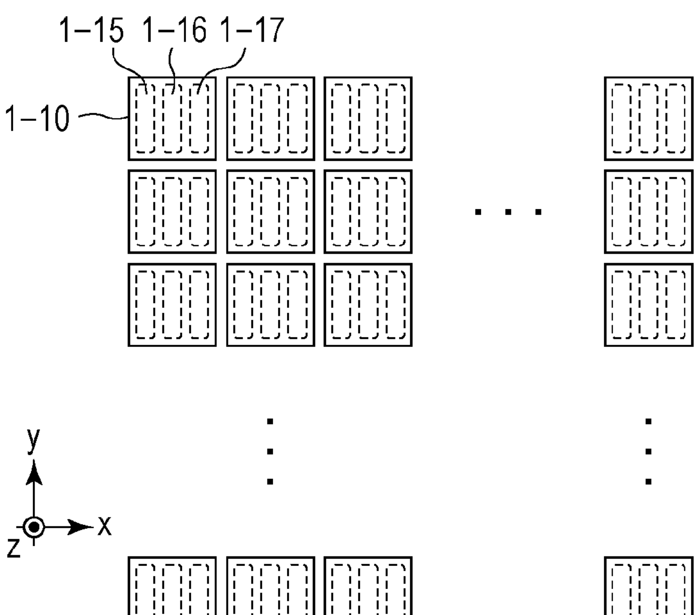
FIG. 1-1A is a plan view in which display elements according to a first embodiment of the present invention are arranged in a two-dimensional array.
Figures 1, 1B:
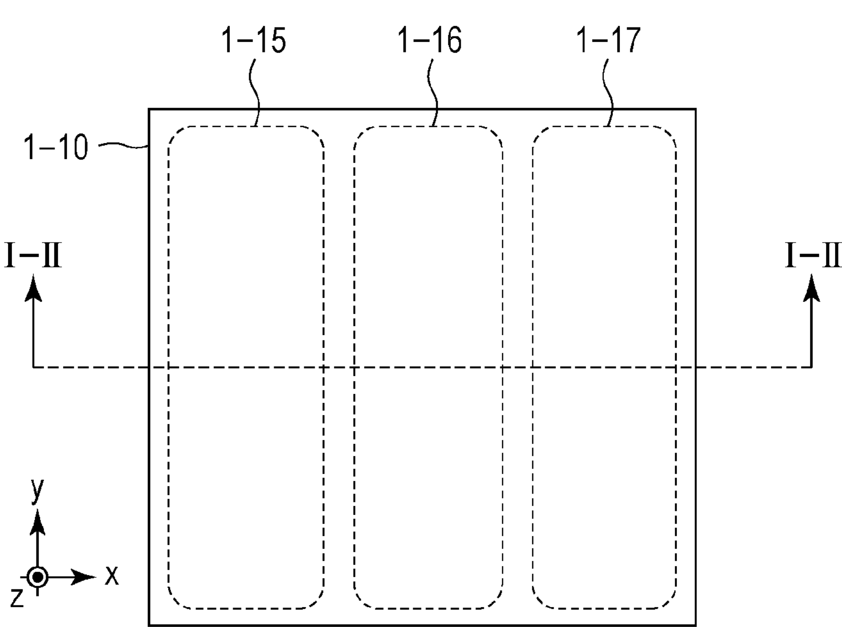
Figures 1, 2:
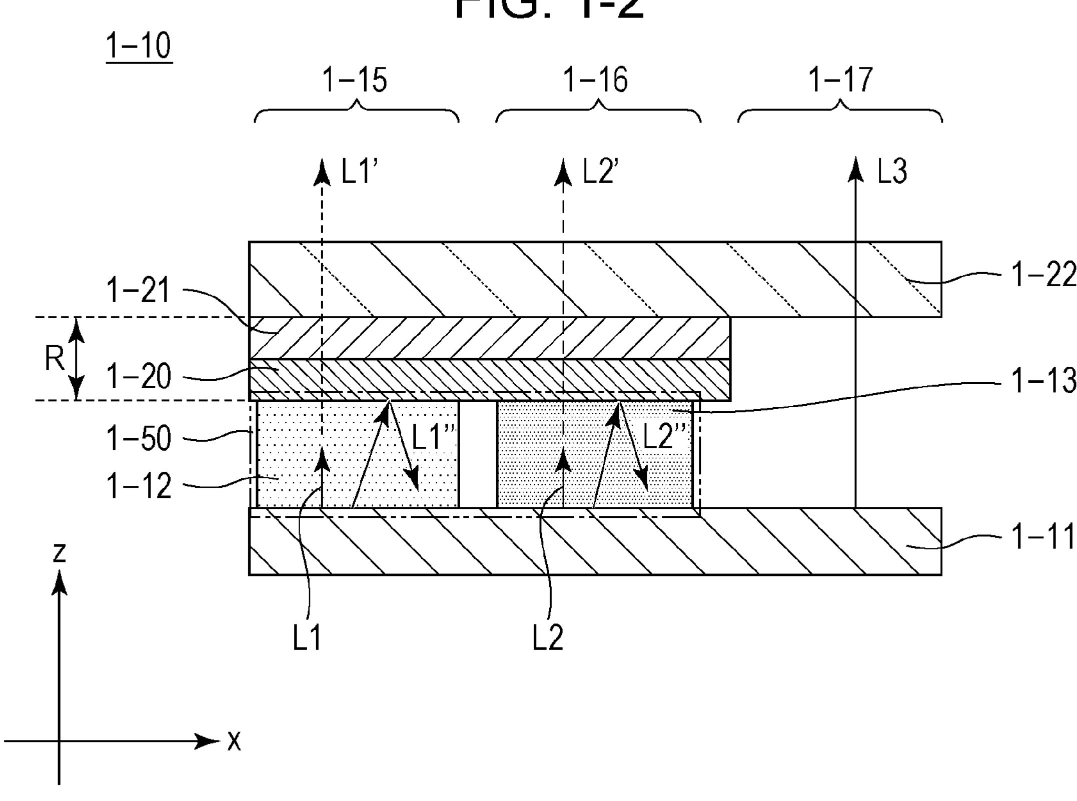
Figures 1, 2, 3:
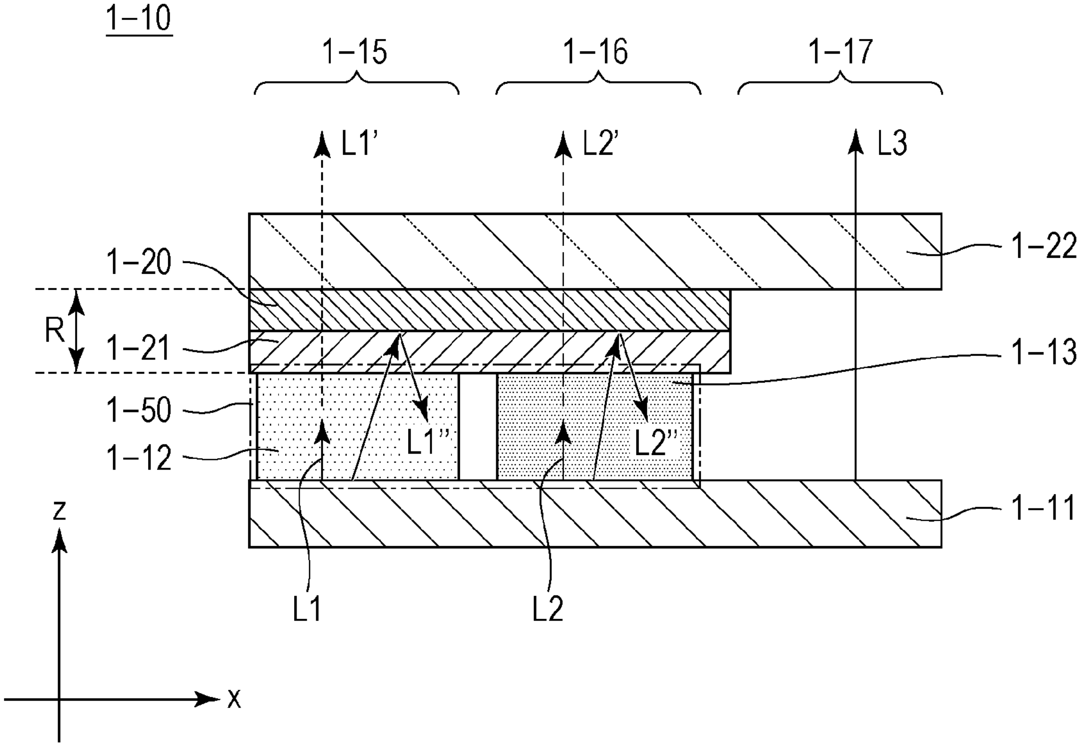

Initially, the configuration of a display element according to the present embodiment will be described with reference to FIGS. 1-1A to 1-3. FIG. 1-1A is a plan view that shows a configuration in which a plurality of display elements (pixels) 1-10 according to the present embodiment is arranged in a two-dimensional array. Other than the array as shown in FIG. 1-1A, arrangement of the display elements (pixels) can be changed as needed according to uses. FIG. 1-1B is an enlarged plan view of one of the display elements (pixels) 1-10 shown in FIG. 1-1A. The display element 1-10 has a green sub-pixel region 1-15, a red sub-pixel region 1-16, and a blue sub-pixel region 1-17. FIG. 1-2 is a sectional view taken along the line I-II-I-II in FIG. 1-1B. FIG. 1-3 is a sectional view similar to that of FIG. 1-2 but differs in the location of a reflective layer 1-21 (described later) and the location of a low refractive index layer 1-20 (described later). In the present embodiment, the order of the pixel regions in an x-axis direction is not limited. As shown in FIG. 1-1A, other than the configuration in which the sub-pixel regions are arranged in the x-axis direction, a configuration in which three sub-pixel regions are respectively arranged at the vertexes of a triangle may be adopted.

The display element 1-10 according to the present embodiment includes a light source portion 1-11 that emits excitation light (L1, L2, L3), a wavelength conversion portion 1-50 that converts the excitation light to light (L1', L2') with a wavelength longer than the wavelength of the excitation light, a reflective layer 1-21 that reflects excitation light having penetrated through the wavelength conversion portion 1-50, and an optical member 1-22 that transmits light converted by the wavelength conversion portion 1-50, in this order. Here, the wavelength conversion portion 1-50 includes a first wavelength conversion layer 1-12 that converts excitation light (L1) to first wavelength converted light (L1') longer in wavelength than the excitation light, and a second wavelength conversion layer 1-13 that converts excitation light (L2) to second wavelength converted light (L2') longer in wavelength than the first wavelength converted light (L1').

The display element 1-10 is a pixel that includes the green sub-pixel region 1-15 including the first wavelength conversion layer 1-12, the red sub-pixel region 1-16 including the second wavelength conversion layer 1-13, and the blue sub-pixel region 1-17 not including the first wavelength conversion layer 1-12 or the second wavelength conversion layer 1-13.

A low refractive index layer is provided in a region (R) between the wavelength conversion portion 1-50 and the optical member 1-22. Here, as shown in FIG. 1-2, the low refractive index layer 1-20 is provided in a region between the reflective layer 1-21 and the wavelength conversion portion 1-50. As shown in FIG. 1-3, the low refractive index layer 1-20 may be provided between the reflective layer 1-21 and the optical member 1-22. A surface of the low refractive index layer 1-20 adjacent to the wavelength conversion portion is an interface at which the low refractive index layer 1-20 is in contact with a region having a higher refractive index than the low refractive index layer 1-20. In other words, in the case of FIG. 1-2, the refractive index of the low refractive index layer 1-20 is lower than the refractive index of the first wavelength conversion layer 1-12 or the refractive index of the second wavelength conversion layer 1-13. In the case of FIG. 1-3, the refractive index of the low refractive index layer 1-20 is lower than the refractive index of the reflective layer 1-21. The refractive index of the low refractive index layer 1-20 can be lower than the refractive index of any of the optical member 1-22, the first wavelength conversion layer 1-12, and the second wavelength conversion layer 1-13.

Operational Effects

In this way, with the display element 1-10 according to the present embodiment, excitation light is totally reflected on the surface of the low refractive index layer 1-20 adjacent to the wavelength conversion portion, so leakage is reduced.

The display element 1-10 according to the present embodiment includes the low refractive index layer 1-20 provided between the optical member 1-22 and both the first wavelength conversion layer 1-12 and the second wavelength conversion layer 1-13 and having the low refractive index layer 1-20 lower in refractive index than these components. Therefore, there is an interface at which the region shifts from a region with a high refractive index to a region with a low refractive index between the first wavelength conversion layer 1-12 and the optical member 1-22 and between the second wavelength conversion layer 1-13 and the optical member 1-22. As a result, excitation light is reflected on the interface, so leakage of excitation light from the green sub-pixel region or the red sub-pixel region is reduced.

A mechanism that excitation light is reflected will be described in more detail. In the case of the configuration shown in FIG. 1-2, there is an interface between the first wavelength conversion layer 1-12 (or the second wavelength conversion layer 1-13) that is a region with a high refractive index and the low refractive index layer 1-20 that is a region with a low refractive index. According to Snell's law, when light travels from a region with a high refractive index ($n_h$) to a region with a low refractive index ($n_L$), total reflection occurs when the incident angle is larger than a predetermined value. Therefore, total reflection occurs at the interface between the first wavelength conversion layer 1-12 (or the second wavelength conversion layer 1-13) and the low refractive index layer 1-20.

In the case of the configuration shown in FIG. 1-3, the first wavelength conversion layer 1-12 (or the second wavelength conversion layer 1-13) that is a region with a high refractive index, the reflective layer 1-21, and the low refractive index layer 1-20 that is a region with a low refractive index are sequentially laminated. Here, when the refractive index of the reflective layer 1-21 is higher than the refractive index of the low refractive index layer 1-20, total reflection occurs at the interface between the reflective layer 1-21 and the low refractive index layer 1-20 (L1' and L2' in FIG. 1-3). When the refractive index of the reflective layer 1-21 is lower than the refractive index of the low refractive index layer 1-20, it means that the refractive index of the reflective layer 1-21 is lower than the refractive index of the first wavelength conversion layer 1-12 (or the second wavelength conversion layer 1-13). Therefore, total reflection occurs at the interface between the first wavelength conversion layer 1-12 (or the second wavelength conversion layer 1-13) and the reflective layer.

In this way, excitation light having returned to the wavelength conversion portion 1-50 (the first wavelength conversion layer 1-12 and the second wavelength conversion layer 1-13) is used for wavelength conversion, so the loss of excitation light reduces, and the luminous efficiency is high. In addition, leakage of excitation light shorter in wavelength than light L1' emitted from the green sub-pixel region or light L2' emitted from the red sub-pixel region is reduced, so a display element with high color purity is provided.

When the excitation light L3 is blue light, the excitation light L3 penetrates through the optical member 1-22, and blue light is emitted from the blue sub-pixel region 1-17, so a pixel that produces light in green, red, and blue is formed (FIGS. 1-2 and 1-3). When the excitation light L3 is ultraviolet light, the wavelength conversion portion 1-50 may include a third wavelength conversion layer that converts the excitation light L3 to third wavelength converted light (L3' longer in wavelength than the excitation light and shorter in wavelength than the first wavelength converted light (L1') (all of which are not shown).

FIGS. 1-2 and 1-3 show the configuration in which the light source portion 1-11, the wavelength conversion portion 1-50, the low refractive index layer 1-20, the reflective layer 1-21, and the optical member 1-22 are laminated so as to be in contact with each other.

Alternatively, another component may be provided between these elements. In this case as well, there is an interface at which the region shifts from a region with a high refractive index to a region with a low refractive index due to the above reason, so it is possible to totally reflect excitation light and return the excitation light to the wavelength conversion portion 1-50.

In the present embodiment, blue light is light with a maximum wavelength longer than or equal to 445 nm and shorter than or equal to 475 nm, green light is light with a maximum wavelength longer than or equal to 515 nm and shorter than or equal to 545 nm, and red light is light with a wavelength longer than or equal to 615 nm and shorter than or equal to 645 nm.

Display Element

Hereinafter, the detailed configuration of the display element according to the embodiment of the present invention will be described. FIGS. 1-4A and 1-4B are schematic sectional views that schematically show an example of the display element according to the present embodiment. In the display element according to the present embodiment, the light source portion is configured to include a plurality of light emitting elements 1-11 respectively corresponding to green, red, and blue pixel regions (1-15, 1-16, 1-17). The light emitting elements 1-11 emit blue light. In the display element according to the present embodiment, the maximum wavelength of blue light, the maximum wavelength of green light, and the maximum wavelength of red light are respectively 460 nm, 530 nm, and 630 nm.

Initially, the configuration of FIG. 1-4A will be described. The wavelength conversion portion 1-50 includes the first wavelength conversion layer 1-12 that converts blue light from the light emitting element 1-11 to first wavelength converted light (green light), the second wavelength conversion layer 1-13 that converts blue light from the light emitting element 1-11 to second wavelength converted light (red light), and a resin portion 1-14 that transmits blue light. With such a configuration, a pixel including the green sub-pixel region 1-15, the red sub-pixel region 1-16, and the blue sub-pixel region 1-17 is formed.

Here, light scattering particles can be contained in the first wavelength conversion layer 1-12 and the second wavelength conversion layer 1-13 to improve the efficiency of use of excitation light and reduce leakage of excitation light. Titanium oxide or the like may be used as the light scattering particles. Light scattering particles are also contained in the resin portion 1-14 that will be the blue sub-pixel region 1-17 to eliminate directivity by scattering blue light that is excitation light and to expand a viewing angle. A partition wall 1-18 is provided between adjacent two of the green sub-pixel region, the red sub-pixel region, and the blue sub-pixel region to reduce leakage of light to an adjacent pixel, with the result that the sub-pixel regions are separated. The light emitting elements 1-11 are separated by an insulating material 1-19 (also referred to as bank). An electrode for supplying current to the light source portion (light emitting elements) 1-11, a drive circuit for the light source portion 1-11, and the like can be provided (not shown). The low refractive index layer 1-20, the reflective layer 1-21, and the optical member 1-22 are provided in this order on the upper surfaces of the first wavelength conversion layer 1-12 and second wavelength conversion layer 1-13 in a z-axis direction.

FIG. 1-4A shows a configuration in which a common reflective layer 1-21 (hereinafter, referred to as reflective layer A) is provided for the first wavelength conversion layer 1-12 and the second wavelength conversion layer 1-13.

On the other hand, FIG. 1-4B shows a configuration in which the reflective layer A is provided for the first wavelength conversion layer 1-12, a reflective layer B (described later) having different reflection characteristics from the reflective layer A is provided for the second wavelength conversion layer 1-13, and the reflective layers are provided respectively in correspondence with green and red sub-pixel regions.

As shown in FIGS. 1-4A and 1-4B, the low refractive index layer 1-20, the reflective layer 1-21 (reflective layer A) (or a reflective layer 1-23 (reflective layer B)), and the optical member 1-22 may be provided in this order on the upper surface of the first wavelength conversion layer 1-12 or the upper surface of the second wavelength conversion layer 1-13 in the z-axis direction.

FIG. 1-5A shows a case where the common low refractive index layer 1-20 is formed in the green and red sub-pixel regions on the upper surfaces of the first wavelength conversion layer 1-12 and second wavelength conversion layer 1-13 in the z-axis direction. On the other hand, FIG. 1-5B is a schematic diagram of a case where the low refractive index layer 1-20 is separately formed in correspondence with the green and red sub-pixel regions.

Hereinafter, component elements included in the display element according to the present embodiment will be described in detail.

Reflective Layer

The reflective layer according to the present embodiment represents a layer that selectively reflects light with a designated wavelength. In other words, the reflective layer may also be regarded as having wavelength selectivity with which light with wavelengths other than the designated wavelength reflected is transmitted.

The above-described reflective layer having wavelength selectivity includes a dielectric multilayer film. A dielectric that is a component of the dielectric multilayer film may be an inorganic material, an organic material, or a combination of these materials. At least one selected from a group consisting of a polyester resin, an urethane resin, and an acrylic resin may be used as the organic material. An inorganic material, such as a fluoride material and an oxide material, or the like may be used as the inorganic material. At least one selected from a group consisting of $AlF_2$ (1.36), $MgF_2$ (1.38), and $CaF_2$ (1.43) may be used as the fluoride material. At least one selected from a group consisting of $SiO_2$ (1.45), $Al_2O_3$ (1.64), MgO (1.72), $Y_2O_3$ (1.88), $HfO_2$ (2.05), $SrTiO_3$ (2.44), and $TiO_2$ (2.49) may be used as the oxide material.

Here, the numeric values in the parentheses of the fluoride materials and oxide materials listed above are reference values of refractive indexes. The dielectric multilayer film is a multilayer film in which a low refractive index material and a high refractive index material selected from among these types of materials are alternately laminated. Here, the low refractive index material has a relatively lower refractive index than the high refractive index material, and the high refractive index material has a relatively higher refractive index than the low refractive index material.

At this time, when the thickness d of each of the layers that make up the dielectric multilayer film is set to $d=\lambda_0/4n$ where the refractive index n of the layer for a center wavelength $\lambda_0$ of a reflection band, rays of light reflected at the boundaries of the layers cancel out each other to reduce transmittance, and a reflection band is formed. Where the refractive index of the high refractive index material is $n_H$ and the refractive index of the low refractive index material is $n_L(<n_H)$, a reflection band with a width $W=2/\pi\times\sin[(n_H-n_L)/(n_H+n_L)]\times\lambda_0$ is formed on each side of the center wavelength.

In the reflective layer according to the present embodiment, the dielectric multilayer film is designed so as to reflect blue light (460 nm) and transmit green light (530 nm) from the green sub-pixel region, which is emission from the wavelength conversion portion, and red light (630 nm) from the red sub-pixel region, which is also emission from the wavelength conversion portion. Here, when a common reflective layer is used for the green sub-pixel region and the red sub-pixel region, the reflective layer reflects light with a wavelength around 460 nm and transmits light with a wavelength longer than or equal to 500 nm. Thus, it is possible to reuse excitation light (blue light) by reflecting the blue light while extracting emission of green light (530 nm) and red light (630 nm) from a fluorescent plane of exit. The wavelengths of red, green, and blue rays of light described here each are an example of a maximum wavelength in each sub-pixel region and have to be a value within the range of the above-described wavelength band.

In the present embodiment, reflective layers may be respectively provided for the green sub-pixel region and the red sub-pixel region or a common reflective layer may be provided for the green sub-pixel region and the red sub-pixel region.

Here, a common configuration for the green sub-pixel region and the red sub-pixel region is defined as reflective layer A. For example, after the reflective layer A is formed, a resist pattern is left only in the red sub-pixel region and the green sub-pixel region by an ordinary photolithography technology. Then, the dielectric multilayer film in a region other than the red sub-pixel region or the green sub-pixel region is removed by dry etching, with the result that the reflective layer A is formed.

Hereinafter, an example in which the dielectric multilayer film according to the present embodiment includes a laminated body in which a layer made of $SiO_2$ (low refractive index material) and a layer made of $TiO_2$ (high refractive index material) are alternately laminated will be described. An example in which, where an alternate laminate of $SiO_2$ and $TiO_2$ is defined as a unit, a multilayer film obtained by repeatedly laminating the unit 10 times is used as a reflective layer will be described. A laminate obtained by laminating one layer each of $SiO_2$ and $TiO_2$ can be referred to as one-pair reflective layer, and a laminate obtained by alternately laminating 10 layer each can be referred to as 10-pair reflective layer. For incident light with an incident angle of zero degrees, the film thicknesses of $SiO_2$ and $TiO_2$ are determined according to the center wavelength of the reflection band. Here, the incident angle means an angle that an incident object makes with a normal to the plane of incidence.

In an example of the reflective layer A, when it is assumed that the center wavelength of the reflection band is 400 nm, the film thickness of $SiO_2$ is 69 nm, the film thickness of $TiO_2$ is 40 nm, and the total film thickness of the reflective layer is 1090 nm. At this time, the width of the reflection band is about 133 nm. The reflective layer can be prepared by film formation with a sputtering method, an ion beam deposition method, a pulsed laser deposition (PLD) method, or the like.

Here, different reflective layers may be respectively used for the green sub-pixel region and the red sub-pixel region. In this case, the same layer as the reflective layer A can be used for the green sub-pixel region, and a layer for the red sub-pixel region can be configured to reflect light with a wavelength around 460 nm and transmit light with a wavelength longer than or equal to about 600 nm. With such a configuration, it is possible to allow red light (630 nm) to penetrate through the reflective layer and improve the reflectance of excitation light (blue light) that enters at a high incident angle as compared to the reflective layer A. In other words, when the reflection band with an incident angle of zero degrees is expanded toward a longer wavelength side to about 600 nm, high reflectance is maintained for excitation light (blue light) that enters at a high incident angle. A configuration for the red sub-pixel region is referred to as reflective layer B. In an example of the reflective layer B, when it is assumed that the center wavelength of the reflection band is 470 nm, the film thickness of $SiO_2$ is 81 nm, the film thickness of $TiO_2$ is 47 nm, and the total film thickness is 1282 nm. At this time, the width of the reflection band is about 156 nm. In forming the reflective layer in this case, for example, the reflective layer B is initially formed by ordinary photolithography technology, then a resist pattern is left only in the red sub-pixel region, and the dielectric multilayer film other than the red sub-pixel region is removed by dry etching technology. Subsequently, after the reflective layer A is formed, a resist pattern is left only in the green sub-pixel region, and the dielectric multilayer film other than the red sub-pixel region is removed by means of dry etching technology. Thus, the reflective layer B can be formed.

Wavelength Conversion Portion, and Wavelength Conversion Layer

The wavelength conversion portion according to the present embodiment is not limited as long as the wavelength conversion portion converts blue light to light with a different wavelength. The wavelength conversion portion according to the present embodiment includes the first wavelength conversion layer that converts excitation light to first wavelength converted light longer in wavelength than the excitation light and the second wavelength conversion layer that converts the excitation light to second wavelength converted light longer in wavelength than the first wavelength converted light. The first wavelength converted light can be green light, and the second wavelength converted light can be red light. The first wavelength conversion layer and the second wavelength conversion layer according to the present embodiment can contain quantum dots. The thickness of each of the first wavelength conversion layer and the second wavelength conversion layer according to the present embodiment is preferably greater than or equal to 4 μm and less than or equal to 20 μm and more preferably greater than or equal to 6 μm and less than or equal to 10 μm.

The wavelength conversion portion is configured to include the wavelength conversion layers in which phosphor particles are dispersed in resin. It does not matter whether the phosphor particles are made of an inorganic material or an organic material, and particularly quantum dots can be used as the phosphor particles. This is because quantum dots exhibit emission with a narrow full width at half maximum of an emission spectrum and excellent color purity.

Inorganic particles used for quantum dots may be referred to as nanoparticles because of their size. Examples of the material of quantum dots include semiconductor crystals and include nanoparticles of group IV semiconductors, group III-V and group II-VI compound semiconductors, and compound semiconductors made of a combination of three or more of group II, group III, group IV, group V, and group VI elements. Specific examples of the material that emits light in a wavelength range for a display element include CsS, CdSe, CdZnSe, CdSeTe, ZnSe, ZnTeSe, ZnTeS, InP, $CuInS_2$, $AgInS_2$, and Pb perovskite. A core shell structure in which the above materials are used as the cores of quantum dots and the cores of quantum dots are coated with a coating compound is applicable. In this case, a ligand is provided in the shell part.

The mean particle diameter of the quantum dots is preferably greater than or equal to 2 nm and less than or equal to 15 nm. In quantum dots, if the particle diameters of quantum dots are reduced to a size less than or equal to the Bohr radius of an intrinsic exciton, there occurs a phenomenon that the bandgap of the quantum dots changes because of quantum size effect. For example, in InP that is a group III-V semiconductor, the Bohr radius is generally about 10 nm to about 14 nm. In other words, when the mean particle diameter of quantum dots is less than or equal to 15 nm, it is possible to control the bandgap due to quantum size effect. When the mean particle diameter of quantum dots is set to greater than or equal to 2 nm, it is possible to easily control the crystal growth of quantum dots in synthesizing quantum dots.

Quantum dots each have a ligand on the surface. A ligand may have a crosslinked structure that, when there are a first quantum dot and a second quantum dot, links the first quantum dot with the second quantum dot. Linking is that one molecule is coupled to the first quantum dot and the second quantum dot. When linking is performed by an organic ligand, it is possible to control the distance between the quantum dots by using the molecule length of the organic ligand. Specific examples of the crosslinked structure may include a hydroxyl group, a thiol group, and a carboxyl group. At least one or more organic molecules can be provided between quantum dots. As the number of organic ligands increases, both ends of the organic molecules tightly coupled to the surfaces of the quantum dots, so heat resistance and environmental resistance improve, and the stability of emission characteristics increases.

Phosphor Particle

Quantum dots having a full width at half maximum of less than 50 nm may be preferably used as phosphor particles to be used for the first wavelength conversion layer and the second wavelength conversion layer according to the present embodiment. For example, generally available quantum dots, such as InP/ZnS quantum dots of product numbers 776769, 776750, 776793, 776777, and 776785, produced by Sigma-Aldrich, may be used as quantum dots. The first wavelength conversion layer can be product number 776750. The second wavelength conversion layer can be product number 776777. Product numbers 905062, 900746, 900747, and 900748 may be used as perovskite quantum dots. The first wavelength conversion layer can be product number 905062 or product number 900746. The second wavelength conversion layer can be product number 900748.

Resin Portion

In the first wavelength conversion layer, the second wavelength conversion layer, and a third wavelength conversion layer (described later) according to the present embodiment, a monofunctional monomer or a bifunctional monomer may be used as the resin portion that is a matrix. Examples of the resin portion include acrylic resin, polyester resin, polyurethane resin, and polyamide resin. By mixing these materials, it is possible to adjust viscosity and surface tension suitable for film formation by means of photolithography and inkjet method (inkjet printing). The resin portion contains a photopolymerization initiator. The proportion of the resin portion ranges from 50 wt % to 70 wt %, and the proportion of the photopolymerization initiator ranges from 2 wt % to 5 wt %. In addition, light scattering particles can be contained in the wavelength conversion layer to improve the efficiency of use of blue light (excitation light) and reduce leakage of blue light. Titanium oxide or the like may be used as the light scattering particles. The proportion of light scattering particles ranges from 10 wt % to 30 wt %.

Low Refractive Index Layer

Refractive Index

The refractive index of the low refractive index layer according to the present embodiment is lower than the refractive index of any of the optical member, the first wavelength conversion layer, and the second wavelength conversion layer. Specifically, when silicon dioxide $SiO_2$ (Refractive index=1.45) is used as a framework material, the refractive index of the low refractive index layer according to the present embodiment may be lower than or equal to 1.45, preferably higher than or equal to 1.10 and lower than or equal to 1.30, and more preferably higher than or equal to 1.10 and lower than or equal to 1.15.

Thickness

The thickness of the low refractive index layer according to the present embodiment may be greater than or equal to 200 nm and may be less than or equal to half the thickness of the wavelength conversion portion or less than or equal to 2 μm. Here, the thickness is a thickness in the z-axis direction in FIGS. 1-2 to 1-5B.

Preferably, the lower limit of the thickness of the low refractive index layer according to the present embodiment is 200 nm, and the upper limit is a smaller one of half the thickness of the wavelength conversion portion and 2 μm. In the present embodiment, to sufficiently increase the reflectance at all angles, the thickness is preferably greater than about half the wavelength used for blue light (excitation light) from a light emitting element, so the above-described lower limit value is determined.

If the low refractive index layer is too thick, a crack or a haze significantly increases, so the thickness is preferably set to a smaller one of half the thickness of the wavelength conversion layer and 2 μm. The lower surface (a surface adjacent to the wavelength conversion portion) of the low refractive index layer can be located on the wavelength conversion portion side of the partition wall between the sub-pixel regions with respect to the top surface of the optical member. Here, light emitted from the wavelength conversion layer is reflected toward the wavelength conversion layer by total reflection at the interface with the low refractive index layer and returns; however, when the lower surface of the low refractive index layer is provided on the optical member side with respect to the top surface of the partition wall, light is easily diffused in a horizontal direction, and leakage of light to an adjacent one of the sub-pixel regions occurs. This may lead to a decrease in resolution. Here, the horizontal direction is x and y-axis directions in FIGS. 1-2 to 1-5B.

Composition and Configuration

When a solid material of which the refractive index of the low refractive index layer according to the present embodiment is lower than or equal to 1.45 is used as a framework, it is possible to appropriately set a voidage for a lower refractive index and improve the strength of the low refractive index layer. Hereinafter, an example in which the low refractive index layer contains a solid material will be described.

The solid material may be any of crystalline and amorphous. The solid material may be particles. The particles are not limited. Examples of the particles include spherical particles, indefinite-shape particles, particles in which the spherical or indefinite-shape particles are coupled in a beaded shape or a branched-chain shape, hollow particles having a cavity inside, and particles in which hollow particles are coupled in a beaded shape or a branched-chain shape.

From the viewpoint of refractive index, cost, and chemical stability, the solid material can contain silicon dioxide. In other words, the principal component of the solid material can be silicon dioxide. Here, the state "the principal component of the solid material is silicon dioxide" means that the solid material contains higher than or equal to 50 percent by mass of silicon dioxide. Typically, the solid material contains higher than or equal to 90 percent by mass of silicon dioxide.

Specific examples of silicon dioxide particles include Snowtex series and Organosilicasol made by Nissan Chemical Corporation, THRULYA series produced by JGC Catalysts and Chemicals Ltd., and Aerosil series made by EVONIK and sold by Nippon Aerosil Co., Ltd.

Generally, the refractive index $n_c$ of a composite material C made up of a material A with a refractive index $n_a$ and a material B with a refractive index $n_b$ is approximately expressed by the following expression 1-(1).

$$n_c=[n_a \times v_a/100]+[n_b \times v_b/100] \quad 1\text{-}(1)$$

Here, $v_a$ and $v_b$ are respectively volume fractions of the material A and material B that make up the composite material ($v_a+v_b=100$).

According to the expression 1-(1), when a composite material of the solid material and air, that is, when a porous film with a solid material as a framework is used as the low refractive index layer, the refractive index can be lower than the refractive index of the original solid material. At this time, as the refractive index of the solid material that is the framework decreases, or as the voidage of the low refractive index layer increases, the refractive index of the low refractive index layer decreases. To increase the voidage of the low refractive index layer, the low refractive index layer may have a porous structure. From this viewpoint, the low refractive index layer may be referred to as porous film.

In the expression 1-(1), where the material A is air and the material B is silicon dioxide, the refractive index of air $n_a$ is 1.00, the refractive index of silicon dioxide $n_b$ is 1.46, and the volume fraction of silicon dioxide $v_b$ is $100-v_a$. In other words, $v_a$ is a function of the refractive index $n_c$ of the low refractive index layer, and $v_a$ can be obtained. $v_a$ is a voidage.

The voidage of the low refractive index layer according to the present embodiment is preferably higher than or equal to 60.0% and lower than or equal to 95.0% and more preferably higher than or equal to 65.0% and lower than or equal to 90.0%.

For example, according to the expression 1-(1), when the voidage of the low refractive index layer with silicon dioxide (refractive index 1.46) as a framework is lower than 60.0%, the refractive index can possibly exceed 1.15.

On the other hand, when the voidage exceeds 95.0%, the refractive index can be excessively low like the refractive index of the low refractive index layer is lower than 1.05, and the strength can decrease because there is a small amount of the framework that is a component of the low refractive index layer.

Hollow Particle

The case where the low refractive index layer contains hollow particles will be further described; however, the low refractive index layer is not limited thereto. Hollow particles are such that an outer shell is made of a solid material and a particle having a cavity (void) inside is provided inside the outer shell. Hollow particles can contain hollow particles (hereinafter, hollow silica particles) of which the outer shell is made of silicon dioxide. Fumed silica particles may be used other than hollow silica particles. In the following description, hollow silica particles will be described.

The low refractive index layer can contain a plurality of hollow particles. The low refractive index layer containing a plurality of hollow particles may contain solid particles or may contain a binder, other than hollow particles. Where the proportion of a total volume of voids in the plurality of hollow particles to a unit volume of the low refractive index layer is a voidage X (%) and the proportion of a total volume of voids between hollow particles to the unit volume of the low refractive index layer is a voidage Y (%), the relationship $X<Y$ can be satisfied. Here, (X+Y) means the voidage of the low refractive index layer.

The refractive index n of the low refractive index layer is expressed by the following expression 1-(2).

$$n=[n_a\times(X+Y)/100]+[n_s\times(100-X-Y)/100] \quad 1\text{-}(2)$$

Here, $n_a$ is the refractive index of air ($n_a=1$), and $n_s$ is the refractive index of the outer shells of hollow particles ($n_s>1$). According to the expression 1-(2), as X+Y increases or as $n_s$ decreases, n decreases. When the hollow particles are densely disposed, the volume fraction of voids present between hollow particles reduces, and the volume fraction of the outer shells that are a component with a higher refractive index than air increases, so the refractive index of the low refractive index layer increases. On the other hand, when the hollow particles are sparsely disposed, the volume fraction of voids between hollow particles increases, and the volume fraction of the outer shells reduces, so the refractive index of the low refractive index layer decreases. In other words, to further decrease the refractive index of the low refractive index layer, Y/X can be increased. Specifically, the relationship $Y/X>1$, that is, the relationship $X<Y$, can be satisfied.

X and Y preferably satisfy the relationship $X<(100-X-Y)<Y$.

The low refractive index layer may contain particles made of a solid material and a binder that binds the particles for high strength. When a binder is used, solids contained in the low refractive index layer are the outer shells of hollow particles and the binder, and the volume fraction of the solids to the unit volume of the low refractive index layer is expressed by (100−X−Y) (%).

When the relationship $X<(100-X-Y)$ is satisfied, the strength of the low refractive index layer is further improved. When the relationship $(100-X-Y)<Y$ is satisfied, the refractive index of the low refractive index layer further decreases.

A total value of X and Y (X+Y) is preferably higher than or equal to 60.0% and lower than or equal to 95.0% and more preferably higher than or equal to 65.0% and lower than or equal to 90.0%. When (X+Y) is set to the above range, the strength of the low refractive index layer and the refractive index of the low refractive index layer are easily adjusted to desired ranges.

When X and Y are set to the above ranges, the strength of the low refractive index layer and the refractive index of the low refractive index layer are easily adjusted to desired ranges.

Film Formation Method

An example in which hollow particles of which the outer shell is silicon dioxide as a solid material are used will be described; however, the configuration is not limited thereto.

A dispersion solution of hollow particles may be used. The dispersion solution of hollow particles is not limited as long as the dispersion solution of hollow particles satisfies the voidage of the hollow particles, the refractive index of the outer shells of the hollow particles, the number mean particle diameter of primary particles of the hollow particles, and the like.

For example, THRULYA series produced by JGC Catalysts and Chemicals Ltd., which is an isopropanol (hereinafter, also referred to as IPA) dispersion solution of hollow silica particles, is suitably used. Other than commercially available products like THRULYA series, as for hollow silica particles, hollow particles dispersed in a solvent by a similar method to that for a dispersed solvent of fumed silica particles may be used.

The concentration of hollow particles in a solvent, for example, the concentration (solid content concentration) of hollow silica particles in a coating solution is preferably higher than or equal to 1.0 percent by mass and lower than or equal to 30.0 percent by mass and more preferably higher than or equal to 2.0 percent by mass and lower than or equal to 20.0 percent by mass.

When the content (concentration) falls within the above range, it is easy to adjust the film thickness of the low refractive index layer to greater than or equal to 200 nm.

The surface of each hollow silica particle has a hydroxyl group and has an affinity for water, so a solvent with a strong hydrophobicity is not suitable. Specifically, an organic solvent with an octanol-water partition coefficient log $P_{ow}$ less than or equal to two can be used. Examples of the organic solvent include alcohol solvents, such as methanol, ethanol, propanol, and isopropanol, glycol solvents, such as ethylene glycol and propylene glycol, ether solvents, such as dimethyl ether, diethyl ether, ethylene glycol monomethyl ether, ethylene glycol monoethyl ether, propylene glycol monomethyl ether, and propylene glycol monoethyl ether, acetate solvents, such as ethyl acetate, propyl acetate, propylene glycol monomethyl ether acetate, and propylene glycol monoethyl ether acetate, and ketone solvents, such as acetone and methyl ethyl ketone.

Hereinafter, a film formation method for the low refractive index layer will be described. A film is formed by using the coating solution. A bar coating method, a doctor blade method, a squeegee method, a spray method, a spin coating method, a dip coating method, a screen printing method, an ink-jet method may be used as the film formation method. When a film is formed by patterning a selected pixel of a display element, the film can be formed by the ink-jet method.

A binder that binds particles may be used as one of methods for improving the strength of the low refractive index layer. A resin, such as acrylic resin, fluororesin, styrene resin, imide resin, urethane resin, and phenolic resin, may be used as the binder.

Light Source Portion

The light source portion according to the present embodiment is not limited as long as the light source portion emits excitation light. Examples of the light source portion include light emitting elements, such as a light emitting diode (LED) and an organic light emitting diode (OLED). In the present embodiment, a micro LED or a micro OLED can be used.

Light source portions may be respectively provided for the red sub-pixel region, the green sub-pixel region, and the blue sub-pixel region or a common light source portion may be provided for these sub-pixel regions.

Optical Member

The optical member according to the present embodiment is not limited as long as the optical member transmits blue light, green light, or red light. The optical member according to the present embodiment is, for example, a transparent resin capable of shielding the first wavelength conversion layer or the second wavelength conversion layer against an external environment. A transparent resin with a transmittance of higher than or equal to 85% and more preferably higher than or equal to 90% for blue light, green light, and red light may be used as the optical member. The refractive index of resin that is used as the optical member may be higher than or equal to 1.5 and lower than or equal to 1.9. The optical member may be formed as a microlens in each sub-pixel region. In this case, the optical member has a function to converge light emitted from the first wavelength conversion layer 1-12 and the second wavelength conversion layer 1-13. The microlens can be prepared by, for example, photolithography and heat treatment. After resin is applied, the optical member can also be prepared by pressing a pattern die machined in an array shape against the resin. When the optical member is used as a microlens, the refractive index of the optical member can be set to higher than or equal to 1.7 and lower than or equal to 1.9.

Display Apparatus

A display apparatus according to the present embodiment includes the display elements according to the above-described embodiment, and a power supply unit that causes the light source portions to emit light.

Example (First Embodiment)

Hereinafter, a display element according to an example (first embodiment) of the present invention will be described in detail; however, the present invention is not limited to the following example.

Example 1-1

Reflective Layer

Preparation of Reflective Layer

Initially, to evaluate only the reflectance of the reflective layer, not including light absorption by the wavelength conversion layer, a reflective layer with the configuration shown in FIG. 1-6A was prepared. FIG. 1-6A shows the configuration of the present embodiment with a low refractive index layer. FIG. 1-6B is an existing configuration with no low refractive index layer. A reflective layer was formed on a quartz substrate 1-30 by an ion beam deposition method. Specifically, a multilayer film (reflective layer A) was formed as a reflective layer 1-31 by, where an alternate laminate of $SiO_2$ with a film thickness of 69 nm and $TiO_2$ with a film thickness of 40 nm was defined as a unit, repeatedly laminating the laminate 10 times such that the center wavelength of a reflection band was 400 nm.

A low refractive index layer was prepared by using hollow silica particles. For preparation of a coating solution, THRULYA 4110 (dispersion medium: IPA, the solid content concentration of silica: 20.5 percent by mass, the number mean particle diameter of one hollow particle: 60 nm, the voidage of one hollow particle: 45%, and the refractive index of one hollow particle: 1.25) produced by JGC Catalysts and Chemicals Ltd., was used. Then, a coating solution prepared such that the solid content concentration of silica was 6.0 percent by mass was used. The coating solution was applied to the reflective layer 1-31 and subjected to rotation for 10 seconds with a rotation speed of 1000 rpm by a spin coating method to form a low refractive index layer 1-32 with a thickness of 1.0 μm.

Subsequently, a resin portion 1-33 was formed on the low refractive index layer 1-32. The same resin as the wavelength conversion layer without phosphor particles was used for the resin portion. A material in which 3 wt % of 2,4,6-trimethylbenzoyl)phosphine oxide was contained in benzyl acrylate as a photopolymerization initiator was used as the resin. The resin was applied onto the low refractive index layer 1-32 and subjected to rotation for 10 seconds with a rotation speed of 1000 rpm by a spin coating method to form a film. The resin was cured by applying UV light with an illuminance of 15 mW/cm$^2$ for 30 seconds with a UV lamp (EX250, HOYA) to prepare the resin portion 1-33. The thickness of the resin portion 1-33 was 10 μm.

By changing forming conditions of the low refractive index layer, Configuration 1-1 to Configuration 1-5 with different refractive indexes of the low refractive index layer in the range of 1.10 to 1.30 and Configuration 1-6 with no low refractive index layer were formed on the reflective layer A as shown in Table 1-1.

In a similar process, a multilayer film (reflective layer B) was formed as the reflective layer 1-31 by, where an alternate laminate of $SiO_2$ with a film thickness of 81 nm and $TiO_2$ with a film thickness of 47 nm was defined as a unit, repeatedly laminating the laminate 10 times such that the center wavelength of a reflection band was 470 nm. In the same process, by changing forming conditions of the low refractive index layer, Configuration 1-7 to Configuration 1-11 with different refractive indexes of the low refractive index layer in the range of 1.10 to 1.30 and Configuration 1-12 with no low refractive index layer were formed on the reflective layer B as shown in Table 1-1.

For the prepared reflective layer A of Configuration 1-2, 460 nm light from the resin portion 1-33 side was caused to enter perpendicularly (0°) to the reflective layer, and the reflectance was measured, a high reflectance of 95% or higher was obtained for blue light (460 nm). The reflective layer A transmitted 90% or more of green light (530 nm) and 90% or more of red light (630 nm). FIG. 1-7 shows the angle dependence of the reflectance of the existing configuration with no low refractive index layer (Configuration 1-6) and the angle dependence of the reflectance of the configuration of the present example with a low refractive index layer having a refractive index of 1.15 (Configuration 1-2) for a wavelength of 460 nm corresponding to blue light (excitation light). The angle θ is an angle of light ray that exits from the resin portion 1-33. A reflective layer made up of a dielectric multilayer film exhibits a high reflectance for light ray that enters along a perpendicular axis (incident angle of zero degrees) to a film surface of the dielectric multilayer film. For light ray that enters obliquely, λ×cos θ where the light ray makes with the perpendicular axis is an angle θ corresponds to the wavelength of perpendicular incidence to cancel out. Therefore, a reflection band shifts toward a shorter wavelength in high angle incidence. As a result, the reflective layer had a high reflectance of higher than or equal to 95% for blue light (around 460 nm) at an incident angle smaller than or equal to 20 degrees but the reflective layer had a significantly decreased reflectance when the incident angle is larger than or equal to 20 degrees. When only reflection of blue light (460 nm) is considered, high reflectance is maintained even in high angle incidence when a reflection band at an incident angle of zero degrees is expanded toward a longer wavelength. However, here, the reflective layer needs to transmit emission from the wavelength conversion layer, so the reflective layer needs to be designed so as to transmit a wavelength longer than or equal to about 500 nm. Under such conditions, with the existing configuration with no low refractive index layer, the reflectance of the dielectric multilayer film necessarily decreases at an incident angle larger than or equal to 20 degrees.

With the configuration of the present example, since the low refractive index layer 1-32 is disposed, when light enters the low refractive index layer 1-32, the light is totally reflected at the interface. Thus, light that exits at a high angle larger than or equal to about 50° from the resin portion 1-33 corresponding to the wavelength conversion layer is reflected and returned toward the resin portion 1-33 by total reflection at the interface with the low refractive index layer, so the reflectance improves.

For the prepared reflective layer B of Configuration 1-8, similarly, 460 nm light was entered from the resin portion 1-33 side perpendicularly (0°) to the reflective layer, and the reflectance was measured. The reflective layer B had a high reflectance of 95% or higher for blue light (460 nm) and transmitted 90% or higher of red light (630 nm). FIG. 1-8 shows the angle dependence of the reflectance of the existing configuration with no low refractive index layer (Configuration 1-12) and the angle dependence of the reflectance of the configuration of the present example with a low refractive index layer having a refractive index of 1.15 (Configuration 1-8) for a wavelength of 460 nm corresponding to blue light (excitation light). Since the reflection band was expanded toward a longer wavelength, high reflectance was maintained until 40-degree incidence; whereas the reflectance decreased to about 50% at an incident angle larger than or equal to 40 degrees with the existing configuration with no low refractive index layer.

Evaluation of Transmittance

For the reflective layers of Configuration 1-1 to Configuration 1-12, the angle dependence of reflectance was measured, and an all-angle mean transmittance $T_{int}$ was calculated. An all-angle mean transmittance described below is an all-angle mean transmittance for blue light (460 nm).

It is considered that a large amount of a component of light that enters the reflective layer at a wide angle due to the influence of light scattering inside the wavelength conversion layer and multiple reflection and total reflection inside the light emitting element, this index is used as a standard value to evaluate the transmittance of blue light (excitation light) from the light emitting element. An all-angle mean reflectance $R_{int}$ can be calculated by the following expression 1-(3), and the all-angle mean transmittance $T_{int}$ can be calculated from the relationship $T_{int}=1-R_{int}$. In the expression 1-(3), R(θ) denotes an incident angle distribution of reflectance.

$$R_{int} = \frac{\int_0^{\pi/2} R(\theta)\sin\theta d\theta}{\int_0^{\pi/2} \sin\theta d\theta} \quad 1\text{-}(3)$$

Measurement results are shown in Table 1-1. In any one of the reflective layer A and the reflective layer B, in comparison with the configuration with no low refractive index layer (Configuration 1-6 or Configuration 1-12), when the low refractive index layer was provided, the all-angle mean transmittance decreased, and it became difficult to transmit 460 nm blue light (excitation light). As the refractive index of the low refractive index layer decreases, the advantageous effect increases, and, when the refractive index of the low refractive index layer is 1.30 in the reflective layer A, the all-angle mean transmittance is lower than or equal to 32%. When the refractive index of the low refractive index layer is 1.15, the all-angle mean transmittance is lower than or equal to 20%, and blue excitation light is efficiently usable. In the reflective layer B, when the refractive index of the low refractive index layer is 1.30, the all-angle mean transmittance is lower than or equal to 15%. When the refractive index of the low refractive index layer is 1.15, the all-angle mean transmittance is lower than or equal to 7%, and blue excitation light is efficiently usable.

Accordingly, when the low refractive index layer was disposed adjacent to the reflective layer made up of the dielectric multilayer film, the reflective layer with an improved reflectance for 460 nm blue light was obtained.

Here, the wavelength conversion layer contains light scattering particles to improve the efficiency of use of blue light (excitation light) and reduce leakage of blue light (excitation light). As a result, blue light (excitation light) scatters in the wavelength conversion layer, so the incident angles to the reflective layer include a high angle component. In addition, light reflected by the reflective layer and returned to the wavelength conversion layer side is absorbed again by the wavelength conversion layer to produce light or reflected or scattered inside the light emitting element and enters the reflective layer again. In this case, the incident angle includes a large amount of high angle component larger than or equal to 50 degrees. In blue light (excitation light), the proportion of a high angle component that enters the reflective layer at an angle larger than or equal to 50 degrees is about 10% to about 30% although it depends on the directivity of blue light (excitation light), the aspect ratio of the wavelength conversion layer, and the concentration of light scattering particles. The high angle component of blue light (excitation light) penetrates through the reflective layer and leaks to an outside, so the leakage adversely influences color purity even when the amount of leakage is a few percent.

TABLE 1-1

| CONFIGU-RATION | REFLECTIVE LAYER | REFRACTIVE INDEX OF LOW REFRACTIVE INDEX LAYER | ALL-ANGLE AVERAGE TRANSMITTANCE (%) FOR 460 nm |
|---|---|---|---|
| 1-1 | A | 1.10 | 16.2% |
| 1-2 | A | 1.15 | 19.8% |
| 1-3 | A | 1.20 | 22.9% |
| 1-4 | A | 1.25 | 26.6% |
| 1-5 | A | 1.30 | 31.2% |
| 1-6 | A | NOT PROVIDED | 51.2% |
| 1-7 | B | 1.10 | 4.8% |
| 1-8 | B | 1.15 | 6.5% |
| 1-9 | B | 1.20 | 8.7% |
| 1-10 | B | 1.25 | 11.3% |
| 1-11 | B | 1.30 | 14.3% |
| 1-12 | B | NOT PROVIDED | 28.3% |

Wavelength Conversion Layer

The first wavelength conversion layer (green wavelength conversion layer) and the second wavelength conversion layer (red wavelength conversion layer) were prepared by containing quantum dots and light scattering particles in the resin portion. The UV curing resin was 57 wt % of benzyl acrylate, the photopolymerization initiator was 3 wt % of 2,4,6-trimethylbenzoyl)phosphine oxide, the light scattering particles were 20 wt % of titanium oxide, and the phosphor particles were 20 wt % of InP/ZnS quantum dots. Through a similar process to preparation of the reflective layer, the low refractive index layer with a refractive index of 1.10 was formed on the reflective layer A to prepare the reflective layer of Configuration 1-1. The wavelength conversion layer with a thickness of 10 μm was formed thereon to prepare the first wavelength conversion layer and the second wavelength conversion layer.

Example 1-2

Except that the reflective layer of the first wavelength conversion layer and the reflective layer of the second wavelength conversion layer both had Configuration 1-2, the wavelength conversion layers were similarly prepared as in the case of Example 1-1.

Example 1-3

Except that the reflective layer of the first wavelength conversion layer and the reflective layer of the second wavelength conversion layer both had Configuration 1-3, the wavelength conversion layers were similarly prepared as in the case of Example 1-1.

Example 1-4

Except that the reflective layer for the first wavelength conversion layer and the reflective layer for the second wavelength conversion layer both had Configuration 1-4, the wavelength conversion layers were similarly prepared as in the case of Example 1-1.

Example 1-5

Except that the reflective layer of the first wavelength conversion layer and the reflective layer of the second wavelength conversion layer both had Configuration 1-5, the wavelength conversion layers were similarly prepared as in the case of Example 1-1.

Example 1-6

Except that the reflective layer of the first wavelength conversion layer had Configuration 1-1 and the reflective layer of the second wavelength conversion layer had Configuration 1-7, the wavelength conversion layers were similarly prepared as in the case of Example 1-1.

Example 1-7

Except that the reflective layer of the first wavelength conversion layer had Configuration 1-2 and the reflective layer of the second wavelength conversion layer had Configuration 1-8, the wavelength conversion layers were similarly prepared as in the case of Example 1-1.

Example 1-8

Except that the reflective layer of the first wavelength conversion layer had Configuration 1-3 and the reflective layer of the second wavelength conversion layer had Configuration 1-9, the wavelength conversion layers were similarly prepared as in the case of Example 1-1.

Example 1-9

Except that the reflective layer of the first wavelength conversion layer had Configuration 1-4 and the reflective layer of the second wavelength conversion layer had Configuration 1-10, the wavelength conversion layers were similarly prepared as in the case of Example 1-1.

Example 1-10

Except that the reflective layer of the first wavelength conversion layer had Configuration 1-5 and the reflective layer of the second wavelength conversion layer had Configuration 1-11, the wavelength conversion layers were similarly prepared as in the case of Example 1-1.

Example 1-11

Except that the reflective layer of the first wavelength conversion layer and the reflective layer of the second wavelength conversion layer both had Configuration 1-2 and the low refractive index layer was formed by an inkjet method (ink-jet printing), the wavelength conversion layers were similarly prepared as in the case of Example 1-1.

Comparative Example 1-1

Except that the first wavelength conversion layer and the second wavelength conversion layer both had no reflective layer and no low refractive index layer, the wavelength conversion layers were similarly prepared as in the case of Example 1-1.

Comparative Example 1-2

Except that the reflective layer of the first wavelength conversion layer and the reflective layer of the second wavelength conversion layer both had Configuration 1-6, the wavelength conversion layers were similarly prepared as in the case of Example 1-1.

Comparative Example 1-3

Except that the reflective layer of the first wavelength conversion layer had Configuration 1-6 and the reflective layer of the second wavelength conversion layer had Configuration 1-12, the wavelength conversion layers were similarly prepared as in the case of Example 1-1.

Evaluation of Transmittance and Luminance

A blue LED (peak emission wavelength: 460 nm) was used, an integrating sphere was connected to a multichannel spectrometer C10027-01 (Hamamatsu Photonics), and the integrating sphere was installed above the blue LED. A wavelength conversion layer was inserted between the blue LED and the integrating sphere, the blue LED was turned on, and the transmittance of each of the prepared first wavelength conversion layer and second wavelength conversion layer for 460 nm and an integral value of emission spectrum at 530 nm±30 nm and an integral value of emission spectrum at 630 nm±30 nm as luminances were measured. Here, the luminance value of the first wavelength conversion layer and the luminance value of the second wavelength conversion layer each are a relative value when the value of Comparative Example 1-1 is assumed as 100.

Table 1-2 shows the transmittances and luminance values of the first wavelength conversion layer and the second wavelength conversion layer.

With the configurations of the present examples, as compared to Comparative Example 1-2 and Comparative example 1-3 with no low refractive index layer, the transmittance of blue light (excitation light) (460 nm) decreased, and the luminance value improved. With Example 1-6 to Example 1-10, the reflective layer of the second wavelength conversion layer was changed to an optimal configuration for Example 1-1 to Example 1-5 in which the reflective layer was common to the first wavelength conversion layer and the second wavelength conversion layer, the transmittance of the second wavelength conversion layer for blue light was further reduced.

TABLE 1-2

| | FIRST WAVELENGTH CONVERSION LAYER (GREEN WAVELENGTH CONVERSION LAYER) | | | SECOND WAVELENGTH CONVERSION LAYER (RED WAVELENGTH CONVERSION LAYER) | | |
|---|---|---|---|---|---|---|
| | REFLECTIVE LAYER | TRANS-MITTANCE (%) (460 nm) | LUMINANCE | REFLECTIVE LAYER | TRANS-MITTANCE (%) (460 nm) | LUMINANCE |
| EXAMPLE 1-1 | CONFIG-URATION 1-1 | 3.0 | 119 | CONFIG-URATION 1-1 | 1.3 | 107 |
| EXAMPLE 1-2 | CONFIG-URATION 1-2 | 3.7 | 118 | CONFIG-URATION 1-2 | 1.6 | 107 |
| EXAMPLE 1-3 | CONFIG-URATION 1-3 | 4.2 | 118 | CONFIG-URATION 1-3 | 1.8 | 107 |
| EXAMPLE 1-4 | CONFIG-URATION 1-4 | 4.9 | 117 | CONFIG-URATION 1-4 | 2.1 | 106 |
| EXAMPLE 1-5 | CONFIG-URATION 1-5 | 5.8 | 116 | CONFIG-URATION 1-5 | 2.5 | 106 |
| EXAMPLE 1-6 | CONFIG-URATION 1-1 | 3.0 | 119 | CONFIG-URATION 1-7 | 0.4 | 108 |
| EXAMPLE 1-7 | CONFIG-URATION 1-2 | 3.7 | 118 | CONFIG-URATION 1-8 | 0.5 | 108 |
| EXAMPLE 1-8 | CONFIG-URATION 1-3 | 4.2 | 118 | CONFIG-URATION 1-9 | 0.7 | 108 |
| EXAMPLE 1-9 | CONFIG-URATION 1-4 | 4.9 | 117 | CONFIG-URATION 1-10 | 0.9 | 108 |
| EXAMPLE 1-10 | CONFIG-URATION 1-5 | 5.8 | 116 | CONFIG-URATION 1-11 | 1.1 | 107 |
| EXAMPLE 1-11 | CONFIG-URATION 1-2 | 3.7 | 118 | CONFIG-URATION 1-2 | 1.6 | 107 |
| COM-PARATIVE EXAMPLE 1-1 | NOT PROVIDED | 18.5 | 100 | NOT PROVIDED | 8.0 | 100 |
| COM-PARATIVE EXAMPLE 1-2 | CONFIG-URATION 1-6 | 9.5 | 112 | CONFIG-URATION 1-6 | 4.1 | 105 |
| COM-PARATIVE EXAMPLE 1-3 | CONFIG-URATION 1-6 | 9.5 | 112 | CONFIG-URATION 1-12 | 2.3 | 107 |

Second Embodiment

Background Art of Second Embodiment

There is a technology using quantum dots that exhibit emission with a narrow peak width at half height as a technique to implement color reproducibility compatible with wide color purity and high luminous efficiency in a display element and a display apparatus that display images and. When a display element converts color with a wavelength conversion layer having quantum dots by using ultraviolet light or blue light as excitation light, the display element that achieves both color reproducibility and high luminous efficiency is implemented. A light emitting diode (LED), an organic light emitting diode (OLED), or the like can be used as a light source of excitation light. Particularly, a configuration in which a wavelength conversion layer made up of quantum dots that produce light in red and a wavelength conversion layer made up of quantum dots that produce light in green are patterned in sub-pixels and color conversion is performed in units of pixel by using blue excitation light has been proposed. With this configuration, the size of each sub-pixel is a pitch of a few micrometers for a small display element used in an electric view finder (EVF) or the like and is a pitch of a few tens of micrometers for a large-size high-resolution television.

Here, as the aspect ratio (the ratio of height to width) of the wavelength conversion layer formed in each sub-pixel increases, pattern formation becomes difficult and, therefore, miniaturization becomes difficult. For this reason, the thickness of the wavelength conversion layer ranges from a few micrometers to 10 micrometers. Light converted in wavelength by the wavelength conversion layer (hereinafter, which may be referred to as wavelength converted light) radiates isotropically, so it is presumable that about half of the wavelength converted light is radiated to the incident side of excitation light.

A configuration in which a reflective layer that transmits excitation light (blue light) and reflects wavelength converted light (green light and red light) is disposed on the excitation light incident side of the wavelength conversion layer is disclosed (WO19/059308). With this configuration, wavelength conversion efficiency is improved by reflecting light to be radiated to the excitation light incident side of wavelength converted light to be radiated from the wavelength conversion layer and extracted to the wavelength conversion layer side.

Problem of Second Embodiment

The inventors of the subject application diligently studied the configuration of WO19/059308 and finally found a problem. When a dielectric multilayer film with a high reflectance in a wide wavelength band is used as such a reflective layer, the reflective layer has high reflection characteristics for green or red wavelength converted light that enters from the wavelength conversion layer at a low angle (smaller than or equal to 50 degrees) with respect to a perpendicular axis of a film surface of the dielectric multilayer film. However, it was found that there was a problem that, for wavelength converted light entering the film surface of the dielectric multilayer film at a high angle (larger than or equal to 50 degrees), the reflectance decreased and part of the wavelength converted light penetrated through and, as a result, the wavelength conversion efficiency decreased. As the reflectance decreases, there occurs a problem, such as a decrease in luminous efficiency and a decrease in color purity.

The second embodiment is contemplated in view of the above-described problem, and it is an object of the present invention for a display element having a sub-pixel region including a wavelength conversion layer that converts the wavelength of excitation light to reduce leakage of excitation light in the sub-pixel region.

Solution to Problem in Second Embodiment

A display element according to the second embodiment includes a light source portion that emits excitation light, a wavelength conversion portion that converts the excitation light to light with a wavelength longer than a wavelength of the excitation light, and an optical member that transmits light converted by the wavelength conversion portion, in this order. The wavelength conversion portion includes a first wavelength conversion layer that converts the excitation light to first wavelength converted light with a wavelength longer than the wavelength of the excitation light, and a second wavelength conversion layer that converts the excitation light to second wavelength converted light with a wavelength longer than the wavelength of the first wavelength converted light. The display element is a component of a pixel that includes a green sub-pixel region including the first wavelength conversion layer, a red sub-pixel region including the second wavelength conversion layer, and a blue sub-pixel region not including the first wavelength conversion layer or the second wavelength conversion layer. The display element further includes a reflective layer and a low refractive index layer that reflect light with a wavelength converted by the wavelength conversion portion in a region between the light source portion and the wavelength conversion portion. A surface of the low refractive index layer adjacent to the wavelength conversion portion is an interface at which the low refractive index layer is in contact with a region having a higher refractive index than the low refractive index layer.

Advantageous Effects of Second Embodiment

With the display element according to the second embodiment, it is possible for the display element having a sub-pixel region including a wavelength conversion layer that converts the wavelength of excitation light to reduce leakage of wavelength converted light in the sub-pixel region. As a result, it is possible to provide a display element and a display apparatus capable of implementing a high luminance and a high wavelength conversion efficiency.

Hereinafter, a display element according to the second embodiment of the present invention will be described in detail; however, the present invention is not limited thereto.

Configuration

Initially, the configuration of a display element according to the present embodiment will be described with reference to FIGS. 2-1A to 2-3. FIG. 2-1A is a plan view that shows a configuration in which a plurality of display elements (pixels) 2-10 according to the present embodiment is arranged in a two-dimensional array. Other than the array as shown in FIG. 2-1A, arrangement of the display elements (pixels) can be changed as needed according to uses. FIG. 2-1B is an enlarged plan view of one of the display elements (pixels) 2-10 shown in FIG. 2-1A. The display element 2-10 has a green sub-pixel region 2-15, a red sub-pixel region 2-16, and a blue sub-pixel region 2-17. FIG. 2-2 is a sectional view taken along the line II-II-II-II in FIG. 2-1B. FIG. 2-3 is a sectional view similar to that of FIG. 2-2 but differs in the location of a reflective layer 2-21 (described later) and the location of a low refractive index layer 2-20 (described later). In the present embodiment, the order of the pixel regions in an x-axis direction is not limited. As shown in FIG. 2-1A, other than the configuration in which the sub-pixel regions are arranged in the x-axis direction, a configuration in which three sub-pixel regions are respectively arranged at the vertexes of a triangle may be adopted.

The display element 2-10 according to the present embodiment includes a light source portion 2-11 that emits (L1, L2, L3), a wavelength conversion portion 2-50 that converts the excitation light to light (L1', L2') with a wavelength longer than the wavelength of the excitation light, and an optical member 2-22 that transmits light converted by the wavelength conversion portion 2-50, in this order. Here, the wavelength conversion portion 2-50 includes a first wavelength conversion layer 2-12 that converts excitation light (L1) to first wavelength converted light (L1') longer in wavelength than the excitation light, and a second wavelength conversion layer 2-13 that converts excitation light (L2) to second wavelength converted light (L2') longer in wavelength than the first wavelength converted light (L1').

The display element 2-10 is a pixel that includes the green sub-pixel region 2-15 including the first wavelength conversion layer 2-12, the red sub-pixel region 2-16 including the second wavelength conversion layer 2-13, and the blue sub-pixel region 2-17 not including the first wavelength conversion layer 2-12 or the second wavelength conversion layer 2-13.

The reflective layer 2-21 and the low refractive index layer 2-20 that reflect light with a wavelength converted by the wavelength conversion portion 2-50 are provided in a region (R) between the wavelength conversion portion 2-50 and the optical member 2-22. The low refractive index layer 2-20 is provided in a region (R) between the light source portion 2-11 and the wavelength conversion portion 2-50. FIG. 2-2 shows a configuration in which the light source portion 2-11, the reflective layer 2-21, and the low refractive index layer 2-20 are laminated in this order. Alternatively, as shown in FIG. 2-3, the light source portion 2-11, the low refractive index layer 2-20, and the reflective layer 2-21 may be laminated in this order. Here, a surface (I) of the low refractive index layer 2-20 adjacent to the wavelength conversion portion is an interface at which the low refractive index layer 2-20 is in contact with a region having a higher refractive index than the low refractive index layer 2-20. In the case of FIG. 2-2, the refractive index of the low refractive index layer 2-20 can be lower than the refractive index of any of the first wavelength conversion layer 2-12 and the second wavelength conversion layer 2-13. In the case of FIG. 2-3, the refractive index of the low refractive index layer 2-20 is lower than the refractive index of the reflective layer 2-21.

Operational Effects

In this way, in the display element 2-10 according to the present embodiment, the surface (I) of the low refractive index layer 2-20 adjacent to the wavelength conversion portion is an interface at which the low refractive index layer 2-20 is in contact with a region having a higher refractive index than the low refractive index layer 2-20. Therefore, the region shifts from a region with a high refractive index to a region with a low refractive index at the interface, so the first wavelength converted light L1' and the second wavelength converted light L2' are reflected, with the result that it is possible to reduce leakage of wavelength converted light from the green sub-pixel region or the red sub-pixel region. Particularly, wavelength converted light (first wavelength converted light or second wavelength converted light) that enters at a high angle larger than or equal to 50 degrees with respect to a perpendicular axis to the surface (I) and that has been insufficiently reflected only with the reflective layer 2-20 is totally reflected at the interface with the low refractive index layer, so it is possible to reduce leakage of wavelength converted light as compared to the existing configuration. Wavelength converted light having returned to the wavelength conversion portion 2-50 (the first wavelength conversion layer 2-12 and the second wavelength conversion layer 2-13) travels toward the optical member and is emitted outside the light emitting element 2-10. As a result, high luminance and high wavelength conversion efficiency are implemented.

When excitation light L3 is blue light, the excitation light L3 penetrates through the optical member 2-22, and blue light is emitted from the blue sub-pixel region 2-17, so a pixel that produces light in green, red, and blue is formed (FIGS. 2-2 and 2-3). When the excitation light L3 is ultraviolet light, the wavelength conversion portion 2-50 may include a third wavelength conversion layer that converts the excitation light L3 to third wavelength converted light (L3' longer in wavelength than the excitation light and shorter in wavelength than the first wavelength converted light (L1') (all of which are not shown).

FIGS. 2-2 and 2-3 show the configuration in which the light source portion 2-11, the reflective layer 2-21, the low refractive index layer 2-20, the wavelength conversion portion 2-50, and the optical member 2-22 are laminated so as to be in contact with each other. Alternatively, another component may be provided between these elements. In this case as well, there is an interface that is in contact with a region higher in refractive index than the low refractive index layer 2-20, that is, an interface at which the region shifts from a region with a high refractive index to a region with a low refractive index, due to the above reason, so it is possible to totally reflect wavelength converted light and return the wavelength converted light to the wavelength conversion portion 2-50.

In the present embodiment, blue light is light with a maximum wavelength longer than or equal to 445 nm and shorter than or equal to 475 nm, green light is light with a maximum wavelength longer than or equal to 515 nm and shorter than or equal to 545 nm, and red light is light with a wavelength longer than or equal to 615 nm and shorter than or equal to 645 nm.

Display Element

Hereinafter, the detailed configuration of the display element according to the embodiment of the present invention will be described. FIGS. 2-4A to 2-4D are schematic sectional views that schematically show an example of the display element according to the present embodiment. In the display element according to the present embodiment, the light source portion is configured to include a plurality of light emitting elements 2-11 respectively corresponding to green, red, and blue pixel regions (2-15, 2-16, 2-17). The light emitting elements 2-11 emit blue light. In the display elements according to the present embodiment, the maximum wavelength of blue light, the maximum wavelength of green light, and the maximum wavelength of red light are respectively 460 nm, 530 nm, and 630 nm. When simply referred to the wavelength conversion layers, the wavelength conversion layers represent both the first wavelength conversion layer 2-12 and the second wavelength conversion layer 2-13.

Initially, the configuration of FIG. 2-4A will be described. The wavelength conversion portion 2-50 includes the first wavelength conversion layer 2-12 that converts blue light from the light emitting element 2-11 to first wavelength converted light (green light), the second wavelength conversion layer 2-13 that converts the blue light to second wavelength converted light (red light), and a resin portion 2-14 that transmits blue light. With such a configuration, a pixel including the green sub-pixel region 2-15, the red sub-pixel region 2-16, and the blue sub-pixel region 2-17 is formed.

Here, light scattering particles can be contained in the first wavelength conversion layer 2-12 and the second wavelength conversion layer 2-13 to improve the efficiency of use of excitation light and reduce leakage of excitation light. Titanium oxide or the like may be used as the light scattering particles. Light scattering particles are also contained in the resin portion 2-14 that will be the blue sub-pixel region 2-17 to eliminate directivity by scattering blue light that is excitation light and to expand a viewing angle. A partition wall 2-18 is provided between adjacent two of the green sub-pixel region, the red sub-pixel region, and the blue sub-pixel region to reduce leakage of light to an adjacent pixel, with the result that the sub-pixel regions are separated. The light emitting elements 2-11 are separated by an insulating material 2-19 (also referred to as bank). An electrode for supplying current to the light source portion (light emitting elements) 2-11, a drive circuit for the light source portion 2-11, and the like can be provided (not shown).

In each of the green sub-pixel region 2-15 and the red sub-pixel region 2-16, the light emitting element 2-11, the reflective layer 2-21, and the wavelength conversion layer (the first wavelength conversion layer 2-12 or the second wavelength conversion layer 2-13) are formed in this order, and the low refractive index layer 2-20 is provided adjacent to the reflective layer 2-21. The reflective layer provided on the light source portion side of the first wavelength conversion layer 2-12 and the second wavelength conversion layer 2-13 is referred to as reflective layer C here. Here, the low refractive index layer 2-20 may be provided on any one of the upper surface and lower surface of the reflective layer 2-21. FIGS. 2-4A to 2-4D show schematic diagrams when the low refractive index layer 2-20 is provided on the upper surface. FIGS. 2-5A to 2-5D are schematic diagrams when the low refractive index layer 2-20 is provided on the lower surface. FIG. 2-4A shows a configuration in which the common low refractive index layer 2-20 and the common reflective layer 2-21 are used for the green sub-pixel region 2-15 and the red sub-pixel region 2-16. On the other hand, FIG. 2-4B shows a configuration in which the reflective layer 2-21 is common and the low refractive index layer 2-20 is separated for each sub-pixel region. FIG. 2-4C shows a configuration in which each of the reflective layer 2-21 and the low refractive index layer 2-20 is separated for each sub-pixel region. With any configuration as well, the reflection characteristics configured with the reflective layer 2-21 and the low refractive index layer 2-20 are the same, but FIG. 2-4C in which pixels are partitioned by the partition walls 2-18 provides the smallest leakage of light between the sub-pixel regions. FIG. 2-4D shows a configuration in which the reflective layer 2-21 and the low refractive index layer 2-20 are provided on the lower surface of the resin portion 2-14 that is a component of the blue sub-pixel region 2-17. When light scattering particles are contained in the resin portion 2-14, blue excitation light that is scattered in the resin portion and returns to the blue light emitting element, when enters again the reflective layer, has a large amount of component that enters at a high angle larger than or equal to 50 degrees. Thus, with the existing configuration with no low refractive index layer, blue light leaks to the blue light emitting element. With the configuration of the present example with the low refractive index layer, light with a high angle larger than or equal to 50 degrees can be reflected, and blue light that enters the reflective layer again can be reflected again and emitted as blue light, so the luminance of a blue pixel improves. The same applies to FIGS. 2-5A to 2-5D in which arrangement of the low refractive index layer 2-20 and the reflective layer 2-21 is inverted from that of FIGS. 2-4A to 2-4D.

The low refractive index layer 2-20 and the reflective layer 2-21 may be provided over the entire surface including the blue sub-pixel region 2-17 as shown in FIG. 2-6A to simplify a pattern formation process. As shown in FIG. 2-6B, the reflective layer 2-21 may be formed over the entire surface, and the low refractive index layer 2-20 may be formed only in the green sub-pixel region 2-15 and the red sub-pixel region 2-16. In addition, as shown in FIG. 2-6C, the reflective layer 2-21 and the low refractive index layer 2-20 may be provided on the lower surface of the resin portion 2-14 that is a component of the blue sub-pixel region 2-17.

Other Configuration Examples

An excitation light reflective layer (the reflective layer B or the reflective layer C (described later)) and the low refractive index layer 2-20 that reflect excitation light may be provided in a region between the wavelength conversion portion (the first wavelength conversion layer 2-12 or the second wavelength conversion layer 2-13) and the optical member 2-22. In the present configuration, the refractive index of the low refractive index layer 2-20 is lower than the refractive index of any of the optical member 2-22, the first wavelength conversion layer 2-12, and the second wavelength conversion layer 2-13. In other words, as shown in FIG. 2-11, in addition to the reflective layer 2-21 provided on the light source portion side of the first wavelength conversion layer 2-12 and second wavelength conversion layer 2-13, a reflective layer that reflects blue light and transmits wavelength converted light may be provided on the wavelength conversion portion side. In this case, blue light is trapped inside the wavelength conversion layers, so the wavelength conversion efficiency further improves. In FIG. 2-11, the low refractive index layer 2-20, a reflective layer 2-23, and the optical member 2-22 are formed in this order on the surface of the first wavelength conversion layer 12 adjacent to the wavelength conversion portion, and the low refractive index layer 2-20, a reflective layer 2-24, and the optical member 2-22 are formed in this order on the surface of the second wavelength conversion layer 2-13 adjacent to the wavelength conversion portion side.

The reflective layer 2-23 reflects blue light and transmits green light. The reflective layer 2-24 reflects blue light and transmits red light. The positional relationship between the low refractive index layer 2-20 and each of the reflective layer 2-23 and the reflective layer 2-24 may be inverted. Another component may be provided between any adjacent two of the light source portion 2-11, the wavelength conversion layers, the low refractive index layer 2-20, the reflective layer 2-23, and the optical member 2-22.

Here, neither excitation light reflective layer nor low refractive index layer that reflects excitation light is provided in a region between the resin portion 2-14 and the optical member 2-22.

Reflective Layer

The reflective layer according to the present embodiment represents a layer that selectively reflects light with a designated wavelength. In other words, the reflective layer may also be regarded as having wavelength selectivity with which light with wavelengths other than the designated wavelength reflected is transmitted.

The above-described reflective layer having wavelength selectivity includes a dielectric multilayer film. A dielectric that is a component of the dielectric multilayer film may be an inorganic material, an organic material, or a combination of these materials. At least one selected from a group consisting of a polyester resin, an urethane resin, and an acrylic resin may be used as the organic material. An inorganic material, such as a fluoride material and an oxide material, or the like may be used as the inorganic material. At least one selected from a group consisting of $AlF_2$ (1.36), $MgF_2$ (1.38), and $CaF_2$ (1.43) may be used as the fluoride material. At least one selected from a group consisting of $SiO_2$ (1.45), $Al_2O_3$ (1.64), MgO (1.72), $Y_2O_3$ (1.88), $HfO_2$ (2.05), $SrTiO_3$ (2.44), and $TiO_2$ (2.49) may be used as the oxide material. Here, the numeric values in the parentheses of the fluoride materials and oxide materials listed above are reference values of refractive indexes. The dielectric multilayer film is a multilayer film in which a low refractive index material and a high refractive index material selected from among these types of materials are alternately laminated. Here, the low refractive index material has a relatively lower refractive index than the high refractive index material, and the high refractive index material has a relatively higher refractive index than the low refractive index material.

At this time, when the thickness d of each of the layers that make up the dielectric multilayer film is set to $d=\lambda_0/4n$ where the refractive index n of the layer for a center wavelength $\lambda_0$ of a reflection band, rays of light reflected at the boundaries of the layers cancel out each other to reduce transmittance, and a reflection band is formed. Where the refractive index of the high refractive index material is $n_H$ and the refractive index of the low refractive index material is $n_L$ ($<n_H$), a reflection band with a width $W=2/\pi\times\sin[(n_H-n_L)/(n_H+n_L)]\times\lambda_0$ is formed on each side of the center wavelength.

In the reflective layer according to the present embodiment, the dielectric multilayer film is designed so as to reflect blue light (460 nm) that is excitation light and transmit green light (530 nm) to be emitted from the green sub-pixel region and red light (630 nm) to be emitted from the red sub-pixel region. The wavelengths of red, green, and blue rays of light described here each are an example of a maximum wavelength in each sub-pixel region and have to be a value within the range of the above-described wavelength band.

Here, a micro LED or a micro OLED can be used as an element that produces blue light that is excitation light. Such a light emitting element is a light source having directivity, so an angular range in which blue light is transmitted can range from zero degrees to 30 degrees. Part of a component not absorbed by the wavelength conversion layer in blue light having penetrated through the reflective layer in this angular range is reflected on the upper surface of the wavelength conversion layer and returns to the blue light emitting element side. However, when blue light enters the reflective layer again due to light scattering in the wavelength conversion layer or multiple reflection in the element, there is a large amount of component that enters at a high angle larger than or equal to 30 degrees. For this reason, when the dielectric multilayer film is designed so as to transmit blue light in an angular range of zero degrees to 30 degrees and reflect blue light at a high angle larger than or equal to 30 degrees, blue light that enters the reflective layer again can be reflected and returned to the wavelength conversion layer side, so the wavelength conversion efficiency improves. Wavelength converted light (green light or red light) radiates isotropically, so, when the dielectric multilayer film is designed so as to reflect light in the entire angular range, half of light radiated to the excitation light incident side can be reflected and extracted to a radiation side.

In the reflective layer according to the present embodiment, an all-angle mean reflectance for blue light that enters the reflective layer at an incident angle larger than or equal to 30 degrees and smaller than or equal to 90 degrees is preferably higher than or equal to 89% and more preferably higher than or equal to 95%.

Hereinafter, an example in which the dielectric multilayer film according to the present embodiment includes a laminated body in which a layer made of $SiO_2$ (low refractive index material) and a layer made of $TiO_2$ (high refractive index material) are alternately laminated will be described.

A reflective layer (assumed as the reflective layer C) in which multilayer films of which the center wavelengths of the reflection bands of the dielectric multilayer films were respectively 580 nm, 670 nm, and 760 nm were laminated was used. The film thicknesses of $SiO_2$ and $TiO_2$ are 100 nm and 58 nm, 116 nm and 67 nm, and 131 nm and 76 nm. The number of repetitions of each band is five, and the total film thickness of the reflective layer is 2.7 μm. In other words, an alternate laminate of $SiO_2$ and $TiO_2$ is defined as a unit, and a multilayer film is obtained by repeatedly laminating the laminate five times.

In this way, the reflective layer C transmits incident light of zero degrees to 30 degrees and reflects incident light of larger than or equal to 30 degrees for blue light (460 nm). For green light (530 nm) and red light (630 nm), the reflective layer C reflects light at all the incident angles. The reflective layer can be prepared by film formation with a sputtering method, an ion beam deposition method, a pulsed laser deposition (PLD) method, or the like.

The reflective layer 2-23 (referred to as reflective layer A) and the reflective layer 2-24 (referred to as reflective layer B), described in the above other configuration examples, will be described.

In an example of the reflective layer A, when it is assumed that the center wavelength of the reflection band is 400 nm, the film thickness of $SiO_2$ is 69 nm, the film thickness of $TiO_2$ is 40 nm, and the total film thickness is 1.1 μm. In an example of the reflective layer B, when it is assumed that the center wavelength of the reflection band is 470 nm, the film thickness of $SiO_2$ is 81 nm, the film thickness of $TiO_2$ is 47 nm, and the total film thickness is 1.3 μm.

Wavelength Conversion Portion, and Wavelength Conversion Layer

The wavelength conversion portion according to the present embodiment is not limited as long as the wavelength conversion portion converts blue light to light with a different wavelength. The wavelength conversion portion according to the present embodiment includes the first wavelength conversion layer that converts excitation light to first wavelength converted light longer in wavelength than the excitation light and the second wavelength conversion layer that converts the excitation light to second wavelength converted light longer in wavelength than the first wavelength converted light. The first wavelength converted light can be green light, and the second wavelength converted light can be red light. The first wavelength conversion layer and the second wavelength conversion layer according to the present embodiment can contain quantum dots. The thickness of each of the first wavelength conversion layer and the second wavelength conversion layer according to the present embodiment is preferably greater than or equal to 4 μm and less than or equal to 20 μm and more preferably greater than or equal to 6 μm and less than or equal to 10 μm.

The wavelength conversion portion is configured to include the wavelength conversion layers in which phosphor particles are dispersed in resin. It does not matter whether the phosphor particles are made of an inorganic material or an organic material, and particularly quantum dots can be used as the phosphor particles. This is because quantum dots exhibit emission with a narrow full width at half maximum of an emission spectrum and excellent color purity.

Inorganic particles used for quantum dots may be referred to as nanoparticles because of their size. Examples of the material of quantum dots include semiconductor crystals and include nanoparticles of group IV semiconductors, group III-V and group II-VI compound semiconductors, and compound semiconductors made of a combination of three or more of group II, group III, group IV, group V, and group VI elements. Specific examples of the material that emits light in a wavelength range for a display element include CsS, CdSe, CdZnSe, CdSeTe, ZnSe, ZnTeSe, ZnTeS, InP, $CuInS_2$, $AgInS_2$, and Pb perovskite. A core shell structure in which the above materials are used as the cores of quantum dots and the cores of quantum dots are coated with a coating compound is applicable. In this case, a ligand is provided in the shell part.

The mean particle diameter of the quantum dots is preferably greater than or equal to 2 nm and less than or equal to 15 nm. In quantum dots, if the particle diameters of quantum dots are reduced to a size less than or equal to the Bohr radius of an intrinsic exciton, there occurs a phenomenon that the bandgap of the quantum dots changes because of quantum size effect. For example, in InP that is a group III-V semiconductor, the Bohr radius is generally about 10 nm to about 14 nm. In other words, when the mean particle diameter of quantum dots is less than or equal to 15 nm, it is possible to control the bandgap due to quantum size effect. When the mean particle diameter of quantum dots is set to greater than or equal to 2 nm, it is possible to easily control the crystal growth of quantum dots in synthesizing quantum dots.

Quantum dots each have a ligand on the surface. A ligand may have a crosslinked structure that, when there are a first quantum dot and a second quantum dot, links the first quantum dot with the second quantum dot. Linking is that one molecule is coupled to the first quantum dot and the second quantum dot. When linking is performed by an organic ligand, it is possible to control the distance between the quantum dots by using the molecule length of the organic ligand. Specific examples of the crosslinked structure may include a hydroxyl group, a thiol group, and a carboxyl group. At least one or more organic molecules can be provided between quantum dots. As the number of organic ligands increases, both ends of the organic molecules tightly coupled to the surfaces of the quantum dots, so heat resistance and environmental resistance improve, and the stability of emission characteristics increases.

Phosphor Particle

Quantum dots having a full width at half maximum of less than 50 nm may be preferably used as phosphor particles to be used for the first wavelength conversion layer and the second wavelength conversion layer according to the present embodiment. For example, generally available quantum dots, such as InP/ZnS quantum dots of product numbers 776769, 776750, 776793, 776777, and 776785, produced by Sigma-Aldrich, may be used as quantum dots. The first wavelength conversion layer can be product number 776750. The second wavelength conversion layer can be product number 776777. Product numbers 905062, 900746, 900747, and 900748 may be used as perovskite quantum dots. The first wavelength conversion layer can be product number 905062 or product number 900746. The second wavelength conversion layer can be product number 900748.

Resin Portion

In the first wavelength conversion layer, the second wavelength conversion layer, and a third wavelength conversion layer (described later) according to the present embodiment, a monofunctional monomer or a bifunctional monomer may be used as the resin portion that is a matrix. Examples of the resin portion include acrylic resin, polyester resin, polyurethane resin, and polyamide resin. By mixing these materials, it is possible to adjust viscosity and surface tension suitable for film formation by means of photolithography and inkjet method (inkjet printing). The resin portion contains a photopolymerization initiator. The proportion of the resin portion ranges from 50 wt % to 70 wt %, and the proportion of the photopolymerization initiator ranges from 2 wt % to 5 wt %. In addition, light scattering particles can be contained in the wavelength conversion layer to improve the efficiency of use of blue light (excitation light) and reduce leakage of blue light. Titanium oxide or the like may be used as the light scattering particles. The proportion of light scattering particles ranges from 10 wt % to 30 wt %.

Low Refractive Index Layer

Refractive Index

The refractive index of the low refractive index layer according to the present embodiment is lower than the refractive index of any of the optical member, the first wavelength conversion layer, and the second wavelength conversion layer. Specifically, when silicon dioxide $SiO_2$ (Refractive index=1.45) is used as a framework material, the refractive index of the low refractive index layer according to the present embodiment may be lower than or equal to 1.45, preferably higher than or equal to 1.10 and lower than or equal to 1.30, and more preferably higher than or equal to 1.10 and lower than or equal to 1.15.

Thickness

The thickness of the low refractive index layer according to the present embodiment may be greater than or equal to 200 nm and may be less than or equal to half the thickness of the wavelength conversion portion or less than or equal to 2 μm. Here, the thickness is a thickness in the z-axis direction in FIGS. 2-2 to 2-5D.

Preferably, the lower limit of the thickness of the low refractive index layer according to the present embodiment is 200 nm, and the upper limit is a smaller one of half the thickness of the wavelength conversion portion and 2 μm. In the present embodiment, to sufficiently increase the reflectance at all angles, the thickness is preferably greater than about half the wavelength used for blue light (excitation light) from a light emitting element, so the above-described lower limit value is determined.

If the low refractive index layer is too thick, a crack or a haze significantly increases, so the thickness is preferably set to a smaller one of half the thickness of the wavelength conversion layer and 2 μm. A surface of the low refractive index layer adjacent to the wavelength conversion portion can be located closer to the wavelength conversion portion than to a surface of the partition wall adjacent to the light source portion. Here, light that exits from the wavelength conversion layer is totally reflected and returned to the wavelength conversion portion side at the interface with the low refractive index layer. At this time, when the surface of the low refractive index layer adjacent to the wavelength conversion portion is provided closer to the light source portion than to the surface of the partition wall adjacent to the light source portion, light is easily diffused in a horizontal direction, and leakage of light to an adjacent sub-pixel region occurs, which may lead to a decrease in resolution. Here, the horizontal direction is x and y-axis directions in FIGS. 2-2 to 2-6C, and 2-11.

Composition and Configuration

When a solid material of which the refractive index of the low refractive index layer according to the present embodiment is lower than or equal to 1.45 is used as a framework, it is possible to appropriately set a voidage for a lower refractive index and improve the strength of the low refractive index layer. Hereinafter, an example in which the low refractive index layer contains a solid material will be described.

The solid material may be any of crystalline and amorphous. The solid material may be particles. The particles are not limited. Examples of the particles include spherical particles, indefinite-shape particles, particles in which the spherical or indefinite-shape particles are coupled in a beaded shape or a branched-chain shape, hollow particles having a cavity inside, and particles in which hollow particles are coupled in a beaded shape or a branched-chain shape.

From the viewpoint of refractive index, cost, and chemical stability, the solid material can contain silicon dioxide. In other words, the principal component of the solid material can be silicon dioxide. Here, the state "the principal component of the solid material is silicon dioxide" means that the solid material contains higher than or equal to 50 percent by mass of silicon dioxide. Typically, the solid material contains higher than or equal to 90 percent by mass of silicon dioxide.

Specific examples of silicon dioxide particles include Snowtex series and Organosilicasol made by Nissan Chemical Corporation, THRULYA series produced by JGC Catalysts and Chemicals Ltd., and Aerosil series made by EVONIK and sold by Nippon Aerosil Co., Ltd.

Generally, the refractive index $n_c$ of a composite material C made up of a material A with a refractive index $n_a$ and a material B with a refractive index $n_b$ is approximately expressed by the following expression 2-(1).

$$n_c=[n_a \times v_a/100]+[n_b \times v_b/100] \quad \text{2-(1)}$$

Here, $v_a$ and $v_b$ are respectively volume fractions of the material A and material B that make up the composite material ($v_a+v_b=100$).

According to the expression 2-(1), when a composite material of the solid material and air, that is, when a porous film with a solid material as a framework is used as the low refractive index layer, the refractive index can be lower than the refractive index of the original solid material. At this time, as the refractive index of the solid material that is the framework decreases, or as the voidage of the low refractive index layer increases, the refractive index of the low refractive index layer decreases. To increase the voidage of the low refractive index layer, the low refractive index layer may have a porous structure. From this viewpoint, the low refractive index layer may be referred to as porous film.

In the expression 2-(1), where the material A is air and the material B is silicon dioxide, the refractive index of air $n_a$ is 1.00, the refractive index of silicon dioxide $n_b$ is 1.46, and the volume fraction of silicon dioxide $v_b$ is $100-v_a$. In other words, $v_a$ is a function of the refractive index $n_c$ of the low refractive index layer, and $v_a$ can be obtained. $v_a$ is a voidage.

The voidage of the low refractive index layer according to the present embodiment is preferably higher than or equal to 60.0% and lower than or equal to 95.0% and more preferably higher than or equal to 65.0% and lower than or equal to 90.0%.

For example, according to the expression 2-(1), when the voidage of the low refractive index layer with silicon dioxide (refractive index 1.46) as a framework is lower than 60.0%, the refractive index can possibly exceed 1.15.

On the other hand, when the voidage exceeds 95.0%, the refractive index can be excessively low like the refractive index of the low refractive index layer is lower than 1.05, and the strength can decrease because there is a small amount of the framework that is a component of the low refractive index layer.

Hollow Particle

The case where the low refractive index layer contains hollow particles will be further described; however, the low refractive index layer is not limited thereto. Hollow particles are such that an outer shell is made of a solid material and a particle having a cavity (void) inside is provided inside the outer shell. Hollow particles can contain hollow particles (hereinafter, hollow silica particles) of which the outer shell is made of silicon dioxide. Fumed silica particles may be used other than hollow silica particles. In the following description, hollow silica particles will be described.

The low refractive index layer can contain a plurality of hollow particles. The low refractive index layer containing a plurality of hollow particles may contain solid particles or may contain a binder, other than hollow particles. Where the proportion of a total volume of voids in the plurality of hollow particles to a unit volume of the low refractive index layer is a voidage X (%) and the proportion of a total volume of voids between hollow particles to the unit volume of the low refractive index layer is a voidage Y (%), the relationship $X<Y$ can be satisfied. Here, $(X+Y)$ means the voidage of the low refractive index layer.

The refractive index n of the low refractive index layer is expressed by the following expression 2-(2).

$$n=[n_a \times (X+Y)/100]+[n_s \times (100-X-Y)/100] \quad \text{2-(2)}$$

Here, $n_a$ is the refractive index of air ($n_a=1$), and $n_s$ is the refractive index of the outer shells of hollow particles ($n_s>1$). According to the expression 2-(2), as $X+Y$ increases or as $n_s$ decreases, n decreases. When the hollow particles are densely disposed, the volume fraction of voids present between hollow particles reduces, and the volume fraction of the outer shells that are a component with a higher refractive index than air increases, so the refractive index of the low refractive index layer increases. On the other hand, when the hollow particles are sparsely disposed, the volume fraction of voids between hollow particles increases, and the volume fraction of the outer shells reduces, so the refractive index of the low refractive index layer decreases. In other words, to further decrease the refractive index of the low refractive index layer, Y/X can be increased. Specifically, the relationship $Y/X>1$, that is, the relationship $X<Y$, can be satisfied.

X and Y preferably satisfy the relationship $X<(100-X-Y)<Y$.

The low refractive index layer may contain particles made of a solid material and a binder that binds the particles for high strength. When a binder is used, solids contained in the low refractive index layer are the outer shells of hollow particles and the binder, and the volume fraction of the solids to the unit volume of the low refractive index layer is expressed by (100−X−Y) (%).

When the relationship X<(100−X−Y) is satisfied, the strength of the low refractive index layer is further improved. When the relationship (100−X−Y)<Y is satisfied, the refractive index of the low refractive index layer further decreases. A total value of X and Y (X+Y) is preferably higher than or equal to 60.0% and lower than or equal to 95.0% and more preferably higher than or equal to 65.0% and lower than or equal to 90.0%. When (X+Y) is set to the above range, the strength of the low refractive index layer and the refractive index of the low refractive index layer are easily adjusted to desired ranges.

When X and Y are set to the above ranges, the strength of the low refractive index layer and the refractive index of the low refractive index layer are easily adjusted to desired ranges.

Film Formation Method

An example in which hollow particles of which the outer shell is silicon dioxide as a solid material are used will be described; however, the configuration is not limited thereto.

A dispersion solution of hollow particles may be used. The dispersion solution of hollow particles is not limited as long as the dispersion solution of hollow particles satisfies the voidage of the hollow particles, the refractive index of the outer shells of the hollow particles, the number mean particle diameter of primary particles of the hollow particles, and the like.

For example, THRULYA series produced by JGC Catalysts and Chemicals Ltd., which is an isopropanol (hereinafter, also referred to as IPA) dispersion solution of hollow silica particles, is suitably used. Other than commercially available products like THRULYA series, as for hollow silica particles, hollow particles dispersed in a solvent by a similar method to that for a dispersed solvent of fumed silica particles may be used.

The concentration of hollow particles in a solvent, for example, the concentration (solid content concentration) of hollow silica particles in a coating solution is preferably higher than or equal to 1.0 percent by mass and lower than or equal to 30.0 percent by mass and more preferably higher than or equal to 2.0 percent by mass and lower than or equal to 20.0 percent by mass.

When the content (concentration) falls within the above range, it is easy to adjust the film thickness of the low refractive index layer to greater than or equal to 200 nm.

The surface of each hollow silica particle has a hydroxyl group and has an affinity for water, so a solvent with a strong hydrophobicity is not suitable. Specifically, an organic solvent with an octanol-water partition coefficient log $P_{ow}$ less than or equal to two can be used. Examples of the organic solvent include alcohol solvents, such as methanol, ethanol, propanol, and isopropanol, glycol solvents, such as ethylene glycol and propylene glycol, ether solvents, such as dimethyl ether, diethyl ether, ethylene glycol monomethyl ether, ethylene glycol monoethyl ether, propylene glycol monomethyl ether, and propylene glycol monoethyl ether, acetate solvents, such as ethyl acetate, propyl acetate, propylene glycol monomethyl ether acetate, and propylene glycol monoethyl ether acetate, and ketone solvents, such as acetone and methyl ethyl ketone.

Hereinafter, a film formation method for the low refractive index layer will be described. A film is formed by using the coating solution. A bar coating method, a doctor blade method, a squeegee method, a spray method, a spin coating method, a dip coating method, a screen printing method, an ink-jet method may be used as the film formation method. When a film is formed by patterning a selected pixel of a display element, the film can be formed by the ink-jet method.

A binder that binds particles may be used as one of methods for improving the strength of the low refractive index layer. A resin, such as acrylic resin, fluororesin, styrene resin, imide resin, urethane resin, and phenolic resin, may be used as the binder.

Light Source Portion

The light source portion according to the present embodiment is not limited as long as the light source portion emits excitation light. Examples of the light source portion include light emitting elements, such as a light emitting diode (LED) and an organic light emitting diode (OLED). In the present embodiment, a micro LED or a micro OLED can be used.

Light source portions may be respectively provided for the red sub-pixel region, the green sub-pixel region, and the blue sub-pixel region or a common light source portion may be provided for these sub-pixel regions.

Optical Member

The optical member according to the present embodiment is not limited as long as the optical member transmits blue light, green light, or red light. The optical member according to the present embodiment is, for example, a transparent resin capable of shielding the first wavelength conversion layer or the second wavelength conversion layer against an external environment. A transparent resin with a transmittance of higher than or equal to 85% and more preferably higher than or equal to 90% for blue light, green light, and red light may be used as the optical member. The refractive index of resin that is used as the optical member may be higher than or equal to 1.5 and lower than or equal to 1.9. The optical member may be formed as a microlens in each sub-pixel region. In this case, the optical member has a function to converge light emitted from the first wavelength conversion layer 2-12 and the second wavelength conversion layer 2-13. The microlens can be prepared by, for example, photolithography and heat treatment. After resin is applied, the optical member can also be prepared by pressing a pattern die machined in an array shape against the resin. When the optical member is used as a microlens, the refractive index of the optical member can be set to higher than or equal to 1.7 and lower than or equal to 1.9.

Display Apparatus

A display apparatus according to the present embodiment includes the display elements according to the above-described embodiment, and a power supply unit that causes the light source portions to emit light.

Example (Second Embodiment)

Hereinafter, a display element according to an example (second embodiment) of the present invention will be described in detail; however, the present invention is not limited to the following example.

Example 2-1

Reflective Layer

Preparation of Reflective Layer

Initially, to evaluate only reflectance not including light absorption by the wavelength conversion layer of the reflective layer, reflective layers with the configurations shown in FIGS. 2-7A and 2-7B were prepared. FIG. 2-7A shows the configuration of the present embodiment with a low refractive index layer. FIG. 2-7B is an existing configuration with no low refractive index layer.

The reflective layer C transmits incident light of zero degrees to 30 degrees and reflects incident light of larger than or equal to 30 degrees for blue light (460 nm). For green light (530 nm) and red light (630 nm), the reflective layer C reflects light at all the incident angles. A multilayer film made up of $SiO_2$ and $TiO_2$ was used as the reflective layer C, and the reflective layer in which multilayer films of which the center wavelengths of the reflection bands were respectively 580 nm, 670 nm, and 760 nm were laminated was used. The film thicknesses of $SiO_2$ and $TiO_2$ are 100 nm and 58 nm, 116 nm and 67 nm, and 131 nm and 76 nm. The number of repetitions of each band is five, and the total film thickness of the reflective layer is 2.7 μm. The reflective layer C is formed on a quartz substrate 2-30 as the reflective layer 2-31 by an ion beam deposition method.

In addition to the reflective layer C of this example, provided on the lower surface of the wavelength conversion layer, a reflective layer (reflective layer A or reflective layer B) that reflects blue light and transmits wavelength converted light may be provided on the upper surface. In this case, blue light is trapped inside the wavelength conversion layers, so the wavelength conversion efficiency further improves. The reflective layer A is a reflective layer that reflects blue light and transmits green light and red light. The reflective layer B is a reflective layer that reflects blue light and transmits red light. As for the reflective layer A, a multilayer film was formed as a reflective layer 31 by, where an alternate laminate of $SiO_2$ with a film thickness of 69 nm and $TiO_2$ with a film thickness of 40 nm was defined as a unit, repeatedly laminating the laminate 10 times such that the center wavelength of a reflection band was 400 nm. As for the reflective layer B, a multilayer film was formed as a reflective layer 2-31 by, where an alternate laminate of $SiO_2$ with a film thickness of 81 nm and $TiO_2$ with a film thickness of 47 nm was defined as a unit, repeatedly laminating the laminate 10 times such that the center wavelength of a reflection band was 470 nm.

The reflective layer C, the reflective layer A, and the reflective layer B each were formed on the quartz substrate 2-30 as the reflective layers 2-31 by an ion beam deposition method.

A low refractive index layer was prepared by using hollow silica particles. For preparation of a coating solution, THRULYA 4110 (dispersion medium: IPA, the solid content concentration of silica: 20.5 percent by mass, the number mean particle diameter of one hollow particle: 60 nm, the voidage of one hollow particle: 45%, and the refractive index of one hollow particle: 1.25) produced by JGC Catalysts and Chemicals Ltd., was used. Then, a coating solution prepared such that the solid content concentration of silica was 6.0 percent by mass was used. The coating solution was applied to the reflective layer 2-31 and subjected to rotation for 10 seconds with a rotation speed of 1000 rpm by a spin coating method to form a low refractive index layer 2-32 with a thickness of 1.0 μm.

Subsequently, a resin portion 2-33 was formed on the low refractive index layer 2-32. The same resin as the wavelength conversion layer without phosphor particles was used for the resin portion. A material in which 3 wt % of 2,4,6-trimethylbenzoyl)phosphine oxide was contained in benzyl acrylate as a photopolymerization initiator was used as the resin. The resin was applied onto the low refractive index layer 2-32 and subjected to rotation for 10 seconds with a rotation speed of 1000 rpm by a spin coating method to form a film. The resin was cured by applying UV light with an illuminance of 15 $mW/cm^2$ for 30 seconds with a UV lamp (EX250, HOYA) to prepare the resin portion 2-33. The thickness of the resin portion 2-33 was 10 μm.

By changing forming conditions of the low refractive index layer, Configuration 2-1 to Configuration 2-5 with different refractive indexes of the low refractive index layer in the range of 1.10 to 1.30 and Configuration 2-6 with no low refractive index layer were formed on the reflective layer C as shown in Table 2-1.

By changing forming conditions of the low refractive index layer with the same process, the low refractive index layers as shown in Table 2-2 were formed on the reflective layer A and the reflective layer B. Specifically, Configuration 1-1 to Configuration 1-5 and Configuration 1-7 to Configuration 1-11 with different refractive indexes of the low refractive index layer in the range of 1.10 to 1.30 and Configuration 1-6 and Configuration 1-12 with no low refractive index layer were prepared.

Evaluation of Transmittance

Reflective Layer C

FIGS. 2-8, 2-9, and 2-10 respectively show the angle dependence of the reflectance of the existing configuration in which the reflective layer C has no low refractive index layer (Configuration 2-6) and the angle dependence of the reflectance of the configuration of the present example in which the reflective layer C has a low refractive index layer with a refractive index of 1.15 (Configuration 2-2) for a wavelength of 460 nm, a wavelength of 530 nm, and a wavelength of 630 nm.

Initially, for blue light shown in FIG. 2-8, with the existing configuration with no low refractive index layer, the reflectance significantly decreased at an incident angle larger than or equal to 50 degrees. Light that is reflected on the upper surface of the wavelength conversion layer and returned to the blue light emitting element side, when the light enters the reflective layer again, contains a large amount of component that enters at a high angle larger than or equal to 50 degrees due to light scattering caused by the wavelength conversion layer or multiple reflection in the element. Thus, with the existing configuration with no low refractive index layer, blue light leaks to the blue light emitting element. With the configuration of the present example with a low refractive index layer, light with a high angle larger than or equal to 50 degrees can be reflected, and blue light that enters the reflective layer again can be reflected again and returned to the wavelength conversion layer side, so the wavelength conversion efficiency improves.

For green light shown in FIG. 2-9, with the existing configuration with no low refractive index layer, the reflectance significantly decreases at an incident angle larger than or equal to 50 degrees, and wavelength converted light leaks to the blue light emitting element to disappear, so the wavelength conversion efficiency decreases. With the configuration of the present example with a low refractive index layer, light with a high angle larger than or equal to 50 degrees can be reflected, so the wavelength conversion efficiency improves. The same also applies to red light shown in FIG. 2-10. Wavelength converted light (green light or red light) radiates isotropically, so there is a large amount of high angle incident component in light that enters the reflective layer C. For this reason, with the configuration of the present example in which the reflectance is increased at a high angle larger than or equal to 50 degrees, almost the entire part of half of light that is radiated to the excitation light incident side can be reflected and extracted to a radiation side.

For the reflective layers of Configuration 2-1 to Configuration 2-6, the angle dependence of reflectance was measured, and an all-angle mean reflectance $R_{int}$ was calculated. Blue light contains a large amount of component that enters the reflective layer in a wide angle because of the influence of light scattering inside the wavelength conversion layer and multiple reflection and total reflection inside the light emitting element. Wavelength converted light contains a large amount of light component that enters the reflective layer at a wide angle because the wavelength converted light radiates isotropically. In consideration of the above, this index is used as a standard value to evaluate the reflectance and transmittance at each wavelength. An all-angle mean transmittance $T_{int}$ can be calculated from the relationship $T_{int}=1-R_{int}$. In the expression 2-(3), R(θ) denotes an incident angle distribution of reflectance. However, for blue light, to evaluate low angle incidence and high angle incidence separately, an all-angle mean reflectance was obtained separately for zero degrees to 30 degrees and 30 degrees to 90 degrees. Evaluation on reflectance was performed by using an ultraviolet visible near-infrared spectrophotometer "UV-3600" (made by Shimadzu Corporation) equipped with an integrating sphere attachment "ISR-240A" (made by Shimadzu Corporation).

$$R_{int} = \frac{\int_0^{\pi/2} R(\theta)\sin\theta d\theta}{\int_0^{\pi/2} \sin\theta d\theta} \quad \text{2-(3)}$$

Measurement results are shown in Table 2-1. For 460 nm blue light, in comparison with the configuration with no low refractive index layer (Configuration 2-6), when the low refractive index layer was provided, an all-angle mean reflectance at an angle of 30 degrees to 90 degrees improved, and, particularly, the reflectance of incident light at a high angle larger than or equal to 50 degrees improved (FIG. 2-8). As the refractive index of the low refractive index layer decreases, the reflectance increases, and, when the refractive index of the low refractive index layer is lower than or equal to 1.30, the all-angle mean reflectance is higher than or equal to 89%. When the refractive index of the low refractive index layer is 1.15, the all-angle mean reflectance is higher than or equal to 95%, and blue light (excitation light) is efficiently usable.

For 530 nm green light, in comparison with the configuration with no low refractive index layer (Configuration 2-6), when the low refractive index layer was provided, an all-angle mean reflectance improved, and, particularly, the reflectance of incident light at a high angle larger than or equal to 50 degrees improved (FIG. 2-9). As the refractive index of the low refractive index layer decreases, the reflectance increases, and, when the refractive index of the low refractive index layer is lower than or equal to 1.30, the all-angle mean reflectance is higher than or equal to 93%. When the refractive index of the low refractive index layer is 1.15, the all-angle mean reflectance is higher than or equal to 98%, and green light is efficiently extracted.

For 630 nm red light, in comparison with the configuration with no low refractive index layer (Configuration 2-6), when the low refractive index layer was provided, an all-angle mean reflectance improved, and, particularly, the reflectance of incident light at a high angle larger than or equal to 50 degrees improved (FIG. 2-10). As the refractive index of the low refractive index layer decreases, the reflectance increases, and, when the refractive index of the low refractive index layer is lower than or equal to 1.30, the all-angle mean reflectance is higher than or equal to 90%. When the refractive index of the low refractive index layer is 1.15, the all-angle mean reflectance is higher than or equal to 97%, and red light is efficiently extracted.

Reflective Layer A and Reflective Layer B

Measurement results of the all-angle mean transmittance are shown in Table 2-2. In any one of the reflective layer A and the reflective layer B, in comparison with the configuration with no low refractive index layer (Configuration 1-6 or Configuration 1-12), when the low refractive index layer was provided, the all-angle mean transmittance decreased, and it became difficult to transmit 460 nm blue excitation light. As the refractive index of the low refractive index layer decreases, the advantageous effect increases. In the reflective layer A, when the refractive index of the low refractive index layer is 1.30, the all-angle mean transmittance is lower than or equal to 32%, and, when the refractive index of the low refractive index layer is 1.15, the all-angle mean transmittance is lower than or equal to 20%. Therefore, blue excitation light is efficiently usable. In the reflective layer B, when the refractive index of the low refractive index layer is 1.30, the all-angle mean transmittance is lower than or equal to 15%, and, when the refractive index of the low refractive index layer is 1.15, the all-angle mean transmittance is lower than or equal to 7%. Therefore, blue excitation light is efficiently usable.

TABLE 2-1

| CONFIGURATION | REFLECTIVE LAYER | REFRACTIVE INDEX OF LOW INDEX LAYER | ALL-ANGLE MEAN REFLECTANCE FOR 460 nm IN RANGE OF 0° TO 30° | ALL-ANGLE MEAN REFLECTANCE FOR 460 nm IN RANGE OF 30° TO 90° | ALL-ANGLE MEAN REFLECTANCE FOR 530 nm | ALL-ANGLE MEAN REFLECTANCE FOR 630 nm |
|---|---|---|---|---|---|---|
| 2-1 | C | 1.10 | 47.3% | 97.3% | 99.2% | 99.1% |
| 2-2 | C | 1.15 | 50.5% | 96.6% | 98.7% | 97.7% |
| 2-3 | C | 1.20 | 51.3% | 95.6% | 98.1% | 96.1% |
| 2-4 | C | 1.25 | 51.2% | 92.8% | 95.9% | 93.6% |
| 2-5 | C | 1.30 | 51.2% | 89.2% | 93.3% | 90.6% |
| 2-6 | C | NOT PROVIDED | 53.5% | 85.9% | 81.7% | 76.1% |

TABLE 2-2

| CONFIGU-RATION | REFLECTIVE LAYER | REFRACTIVE INDEX OF LOW REFRACTIVE INDEX LAYER | ALL-ANGLE MEAN TRANSMITTANCE (%) FOR 460 nm |
|---|---|---|---|
| 1-1 | A | 1.10 | 16.2% |
| 1-2 | A | 1.15 | 19.8% |
| 1-3 | A | 1.20 | 22.9% |
| 1-4 | A | 1.25 | 26.6% |
| 1-5 | A | 1.30 | 31.2% |
| 1-6 | A | NOT PROVIDED | 51.2% |
| 1-7 | B | 1.10 | 4.8% |
| 1-8 | B | 1.15 | 6.5% |
| 1-9 | B | 1.20 | 8.7% |
| 1-10 | B | 1.25 | 11.3% |
| 1-11 | B | 1.30 | 14.3% |
| 1-12 | B | NOT PROVIDED | 28.3% |

Preparation of Display Element

The first wavelength conversion layer (green wavelength conversion layer) and the second wavelength conversion layer (red wavelength conversion layer) were prepared by containing quantum dots and light scattering particles in the resin portion. The UV curing resin was 57 wt % of benzyl acrylate, the photopolymerization initiator was 3 wt % of 2,4,6-trimethylbenzoyl)phosphine oxide, the light scattering particles were 20 wt % of titanium oxide, and the phosphor particles were 20 wt % of InP/ZnS quantum dots. Through a similar process to preparation of the reflective layer, the refractive index layer with a refractive index of 1.10 was formed on the reflective layer C to prepare the reflective layer of Configuration 2-1. The wavelength conversion layer with a thickness of 10 μm was formed thereon to prepare the green wavelength conversion layer and the red wavelength conversion layer. Furthermore, the optical member with a thickness of 50 μm was formed as a display element. Separately, a resin portion that does not contain quantum dots and that contains only 20 wt % of titanium oxide as light scattering particles was formed with a thickness of 10 μm as the resin portion of the blue sub-pixel region. At this time, the composition of each of the UV curing resin and photo-polymerization initiator of the resin portion was the same as those of the green wavelength conversion layer and the red wavelength conversion layer. Furthermore, the optical member with a thickness of 50 μm was formed as a display element. The reason why the display element with only the blue sub-pixel region is separately prepared is to evaluate only the blue sub-pixel region by eliminating the influence of leakage of blue excitation light from the green wavelength conversion layer and the red wavelength conversion layer.

Example 2-2

Except the reflective layer C was Configuration 2-2, the display element was similarly prepared as in the case of Example 2-1.

Example 2-3

Except the reflective layer C was Configuration 2-3, the display element was similarly prepared as in the case of Example 2-1.

Example 2-4

Except the reflective layer C was Configuration 2-4, the display element was similarly prepared as in the case of Example 2-1.

Example 2-5

Except the reflective layer C was Configuration 2-5, the display element was similarly prepared as in the case of Example 2-1.

Example 2-6

Except that the reflective layer C was Configuration 2-2 and the reflective layer provided on the upper surface of each of the green wavelength conversion layer and the red wavelength conversion layer was Configuration 1-1, the display element was similarly prepared as in the case of Example 2-1.

Example 2-7

Except that the reflective layer C was Configuration 2-2 and the reflective layer provided on the upper surface of each of the green wavelength conversion layer and the red wavelength conversion layer was Configuration 1-2, the display element was similarly prepared as in the case of Example 2-1.

Example 2-8

Except that the reflective layer C was Configuration 2-2 and the reflective layer provided on the upper surface of each of the green wavelength conversion layer and the red wavelength conversion layer was Configuration 1-3, the display element was similarly prepared as in the case of Example 2-1.

Example 2-9

Except that the reflective layer C was Configuration 2-2 and the reflective layer provided on the upper surface of each of the green wavelength conversion layer and the red wavelength conversion layer was Configuration 1-4, the display element was similarly prepared as in the case of Example 2-1.

Example 2-10

Except that the reflective layer C was Configuration 2-2 and the reflective layer provided on the upper surface of each of the green wavelength conversion layer and the red wavelength conversion layer was Configuration 1-5, the display element was similarly prepared as in the case of Example 2-1.

Example 2-11

Except that the reflective layer C was Configuration 2-2, the reflective layer provided on the upper surface of the green wavelength conversion layer was Configuration 1-2, and the reflective layer provided on the upper surface of the red wavelength conversion layer was Configuration 1-7, the display element was similarly prepared as in the case of Example 2-1.

Example 2-12

Except that the reflective layer C was Configuration 2-2, the reflective layer provided on the upper surface of the green wavelength conversion layer was Configuration 1-2, and the reflective layer provided on the upper surface of the red wavelength conversion layer was Configuration 1-8, the display element was similarly prepared as in the case of Example 2-1.

Example 2-13

Except that the reflective layer C was Configuration 2-2, the reflective layer provided on the upper surface of the green wavelength conversion layer was Configuration 1-2, and the reflective layer provided on the upper surface of the red wavelength conversion layer was Configuration 1-9, the display element was similarly prepared as in the case of Example 2-1.

Example 2-14

Except that the reflective layer C was Configuration 2-2, the reflective layer provided on the upper surface of the green wavelength conversion layer was Configuration 1-2, and the reflective layer provided on the upper surface of the red wavelength conversion layer was Configuration 1-10, the display element was similarly prepared as in the case of Example 2-1.

Example 2-15

Except that the reflective layer C was Configuration 2-2, the reflective layer provided on the upper surface of the green wavelength conversion layer was Configuration 1-2, and the reflective layer provided on the upper surface of the red wavelength conversion layer was Configuration 1-11, the display element was similarly prepared as in the case of Example 2-1.

Comparative Example 2-1

Except the reflective layer C was Configuration 2-6, the display element was similarly prepared as in the case of Example 2-1.

Comparative Example 2-2

Except that the reflective layer C was Configuration 2-6, the reflective layer provided on the upper surface of the green wavelength conversion layer was Configuration 1-6, and the reflective layer provided on the upper surface of the red wavelength conversion layer was Configuration 1-12, the display element was similarly prepared as in the case of Example 2-1.

Comparative Example 2-3

Except that no reflective layer was provided on the lower surface or upper surface of the wavelength conversion layer, the wavelength conversion layer was prepared as in the case of Example 2-1.

Evaluation of Luminance

A blue LED (peak emission wavelength: 460 nm) was used, an integrating sphere was connected to a multichannel spectrometer C10027-01 (Hamamatsu Photonics), and the integrating sphere was installed above the blue LED. A display element made up of a wavelength conversion layer was inserted between the blue LED and the integrating sphere, the blue LED was turned on, and an integral value of emission spectrum at 530 nm±30 nm of the prepared green wavelength conversion layer and an integral value of emission spectrum at 630 nm±30 nm of the prepared red wavelength conversion layer were measured as luminances. A display element made up of a blue sub-pixel region was inserted between the blue LED and the integrating sphere, the blue LED was turned on, and an integral value of spectrum at 460 nm±30 nm was measured as a luminance. Here, the luminance value of the green wavelength conversion layer, the luminance value of the red wavelength conversion layer, and the luminance value of the blue display element each are a value when the value of Comparative Example 2-1 is assumed as 100. Table 2-3 shows the luminance values of green, red, and blue. Even in any example, no reflective layer is provided on the upper surface of the resin portion of the blue sub-pixel region. When compared in the case where the reflective layer is provided only on the lower surface, the luminances of green and red improve with the configuration of the present example as compared to Comparative Example 2-1 with no low refractive index layer. When the low refractive index layer with a refractive index lower than or equal to 1.15 is used (Configuration 2-1 or Configuration 2-2), the luminances of green and red both improve by 10% or higher. The luminance of blue also improves as compared to Comparative Example 2-1 with no low refractive index layer. When the low refractive index layer with a refractive index lower than or equal to 1.15 is used (Configuration 2-1 or Configuration 2-2), the blue luminance improves by 6% or higher.

When the reflective layer is provided on each of the lower surface and the upper surface, the efficiency of use of blue light improves, so the luminances of green and red further improve. When the low refractive index layer with a refractive index lower than or equal to 1.15 is used, the luminance of green improves by 30% or higher, and the luminance of red improves by 20% or higher.

TABLE 2-3

| | | UPPER SURFACE REFLECTIVE LAYER | | | | |
|---|---|---|---|---|---|---|
| | LOWER SURFACE REFLECTIVE LAYER | FIRST WAVELENGTH CONVERSION LAYER (GREEN WAVELENGTH CONVERSION LAYER) | SECOND WAVELENGTH CONVERSION LAYER (RED WAVELENGTH CONVERSION LAYER) | GREEN LUMINANCE RELATIVE VALUE | RED LUMINANCE RELATIVE VALUE | BLUE LUMINANCE RELATIVE VALUE |
| EXAMPLE 2-1 | CONFIG-URATION 2-1 | NOT PROVIDED | NOT PROVIDED | 111 | 113 | 107 |
| EXAMPLE 2-2 | CONFIG-URATION 2-2 | NOT PROVIDED | NOT PROVIDED | 110 | 112 | 106 |

TABLE 2-3-continued

| | LOWER SURFACE REFLECTIVE LAYER | UPPER SURFACE REFLECTIVE LAYER | | GREEN LUMINANCE RELATIVE VALUE | RED LUMINANCE RELATIVE VALUE | BLUE LUMINANCE RELATIVE VALUE |
|---|---|---|---|---|---|---|
| | | FIRST WAVELENGTH CONVERSION LAYER (GREEN WAVELENGTH CONVERSION LAYER) | SECOND WAVELENGTH CONVERSION LAYER (RED WAVELENGTH CONVERSION LAYER) | | | |
| EXAMPLE 2-3 | CONFIG-URATION 2-3 | NOT PROVIDED | NOT PROVIDED | 109 | 111 | 105 |
| EXAMPLE 2-4 | CONFIG-URATION 2-4 | NOT PROVIDED | NOT PROVIDED | 108 | 110 | 104 |
| EXAMPLE 2-5 | CONFIG-URATION 2-5 | NOT PROVIDED | NOT PROVIDED | 107 | 108 | 103 |
| EXAMPLE 2-6 | CONFIG-URATION 2-2 | CONFIG-URATION 1-1 | CONFIG-URATION 1-1 | 131 | 120 | 106 |
| EXAMPLE 2-7 | CONFIG-URATION 2-2 | CONFIG-URATION 1-2 | CONFIG-URATION 1-2 | 130 | 120 | 106 |
| EXAMPLE 2-8 | CONFIG-URATION 2-2 | CONFIG-URATION 1-3 | CONFIG-URATION 1-3 | 129 | 120 | 106 |
| EXAMPLE 2-9 | CONFIG-URATION 2-2 | CONFIG-URATION 1-4 | CONFIG-URATION 1-4 | 128 | 119 | 106 |
| EXAMPLE 2-10 | CONFIG-URATION 2-2 | CONFIG-URATION 1-5 | CONFIG-URATION 1-5 | 127 | 119 | 106 |
| EXAMPLE 2-11 | CONFIG-URATION 2-2 | CONFIG-URATION 1-2 | CONFIG-URATION 1-7 | 130 | 123 | 106 |
| EXAMPLE 2-12 | CONFIG-URATION 2-2 | CONFIG-URATION 1-2 | CONFIG-URATION 1-8 | 130 | 122 | 106 |
| EXAMPLE 2-13 | CONFIG-URATION 2-2 | CONFIG-URATION 1-2 | CONFIG-URATION 1-9 | 130 | 121 | 106 |
| EXAMPLE 2-14 | CONFIG-URATION 2-2 | CONFIG-URATION 1-2 | CONFIG-URATION 1-10 | 130 | 121 | 106 |
| EXAMPLE 2-15 | CONFIG-URATION 2-2 | CONFIG-URATION 1-2 | CONFIG-URATION 1-11 | 130 | 120 | 106 |
| COM-PARATIVE EXAMPLE 2-1 | CONFIG-URATION 2-6 | NOT PROVIDED | NOT PROVIDED | 100 | 100 | 100 |
| COM-PARATIVE EXAMPLE 2-2 | CONFIG-URATION 2-6 | CONFIG-URATION 1-6 | CONFIG-URATION 1-12 | 112 | 107 | 100 |
| COM-PARATIVE EXAMPLE 2-3 | NOT PROVIDED | NOT PROVIDED | NOT PROVIDED | 58 | 57 | 58 |

Third Embodiment

Background Art of Third Embodiment

There is a technology using quantum dots that exhibit emission with a narrow peak width at half height as a technique to implement color reproducibility compatible with wide color purity and high luminous efficiency in a display element and a display apparatus that display images and. When a display element converts color with a wave-length conversion layer having quantum dots by using ultraviolet light or blue light as excitation light, the display element that achieves both color reproducibility and high luminous efficiency is implemented. A light emitting diode (LED), an organic light emitting diode (OLED), or the like can be used as a light source of excitation light. Particularly, a configuration in which a wavelength conversion layer made up of quantum dots that produce light in red and a wavelength conversion layer made up of quantum dots that illuminate in green are patterned in sub-pixels and color conversion is performed in units of pixel by using blue excitation light has been proposed. With this configuration, the size of each sub-pixel is a pitch of a few micrometers for a small display element used in an electric view finder (EVF) or the like and is a pitch of a few tens of micrometers for a large-size high-resolution television.

Here, the thickness of the wavelength conversion layer ranges from a few micrometers to 10 μm, and the aspect ratio (the ratio of height to width) depends on the size of a sub-pixel and is about 1/10 when the size of the sub-pixel is a few tens of micrometers pitch and about two to about three when the size of the sub-pixel is a few micrometers pitch. Light converted in wavelength by the wavelength conversion layer is isotropically radiated. Therefore, as the aspect ratio of the wavelength conversion layer increases, the proportion of wavelength converted light that enters the partition wall provided between the sub-pixels increases. The partition wall is often made of a member that absorbs light, so light that enters the partition wall is absorbed and becomes losses.

For this reason, a configuration in which a reflective layer that reflects light converted in wavelength (green light or red light) is disposed on the side surface of the partition wall is disclosed (Japanese Patent Laid-Open No. 2020-086461). With this configuration, the wavelength conversion efficiency is improved by reflecting wavelength converted light that enters the partition wall and extracting the wavelength converted light to the wavelength conversion portion side.

Problem of Third Embodiment

The inventors of the subject application diligently studied the configuration of Japanese Patent Laid-Open No. 2020-086461 and finally found a problem.

Particularly, it is a problem that can occur when a dielectric multilayer film with a reflectance higher than or equal to 98% is used as the reflective layer. In other words, the reflective layer made up of a dielectric multilayer film has high reflection characteristics for wavelength converted light that enters from the wavelength conversion layer at a low angle (smaller than or equal to 50 degrees) with respect to a perpendicular axis of the film surface of the dielectric multilayer film. However, when the reflective layer is in contact with a member with a high refractive index, the reflectance decreases for wavelength converted light that enters at a high angle (larger than or equal to 50 degrees) with respect to the film surface of the dielectric multilayer film, and part of wavelength converted light penetrates through. As a result, there can be a problem that the wavelength conversion efficiency, the luminance, and the resolution decrease.

The present invention is contemplated in view of the above-described problem, and it is an object of the present invention for a display element having a sub-pixel region including a wavelength conversion layer that converts the wavelength of excitation light to reduce leakage of excitation light in the sub-pixel region.

Solution to Problem in Third Embodiment

A display element according to a third embodiment includes a light source portion that emits excitation light, a wavelength conversion portion that converts the excitation light to light with a wavelength longer than a wavelength of the excitation light, and an optical member that transmits light converted by the wavelength conversion portion, in this order. The wavelength conversion portion includes a first wavelength conversion layer that converts the excitation light to first wavelength converted light with a wavelength longer than the wavelength of the excitation light, and a second wavelength conversion layer that converts the excitation light to second wavelength converted light with a wavelength longer than the wavelength of the first wavelength converted light. The display element is a component of a pixel that includes a green sub-pixel region including the first wavelength conversion layer, a red sub-pixel region including the second wavelength conversion layer, and a blue sub-pixel region not including the first wavelength conversion layer or the second wavelength conversion layer. The display element further includes a partition wall between the first wavelength conversion layer and the second wavelength conversion layer. The display element further includes a reflective layer and a low refractive index layer that reflect light with a wavelength converted by the wavelength conversion portion in a region between the partition wall and at least any one of the first wavelength conversion layer and the second wavelength conversion layer. A surface of the low refractive index layer adjacent to the wavelength conversion portion is an interface at which the low refractive index layer is in contact with a region having a higher refractive index than the low refractive index layer.

Advantageous Effects in Third Embodiment

With the display element according to the third embodiment, it is possible for the display element having a sub-pixel region including a wavelength conversion layer that converts the wavelength of excitation light to reduce leakage of wavelength converted light in the sub-pixel region. As a result, it is possible to provide a display element and a display apparatus capable of implementing a high luminance, a high wavelength conversion efficiency, and a high resolution.

Hereinafter, a display element according to the third embodiment of the present invention will be described in detail; however, the present invention is not limited thereto.

Configuration

Initially, the configuration of a display element according to the present embodiment will be described with reference to FIGS. 3-1A to 3-3. FIG. 3-1A is a plan view that shows a configuration in which a plurality of display elements (pixels) 3-10 according to the present embodiment is arranged in a two-dimensional array. Other than the array as shown in FIG. 3-1A, arrangement of the display elements (pixels) can be changed as needed according to uses. FIG. 3-1B is an enlarged plan view of one of the display elements (pixels) 3-10 shown in FIG. 3-1A. The display element 3-10 has a green sub-pixel region 3-15, a red sub-pixel region 3-16, and a blue sub-pixel region 3-17. FIG. 3-2 is a sectional view taken along the line III-II-III-II in FIG. 3-1B. FIG. 3-3 is a sectional view similar to that of FIG. 3-2 but differs in the location of a reflective layer 3-21 (described later) and the location of a low refractive index layer 3-20 (described later). In the present embodiment, the order of the pixel regions in an x-axis direction is not limited. As shown in FIG. 3-1A, other than the configuration in which the sub-pixel regions are arranged in the x-axis direction, a configuration in which three sub-pixel regions are respectively arranged at the vertexes of a triangle may be adopted.

The display element 3-10 according to the present embodiment includes a light source portion 3-11 that emits (L1, L2, L3), a wavelength conversion portion 3-50 that converts the excitation light to light (L1', L2') with a wavelength longer than the wavelength of the excitation light, and an optical member 3-22 that transmits light converted by the wavelength conversion portion 3-50, in this order. Here, the wavelength conversion portion 3-50 includes a first wavelength conversion layer 3-12 that converts excitation light (L1) to first wavelength converted light (L1') longer in wavelength than the excitation light, and a second wavelength conversion layer 3-13 that converts excitation light (L2) to second wavelength converted light (L2') longer in wavelength than the first wavelength converted light (L1').

The display element 3-10 is a pixel that includes the green sub-pixel region 3-15 including the first wavelength conversion layer 3-12, the red sub-pixel region 3-16 including the second wavelength conversion layer 3-13, and the blue sub-pixel region 3-17 not including the first wavelength conversion layer 3-12 or the second wavelength conversion layer 3-13.

A partition wall 3-18 is provided between the first wavelength conversion layer 3-12 and the second wavelength conversion layer 3-13. The partition wall 3-18 can separate the green sub-pixel region 3-15 and the red sub-pixel region 3-16 from each other. As shown in FIGS. 3-2 and 3-3, a partition wall 3-18 may be provided between the red sub-pixel region 3-16 and the blue sub-pixel region 3-17.

The reflective layer 3-21 and the low refractive index layer 3-20 that reflect light with a wavelength converted by the wavelength conversion portion 3-50 are provided in a region between the partition wall 3-18 and at least any one of the first wavelength conversion layer 3-12 and the second wavelength conversion layer 3-13. From the viewpoint of reducing penetration of wavelength converted light, as shown in FIGS. 3-2 and 3-3, the reflective layer 3-21 and the low refractive index layer 3-20 can be provided in a region (R1) between the partition wall 3-18 and the first wavelength conversion layer 3-12 and in a region (R2) between the partition wall 3-18 and the second wavelength conversion layer 3-13.

Similarly, from the viewpoint of reducing penetration of wavelength converted light, as shown in FIGS. 3-2 and 3-3, the partition wall 3-18 can be provided between the wavelength conversion portion 3-50 (the second wavelength conversion layer 3-13 in FIGS. 3-2 and 3-3) and the blue sub-pixel region 3-17. Furthermore, the reflective layer 3-21 and the low refractive index layer 3-20 can be provided between the partition wall 3-18 and the blue sub-pixel region 3-17.

FIG. 3-2 shows a configuration in which the first wavelength conversion layer 3-12 (or the second wavelength conversion layer 3-13), the low refractive index layer 3-20, the reflective layer 3-21, and the partition wall 3-18 are laminated in this order. On the other hand, as shown in FIG. 3-3, the first wavelength conversion layer 3-12 (or the second wavelength conversion layer 3-13), the reflective layer 3-21, and the partition wall 3-18 may be laminated in this order. Here, a surface (I1 or I2) of the low refractive index layer 3-20 adjacent to the wavelength conversion portion is an interface at which the low refractive index layer 3-20 is in contact with a region having a higher refractive index than the low refractive index layer 3-20. In the case of FIG. 3-2, the refractive index of the low refractive index layer 3-20 can be lower than the refractive index of any of the first wavelength conversion layer 3-12 and the second wavelength conversion layer 3-13. In the case of FIG. 3-3, the refractive index of the low refractive index layer 3-20 is lower than the refractive index of the reflective layer 3-21.

Operational Effects

In this way, in the display element 3-10 according to the present embodiment, the surface (I) of the low refractive index layer 3-20 adjacent to the wavelength conversion portion is an interface at which the low refractive index layer 3-20 is in contact with a region having a higher refractive index than the low refractive index layer 3-20. Therefore, the region shifts from a region with a high refractive index to a region with a low refractive index at the interface, so the first wavelength converted light L1' and the second wavelength converted light L2' are reflected, with the result that it is possible to reduce leakage of wavelength converted light from the green sub-pixel region or the red sub-pixel region. Particularly, wavelength converted light (first wavelength converted light or second wavelength converted light) that enters at a high angle larger than or equal to 50 degrees with respect to a perpendicular axis to the surface (I) and that has been insufficiently reflected only with the reflective layer 3-20 is totally reflected at the interface with the low refractive index layer, so it is possible to reduce leakage of wavelength converted light as compared to the existing configuration. Wavelength converted light having returned to the wavelength conversion portion 3-50 (the first wavelength conversion layer 3-12 and the second wavelength conversion layer 3-13) travels toward the optical member and is emitted outside the light emitting element 3-10. As a result, high luminance and high wavelength conversion efficiency are implemented.

When excitation light L3 is blue light, the excitation light L3 penetrates through the optical member 3-22, and blue light is emitted from the blue sub-pixel region 3-17, so a pixel that produces light in green, red, and blue is formed (FIGS. 3-2 and 3-3).

When the excitation light L3 is ultraviolet light, the wavelength conversion portion 3-50 may include a third wavelength conversion layer that converts the excitation light L3 to third wavelength converted light (L3') longer in wavelength than the excitation light and shorter in wavelength than the first wavelength converted light (L1') (all of which are not shown).

FIGS. 3-2 and 3-3 show the configuration in which the light source portion 3-11, the reflective layer 3-21, the low refractive index layer 3-20, the wavelength conversion portion 3-50, and the optical member 3-22 are laminated so as to be in contact with each other. Alternatively, another component may be provided between these elements. In this case as well, there is an interface that is in contact with a region higher in refractive index than the low refractive index layer 3-20, that is, an interface at which the region shifts from a region with a high refractive index to a region with a low refractive index, due to the above reason, so it is possible to totally reflect wavelength converted light and return the wavelength converted light to the wavelength conversion portion 3-50.

In the present embodiment, blue light is light with a maximum wavelength longer than or equal to 445 nm and shorter than or equal to 475 nm, green light is light with a maximum wavelength longer than or equal to 515 nm and shorter than or equal to 545 nm, and red light is light with a wavelength longer than or equal to 615 nm and shorter than or equal to 645 nm.

Display Element

Hereinafter, the detailed configuration of the display element according to the embodiment of the present invention will be described. FIGS. 3-4A to 3-4D are schematic sectional views that schematically show an example of the display element according to the present embodiment. In the display element according to the present embodiment, the light source portion is configured to include a plurality of light emitting elements 3-11 respectively corresponding to green, red, and blue pixel regions (3-15, 3-16, 3-17). The light emitting elements 2-11 emit blue light. In the display elements according to the present embodiment, the maximum wavelength of blue light, the maximum wavelength of green light, and the maximum wavelength of red light are respectively 460 nm, 530 nm, and 630 nm. When simply referred to the wavelength conversion layers, the wavelength conversion layers represent both the first wavelength conversion layer 3-12 and the second wavelength conversion layer 3-13.

Initially, the configuration of FIG. 3-4A will be described. The wavelength conversion portion 3-50 includes the first wavelength conversion layer 3-12 that converts blue light from the light emitting element 3-11 to first wavelength converted light (green light), the second wavelength conversion layer 3-13 that converts the blue light to second wavelength converted light (red light), and a resin portion 3-14 that transmits blue light. With such a configuration, a pixel including the green sub-pixel region 3-15, the red sub-pixel region 3-16, and the blue sub-pixel region 3-17 is formed.

Here, light scattering particles can be contained in the first wavelength conversion layer 3-12 and the second wavelength conversion layer 3-13 to improve the efficiency of use of excitation light and reduce leakage of excitation light. Titanium oxide or the like may be used as the light scattering particles. Light scattering particles are also contained in the resin portion 3-14 that will be the blue sub-pixel region 3-17 to eliminate directivity by scattering blue light that is excitation light and to expand a viewing angle. The partition wall 3-18 is provided between adjacent two of the green sub-pixel region, the red sub-pixel region, and the blue sub-pixel region to reduce leakage of light to an adjacent pixel, with the result that the sub-pixel regions are separated. The light emitting elements 3-11 are separated by an insulating material 3-19 (also referred to as bank). An electrode for supplying current to the light source portion (light emitting element) 3-11, a drive circuit for the light source portion 3-11, and the like can be provided (not shown).

In each of the green sub-pixel region 3-15 and the red sub-pixel region 3-16, the wavelength conversion layer (the first wavelength conversion layer 3-12 or the second wavelength conversion layer 3-13), the low refractive index layer 3-20, the reflective layer 3-21, and the partition wall 3-18 are provided in this order. Specifically, the reflective layer 3-21 is formed on the partition wall 3-18, and the low refractive index layer 3-20 is provided adjacent to the reflective layer 3-21. With the partition wall 3-18, it is possible to increase the efficiency of extracting light converted by each wavelength conversion layer, and it is possible to further increase the efficiency of extracting light by providing the reflective layer 3-21 on the partition wall 3-18. The partition wall 3-18 may be made up of a black matrix for absorbing light. With this configuration, it is possible to prevent crosstalk between the wavelength conversion layers.

The width of the wavelength conversion layer at an upper part and the width at a lower part may be different from each other. With a sectional shape that widens toward the upper part, the efficiency of extracting light is increased.

A metal reflective layer or a dielectric multilayer film may be used as the reflective layer 3-21. Hereinafter, a reflective layer provided on the partition wall is referred to as reflective layer D.

Figures 1, 2, 3, 4, 4A:
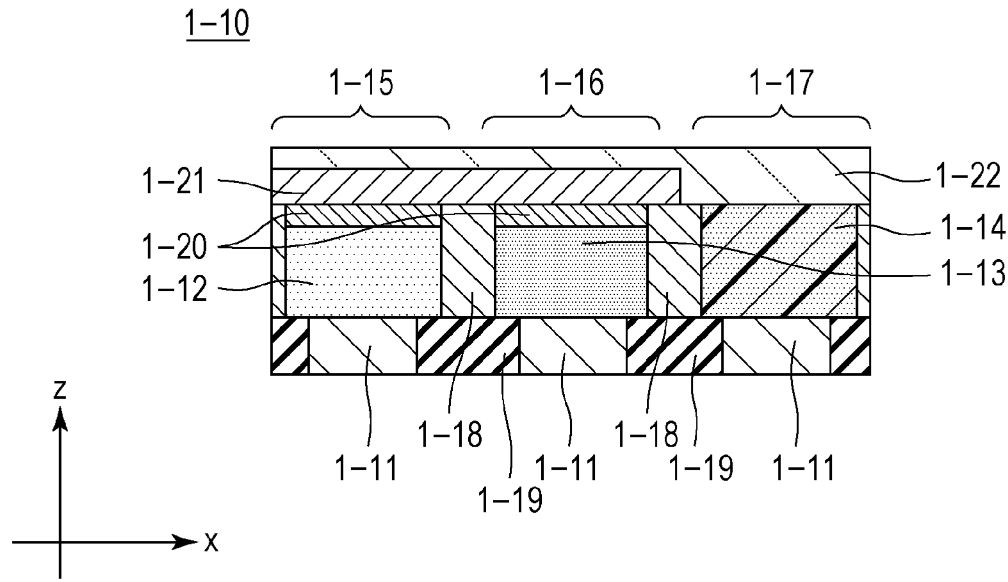
Figures 1, 2, 3, 4, 4B:
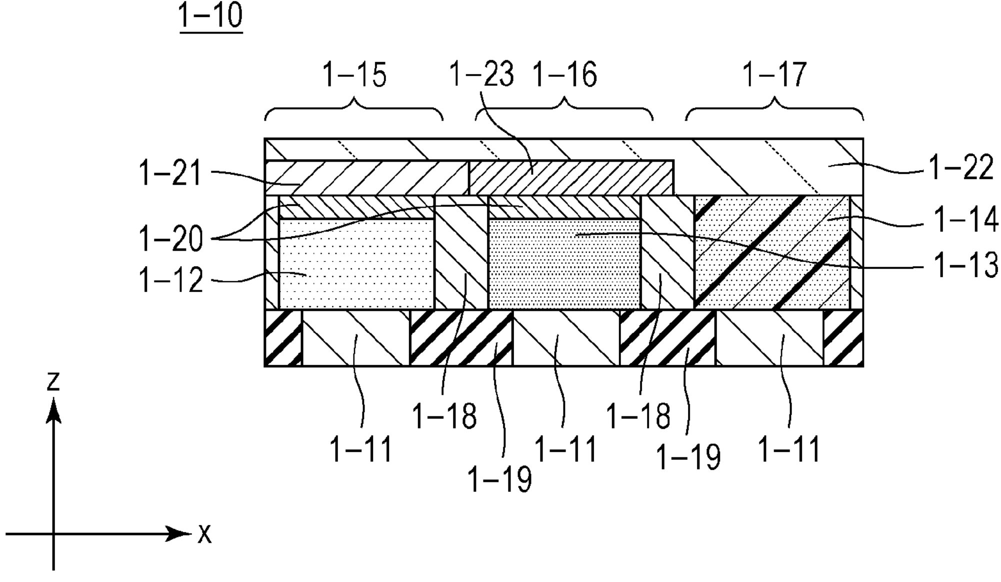
Figures 1, 2, 3, 4, 5, 5A:
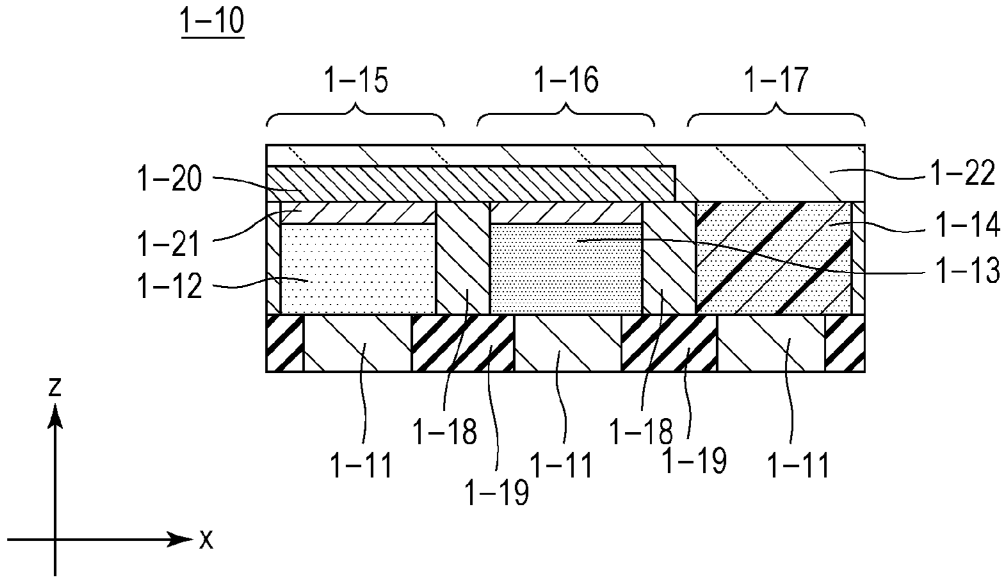
Figures 1, 2, 3, 4, 5, 5B:
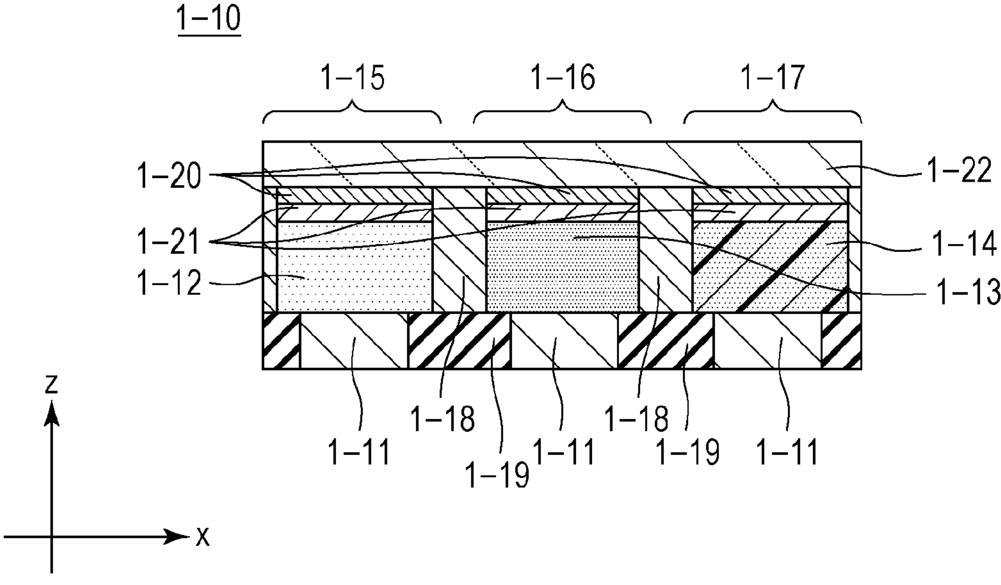
Figures 1, 2, 3, 4, 5, 6, 6A:
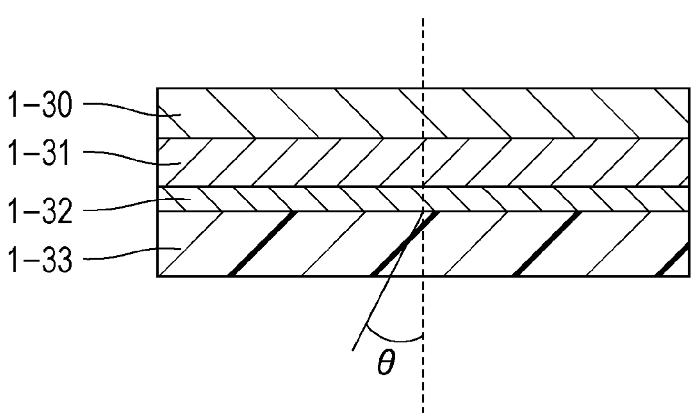
Figures 1, 2, 3, 4, 5, 6, 6B:
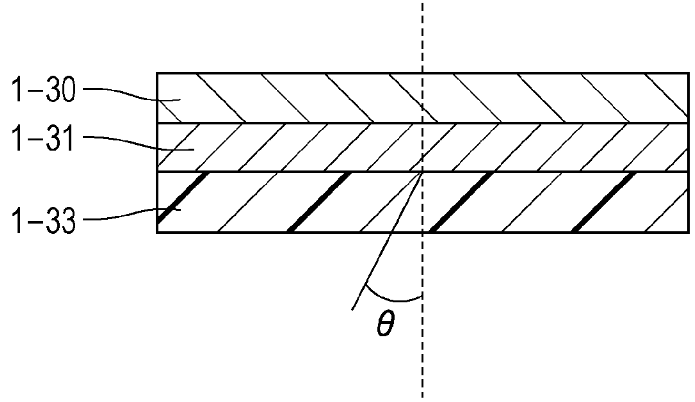
Figures 1, 2, 3, 4, 5, 6, 7:
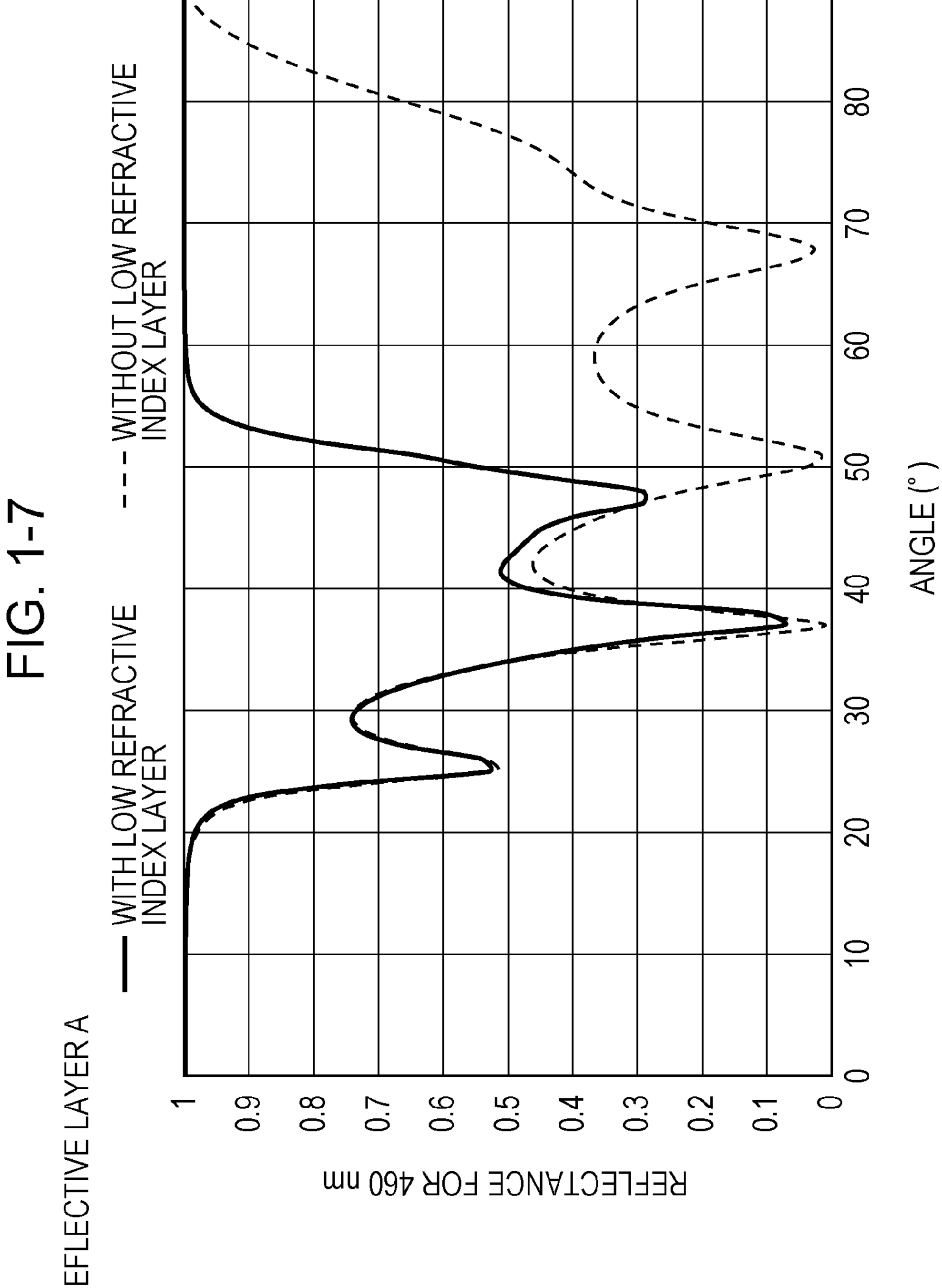
Figures 1, 2, 3, 4, 5, 6, 7, 8:
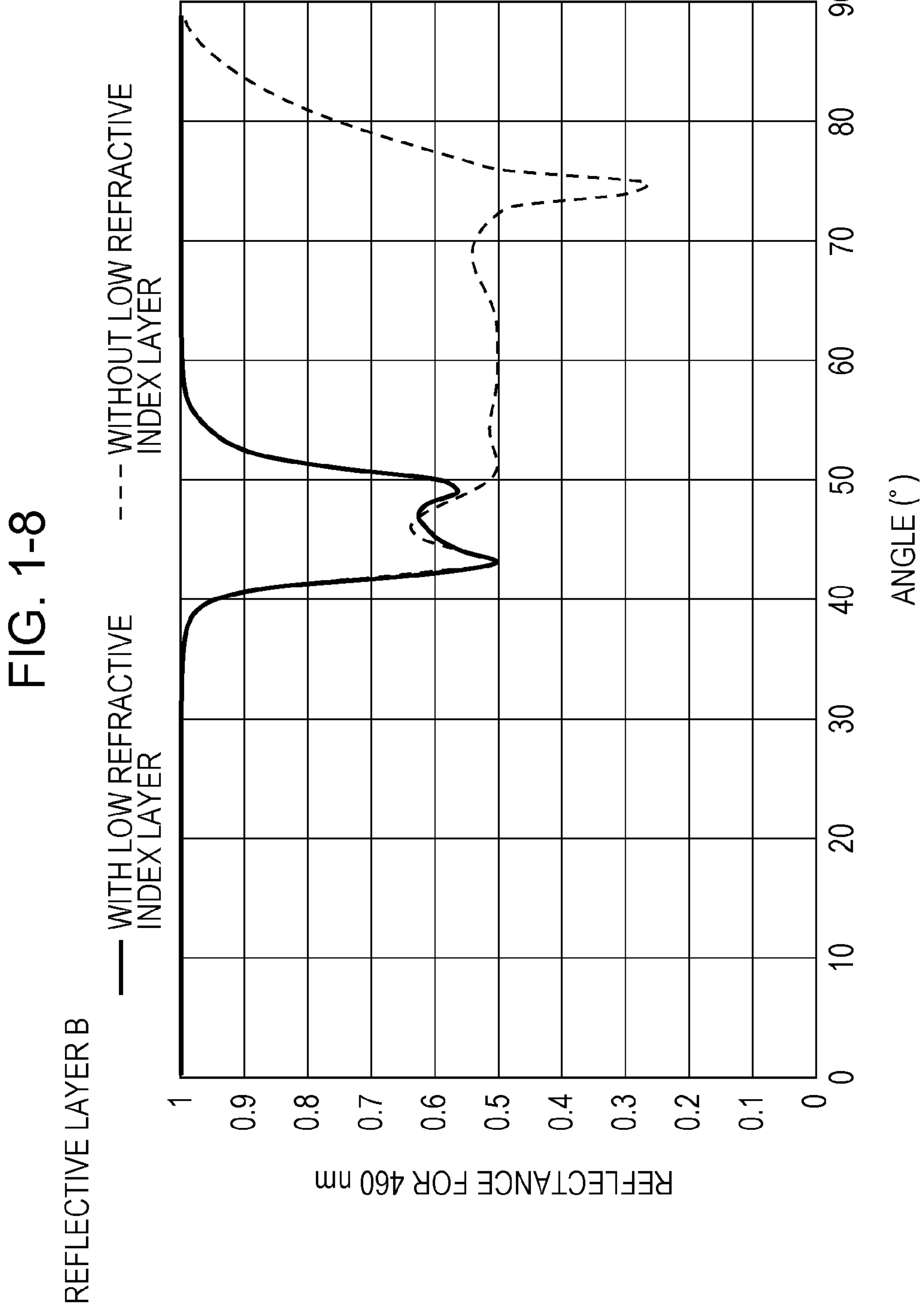

The same applies to FIG. 3-4B of which arrangement of the low refractive index layer 3-20 and the reflective layer 3-21 is inverted from that of FIG. 3-4A.

Figures 1A, 2:
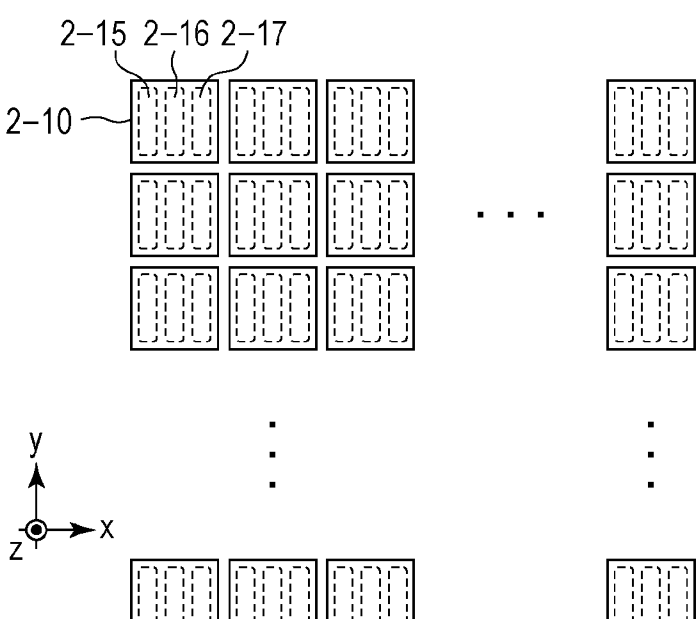
Figures 1B, 2:
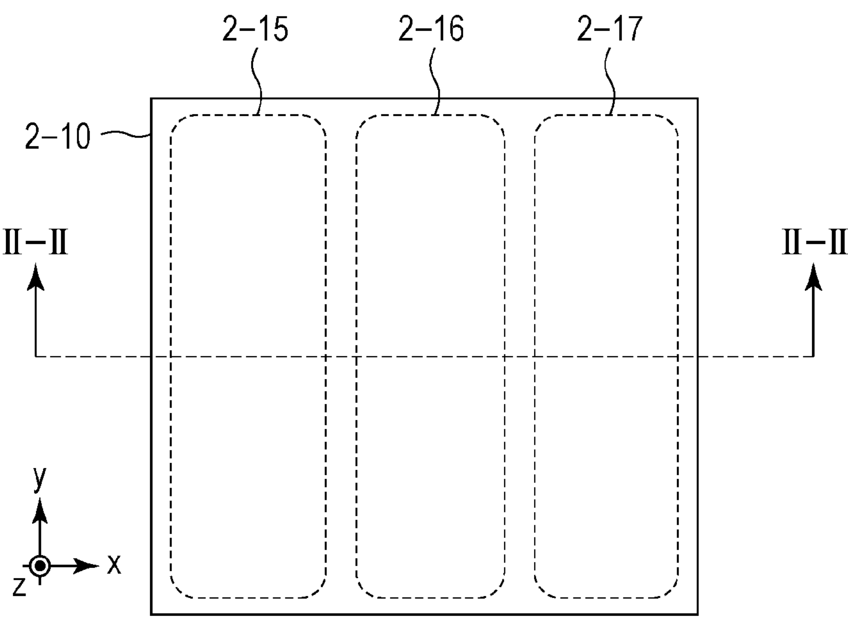
Figure 2:
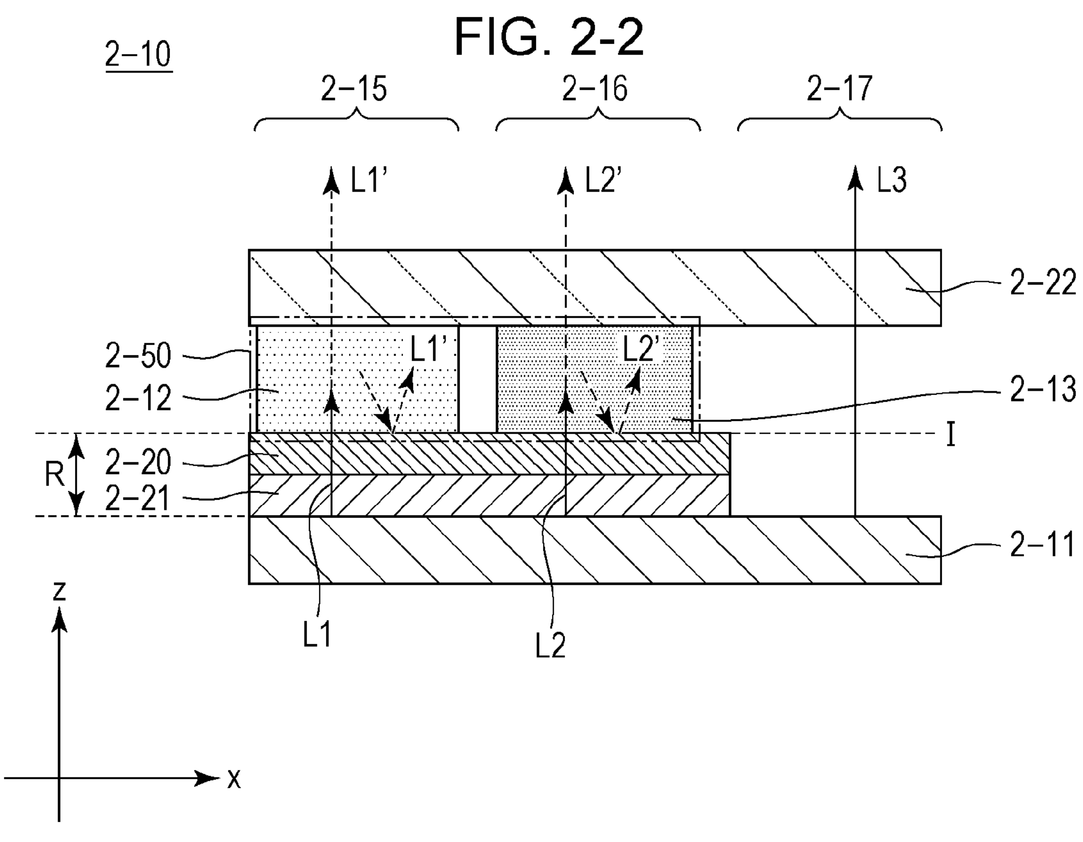
Figures 2, 3:
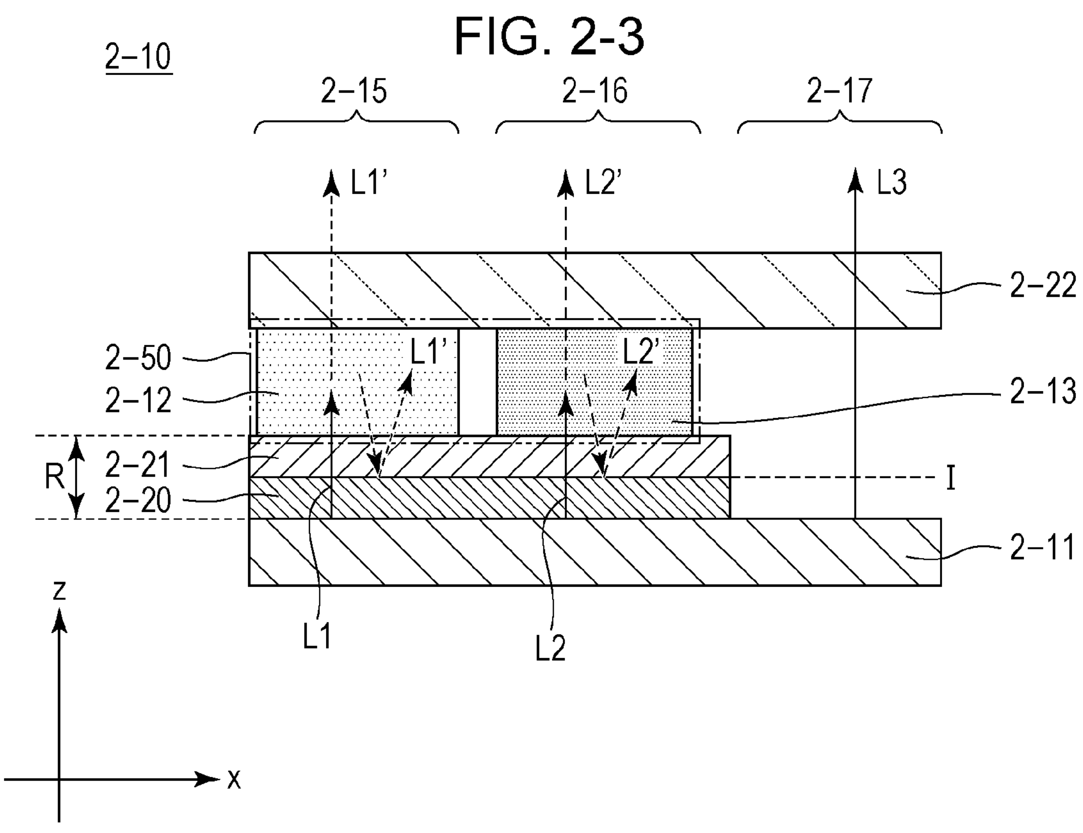
Figures 2, 3, 4, 4A:
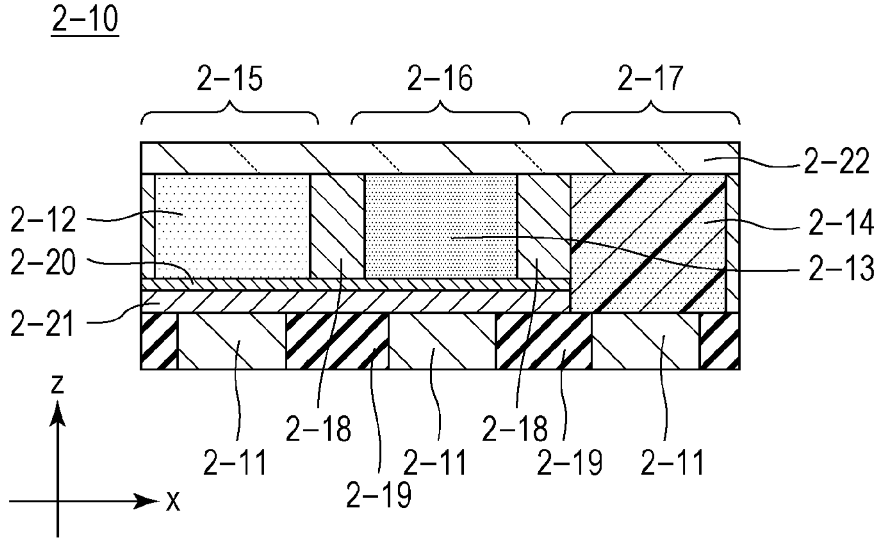
Figures 2, 3, 4, 4B:
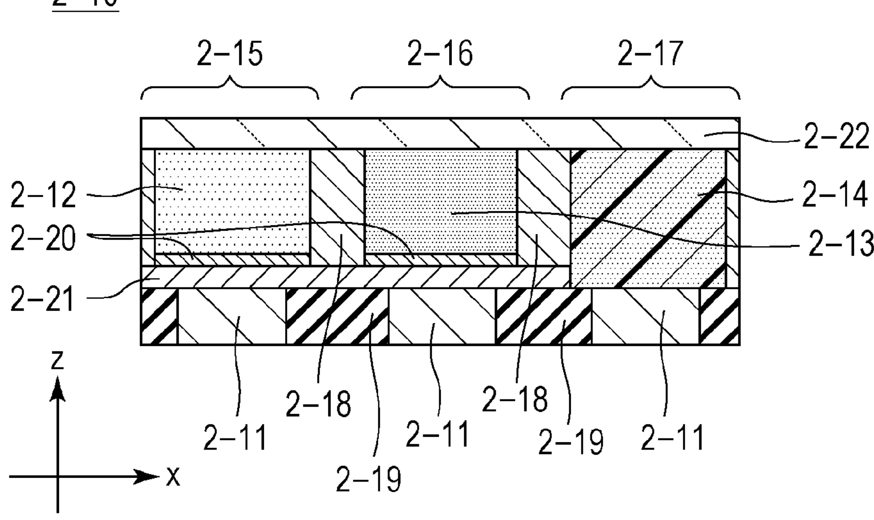
Figures 2, 3, 4, 4C:
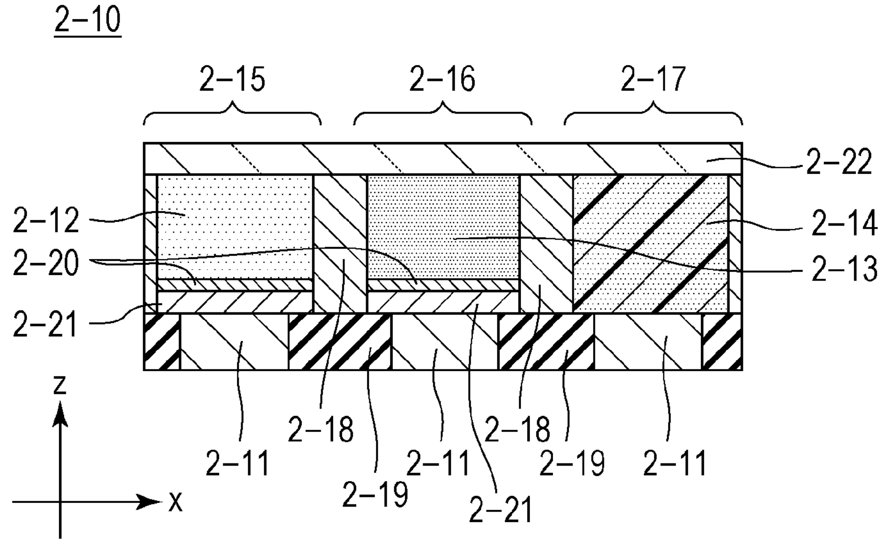
Figures 2, 3, 4, 4D:
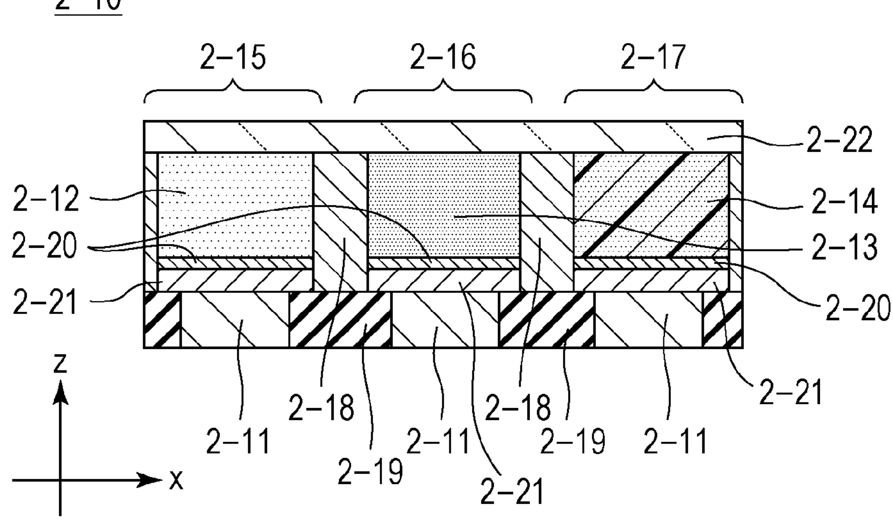
Figures 2, 3, 4, 5, 5A:
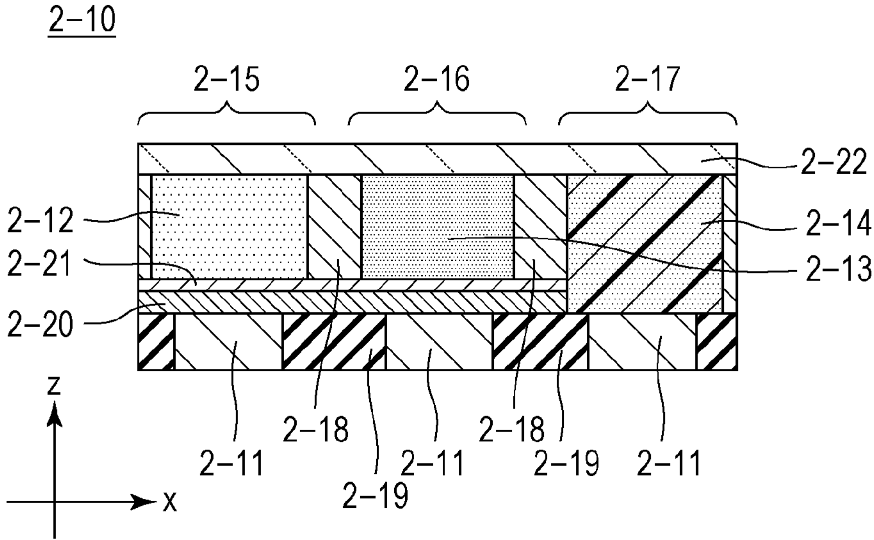
Figures 2, 3, 4, 5, 5B:
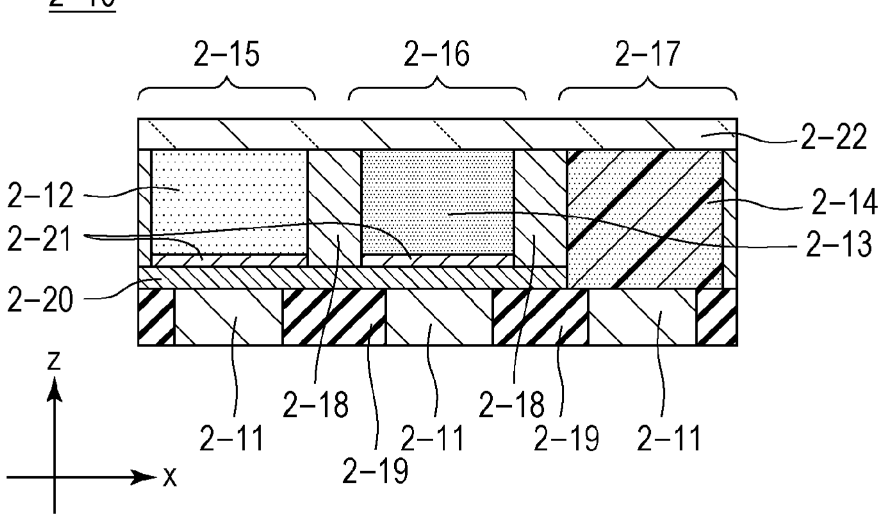
Figures 2, 3, 4, 5, 5C:
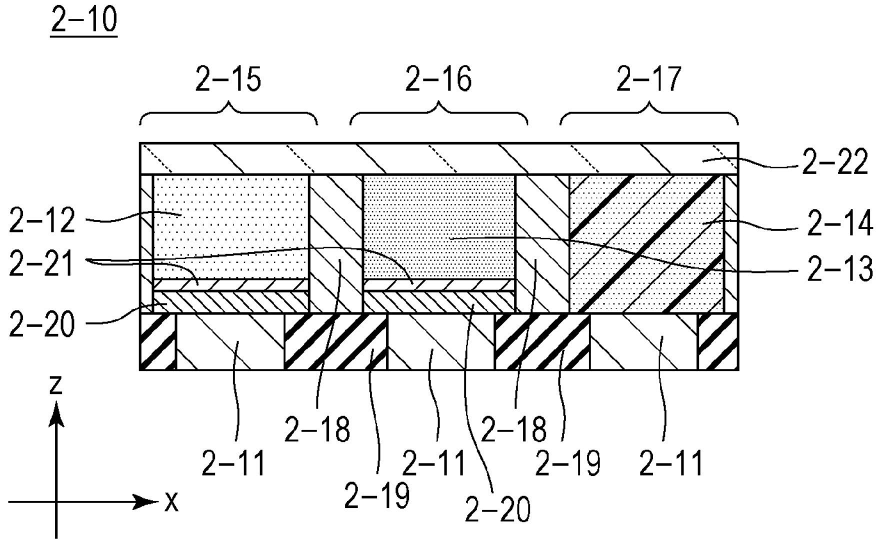
Figures 2, 3, 4, 5, 5D:
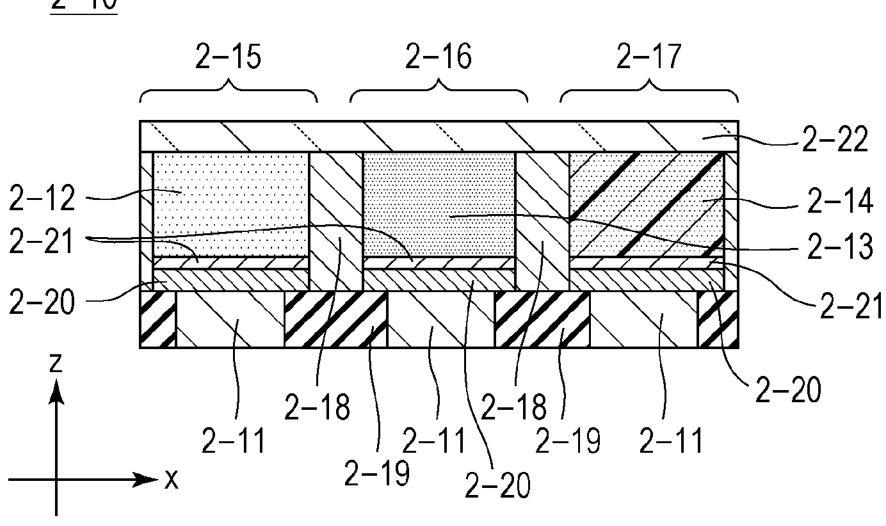
Figures 2, 3, 4, 5, 6, 7, 7A:
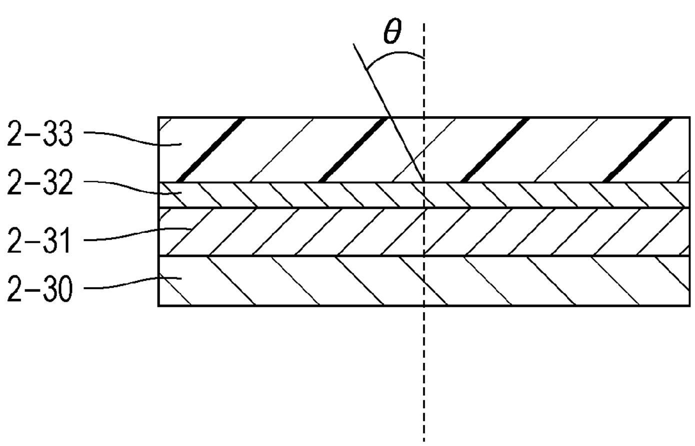
Figures 2, 3, 4, 5, 6, 7, 7B:
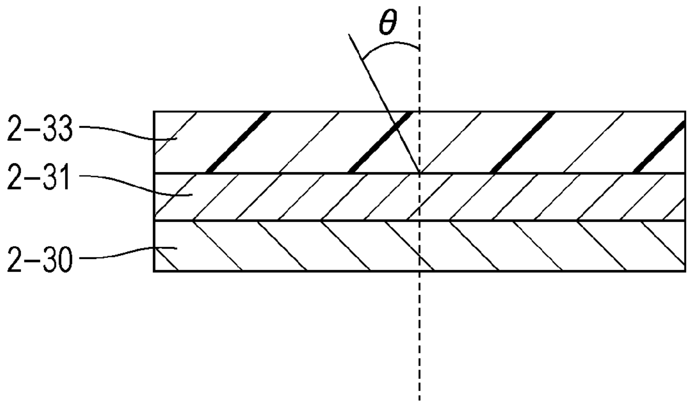
Figures 2, 3, 4, 5, 6, 7, 8:
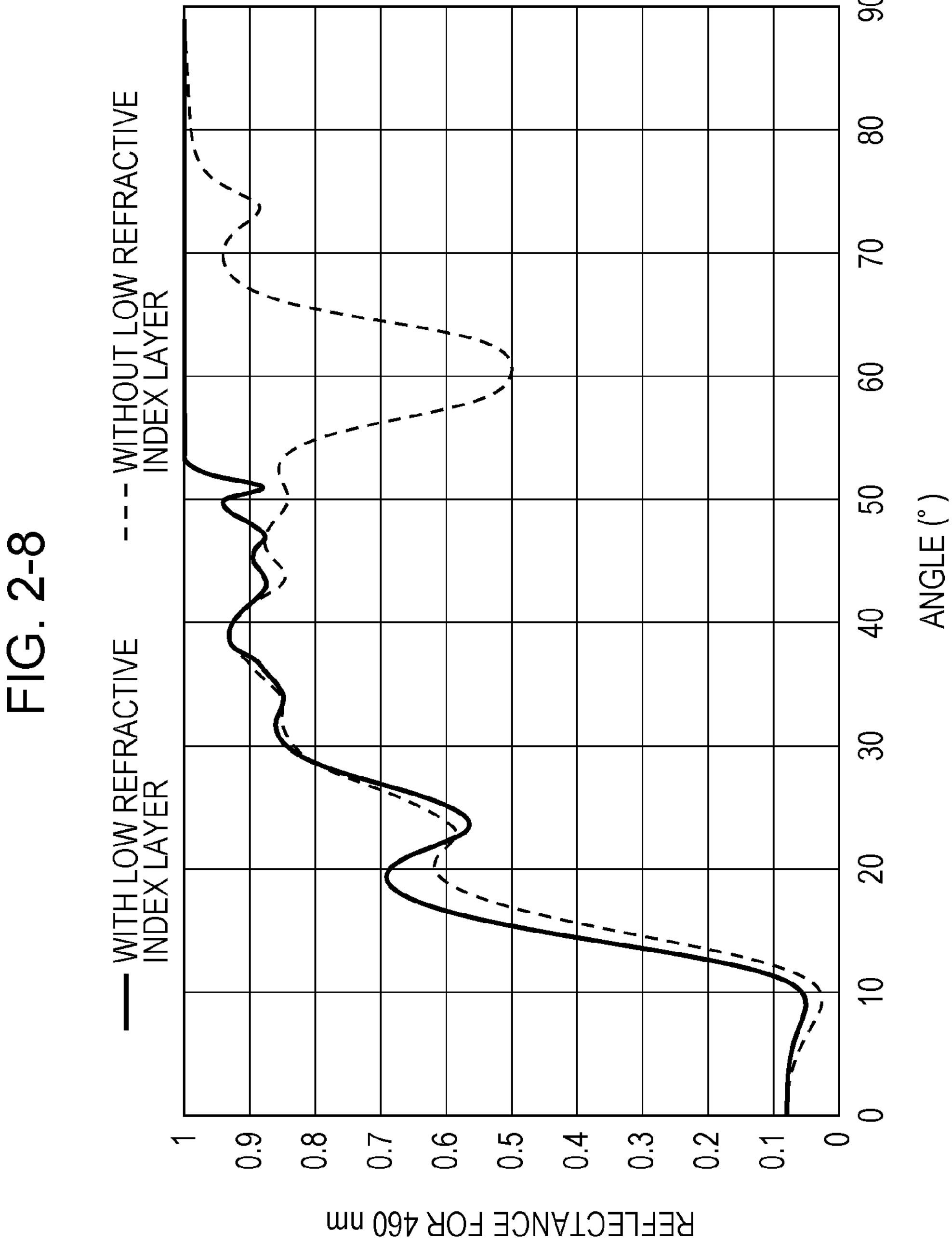
Figures 2, 3, 4, 5, 6, 7, 8, 9:
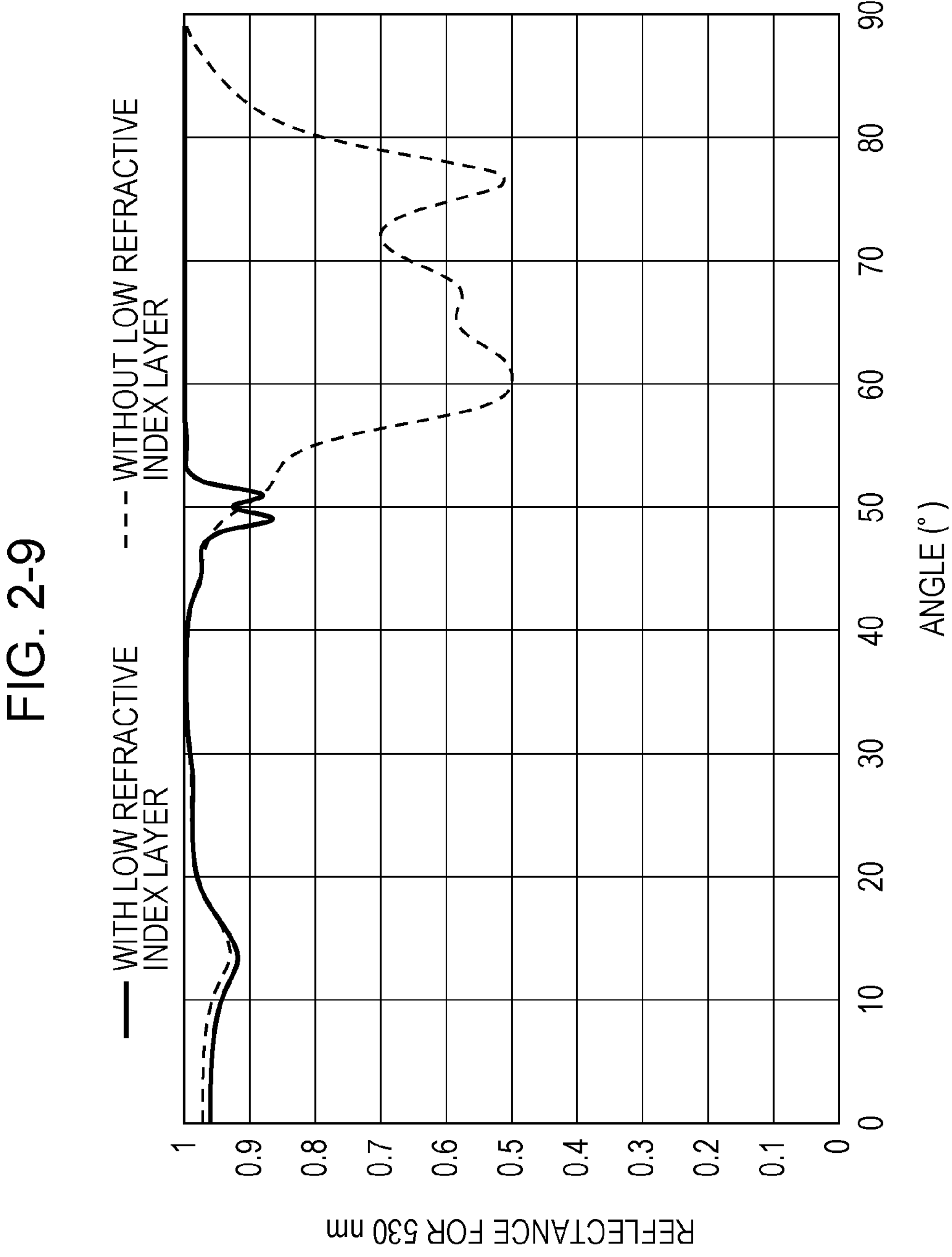
Figures 2, 3, 4, 5, 6, 7, 8, 9, 10:
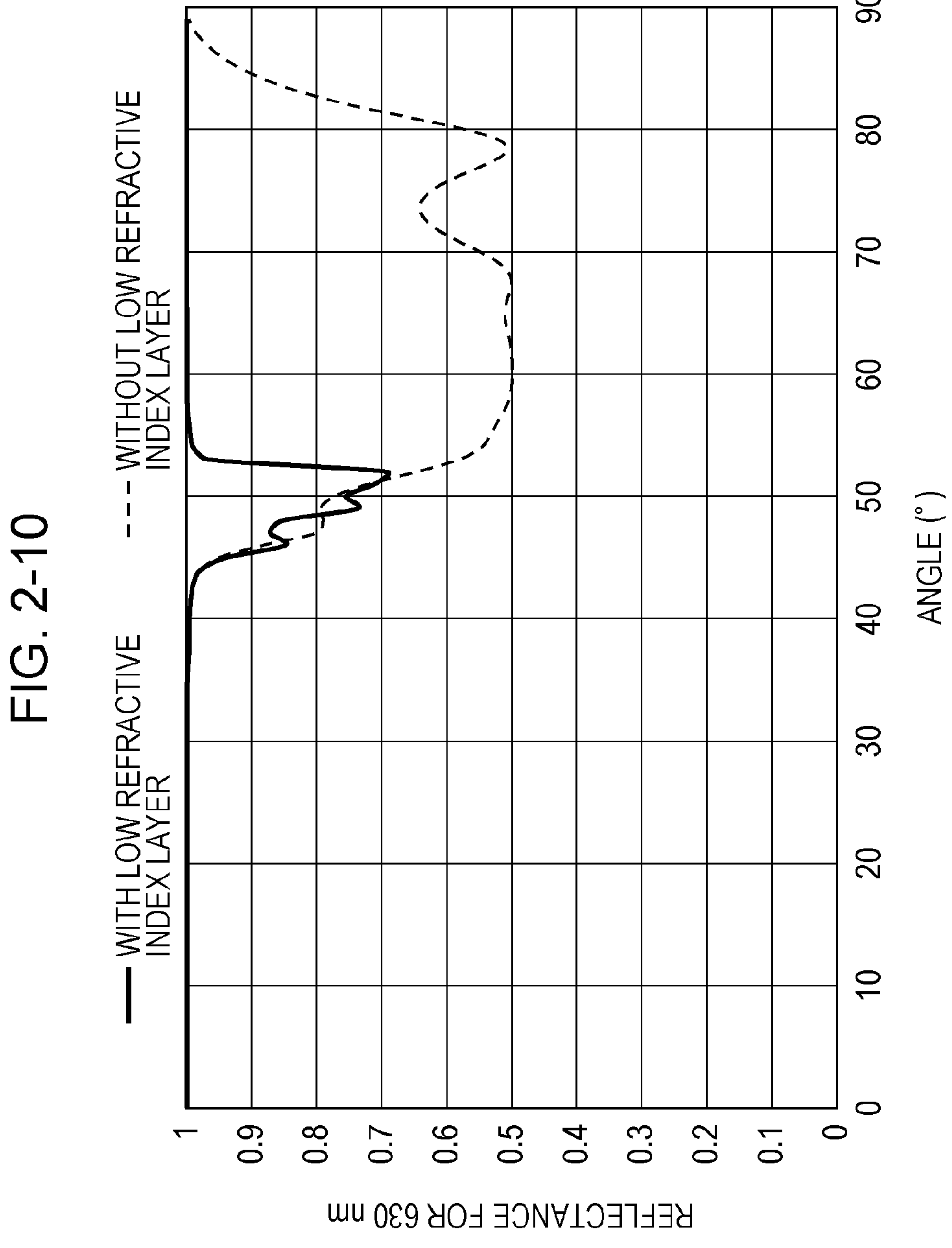
Figures 2, 3, 4, 5, 6, 7, 8, 9, 10, 11:
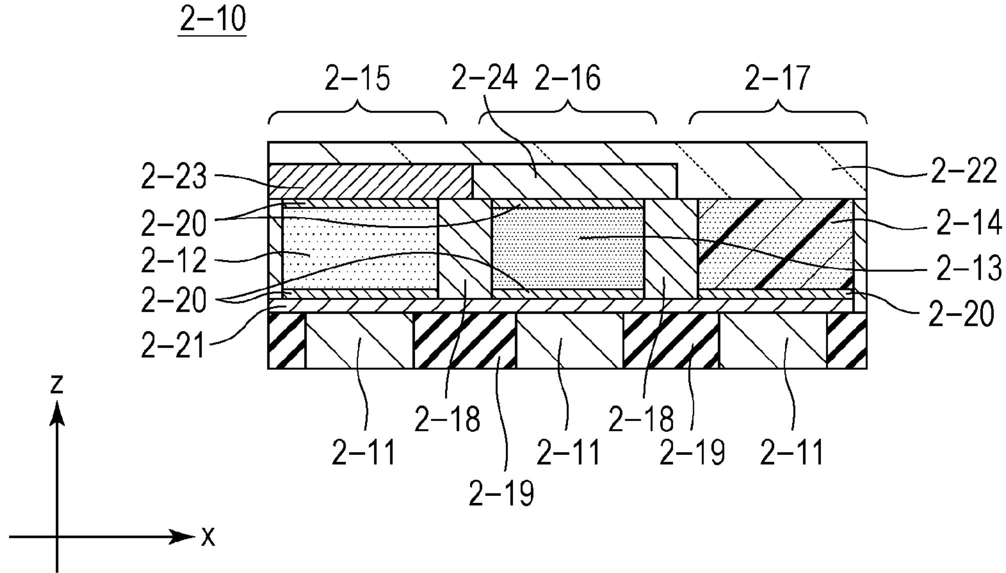
Figures 1A, 3:
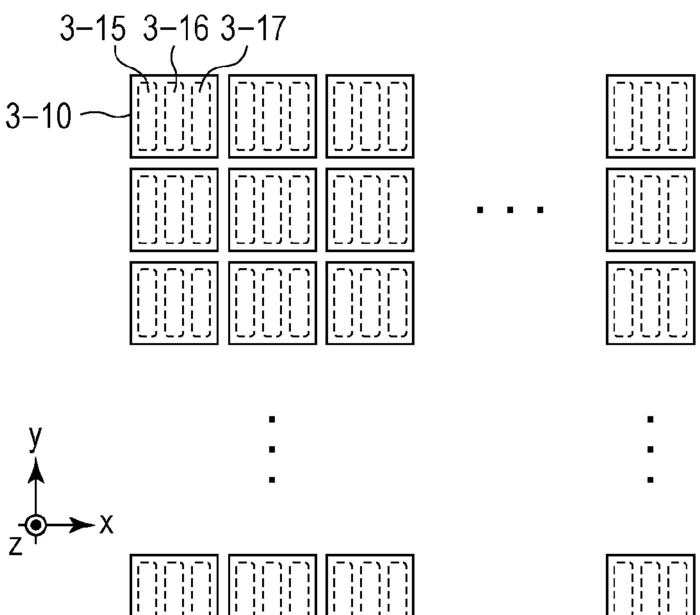
Figures 1B, 3:
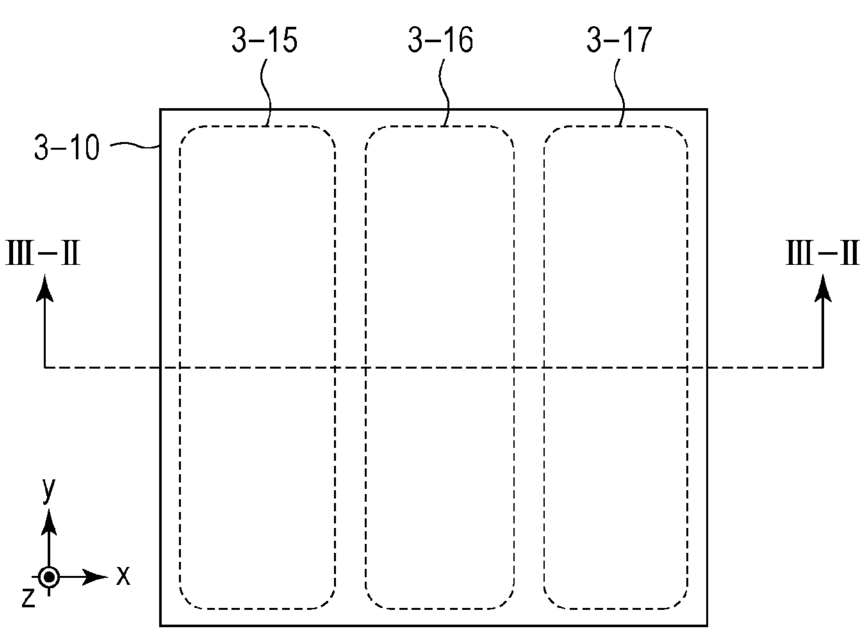
Figures 2, 3:
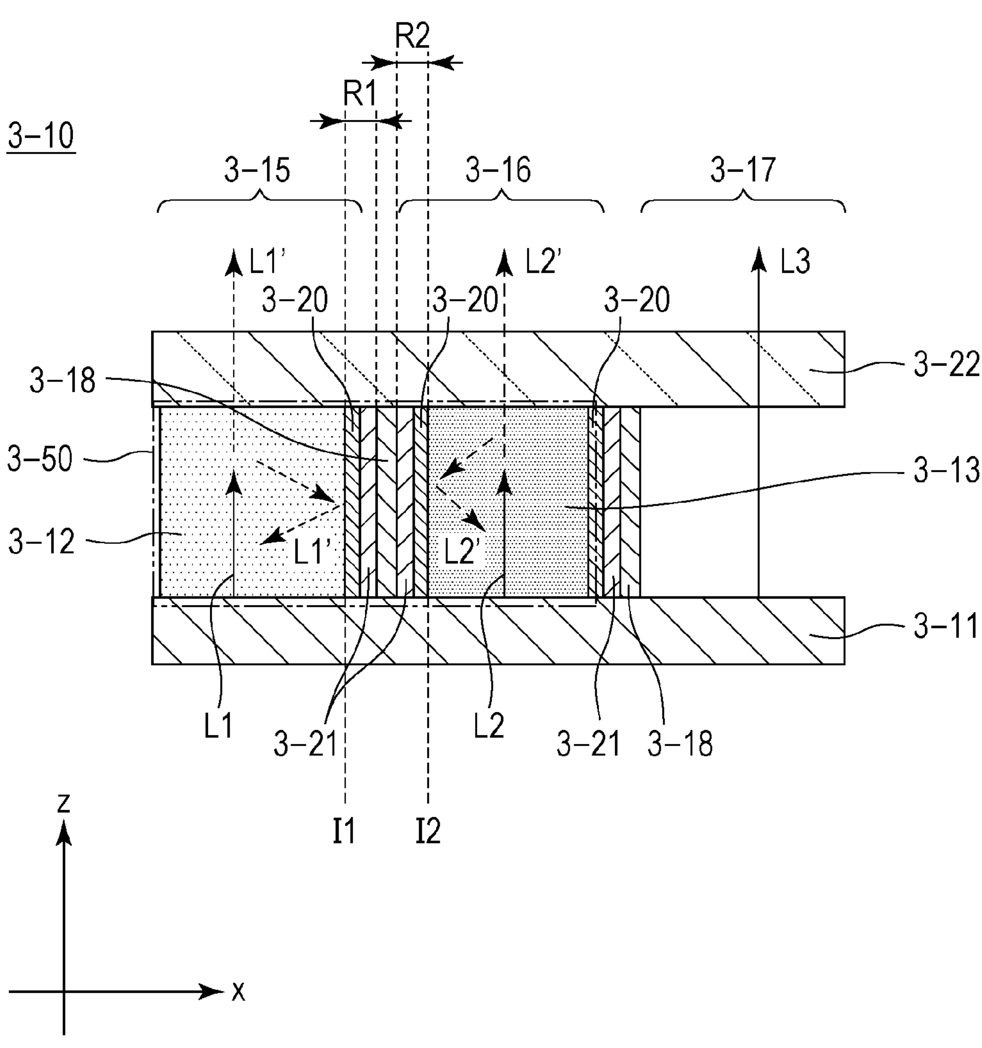
Figure 3:
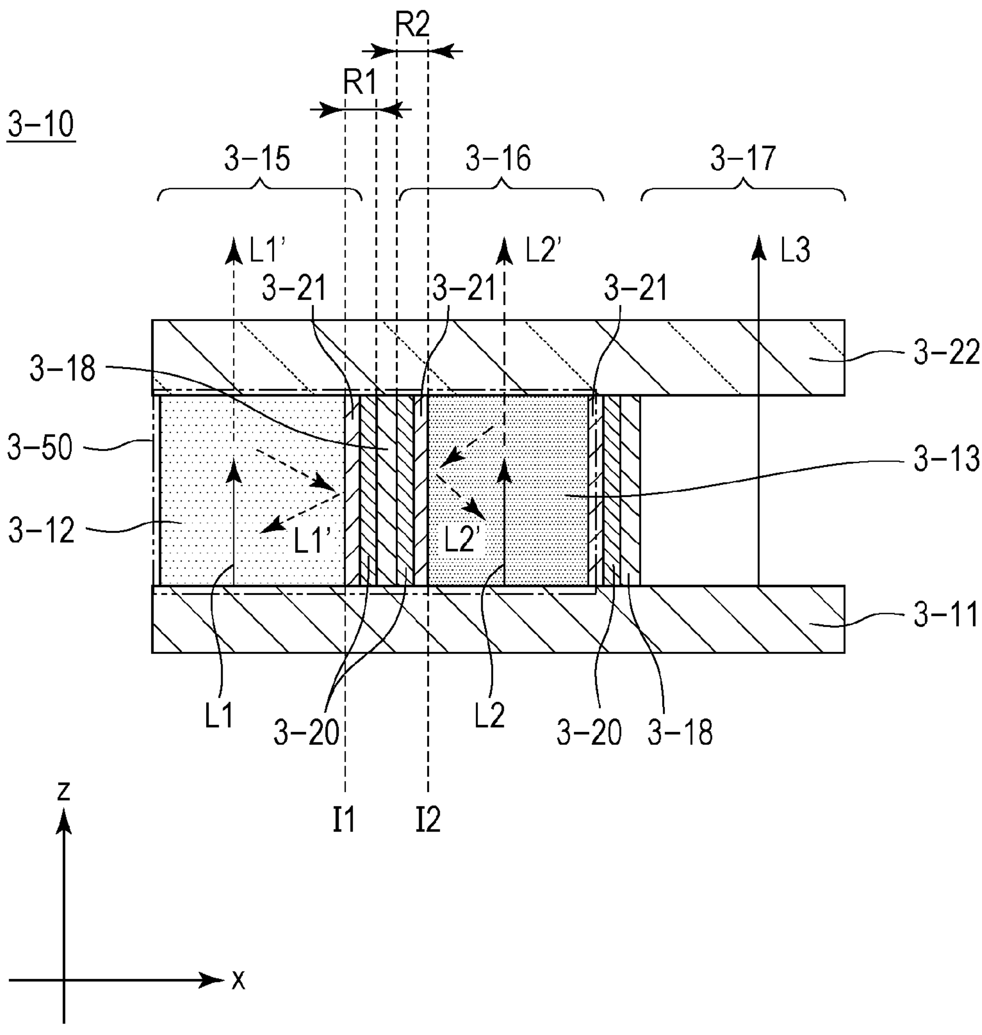
Figures 3, 4, 4A:
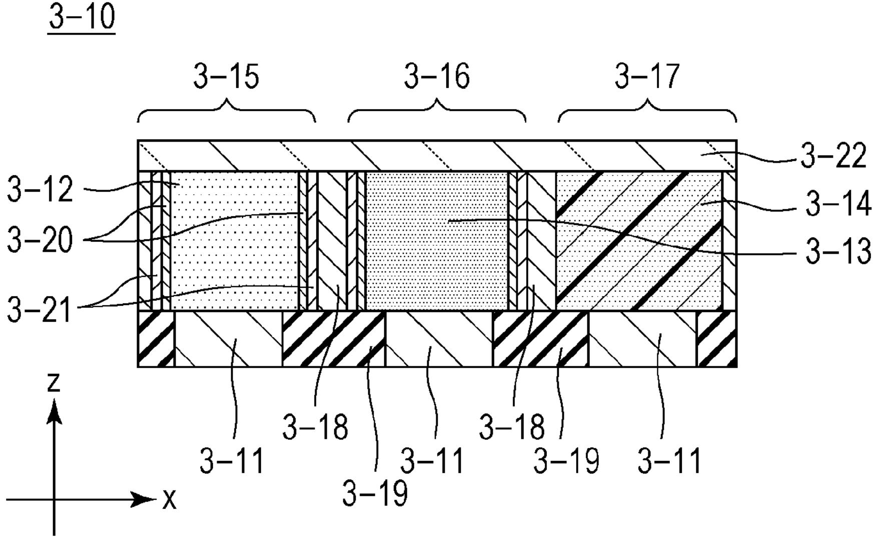
Figures 3, 4, 4B:
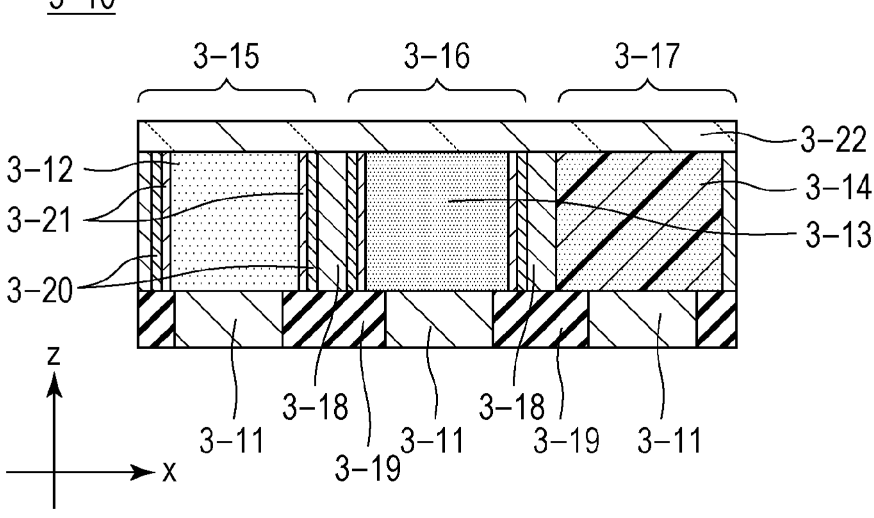
Figures 3, 4, 4C:
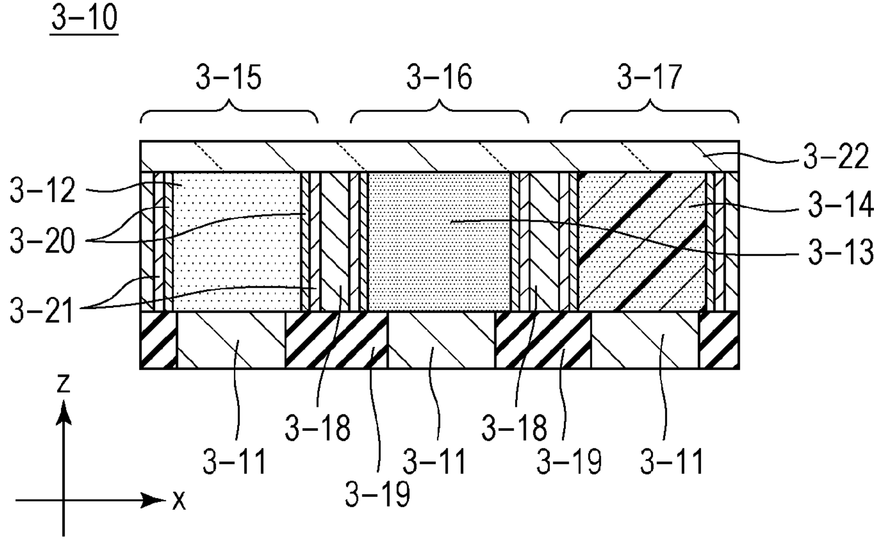
Figures 3, 4, 4D:
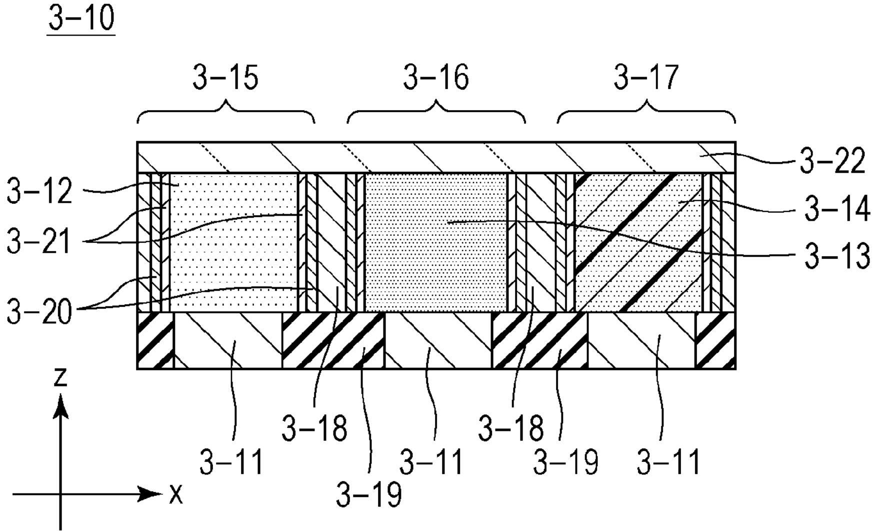
Figures 3, 4, 5, 5A:
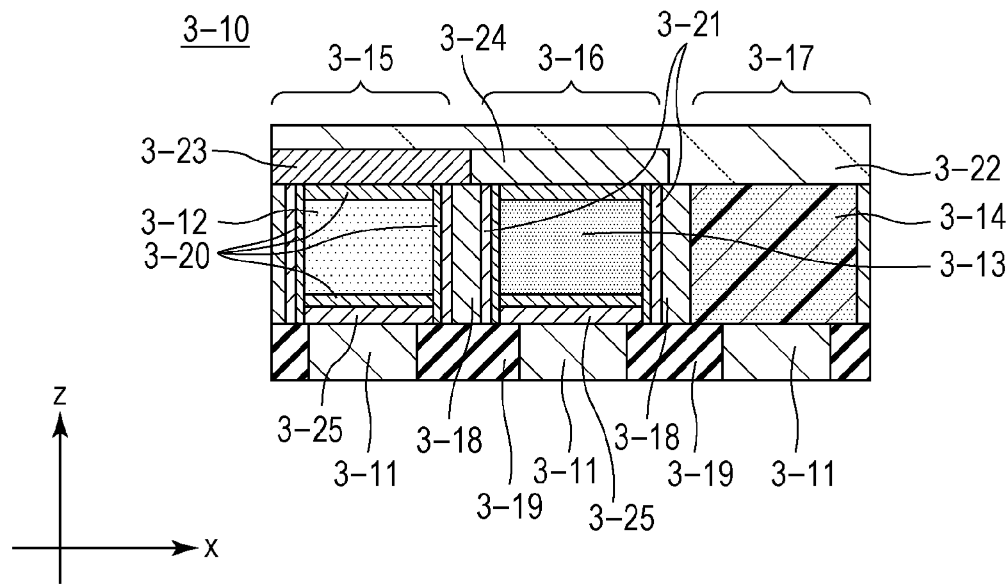
Figures 3, 4, 5, 5B:
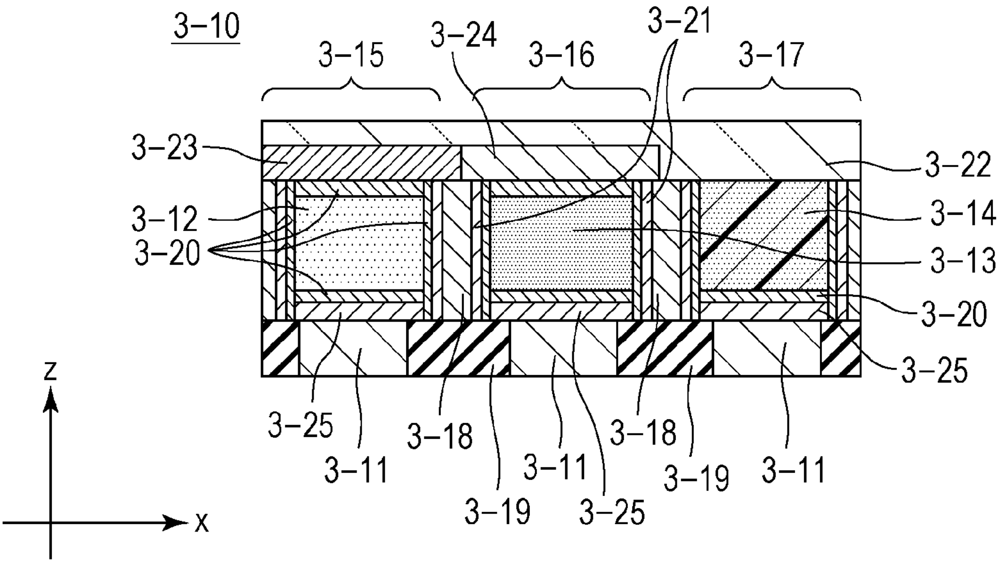
Figures 3, 4, 5, 6, 6A:
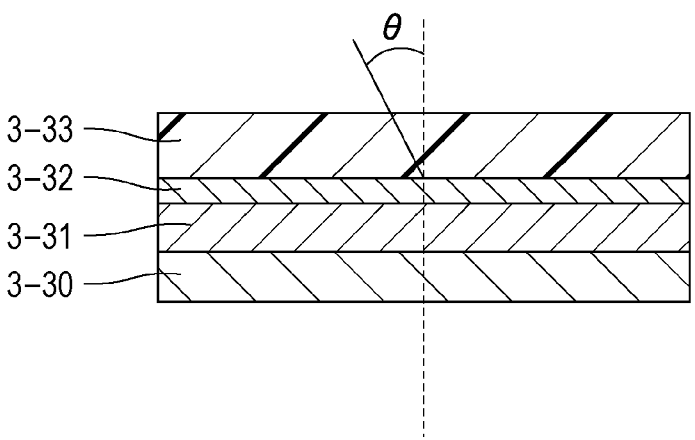
Figures 3, 4, 5, 6, 6B:
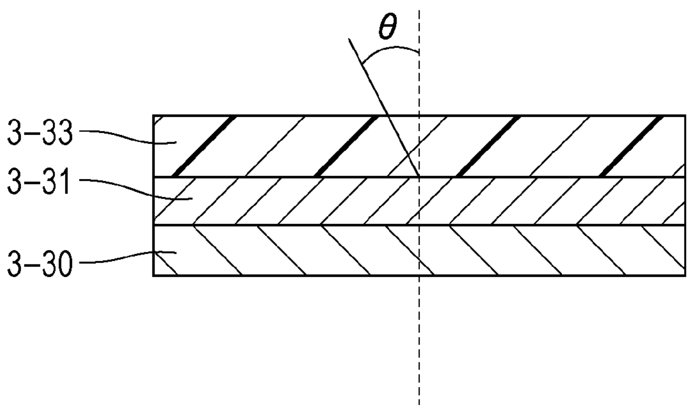
Figures 3, 4, 5, 6, 7, 7A:
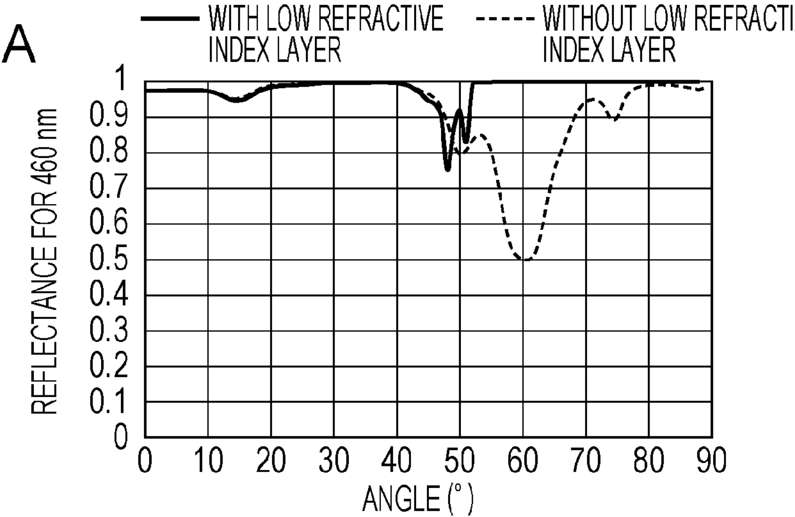
Figures 3, 4, 5, 6, 7, 7B:
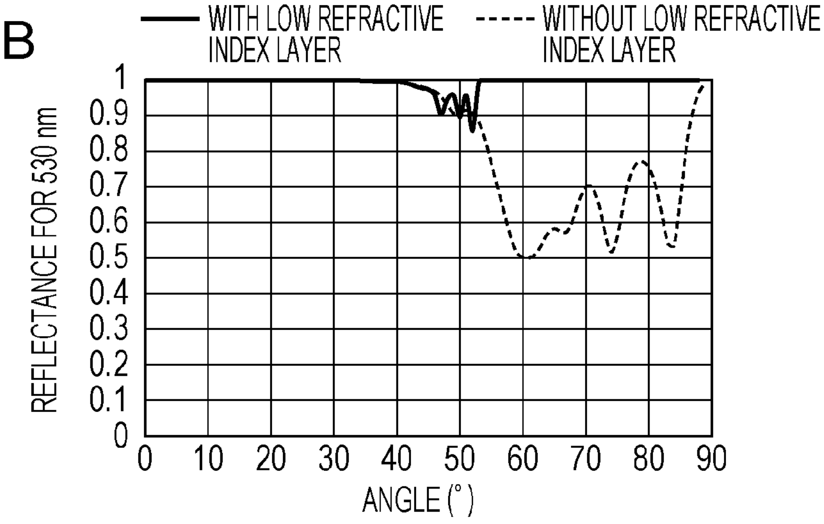
Figures 3, 4, 5, 6, 7, 7C:
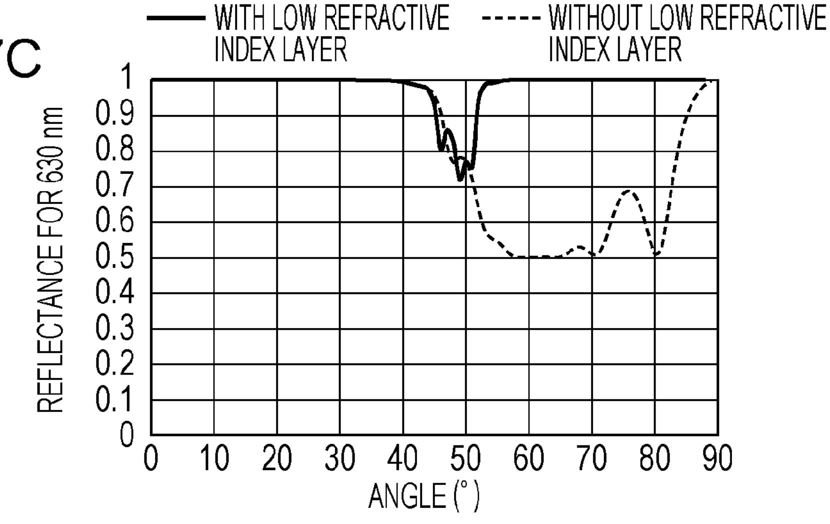
Figures 3, 4, 5, 6, 7, 8, 8A:
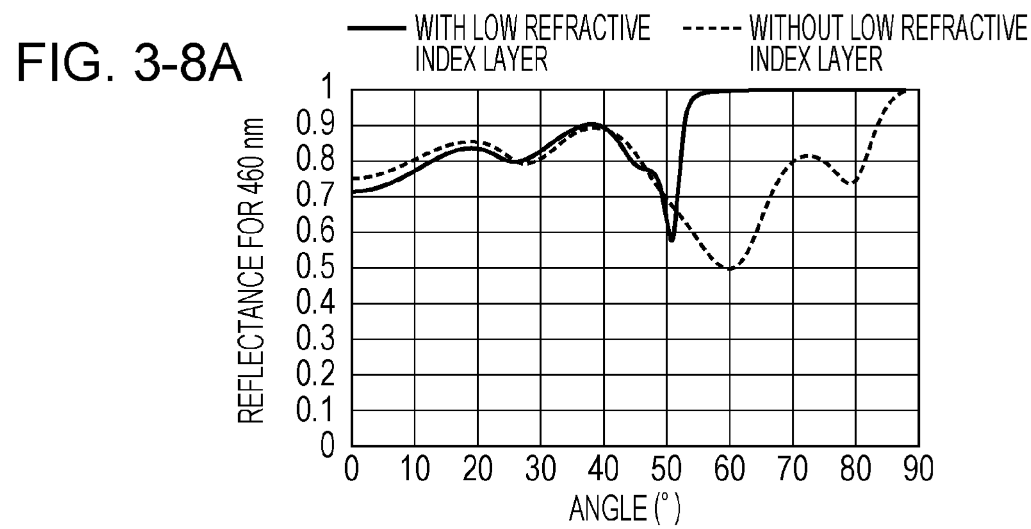
Figures 3, 4, 5, 6, 7, 8, 8B:
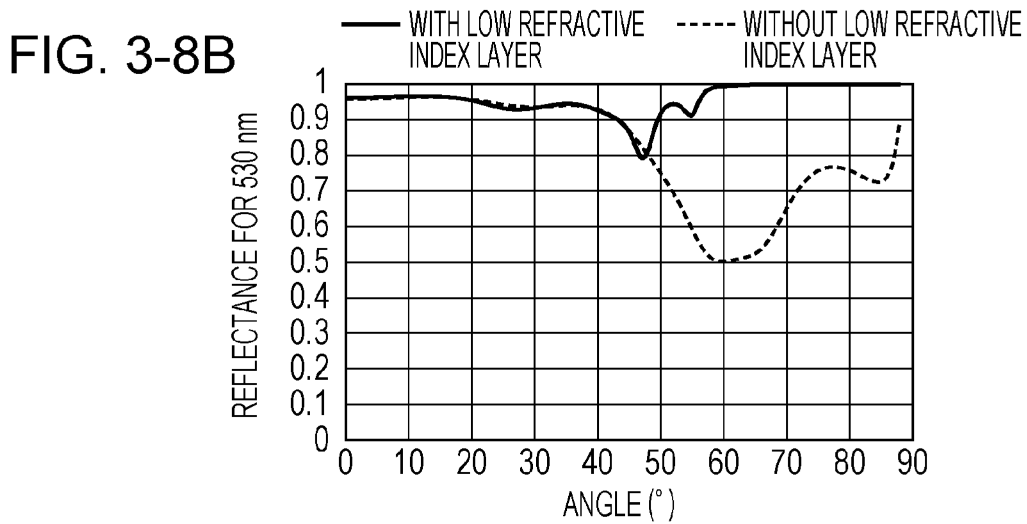
Figures 3, 4, 5, 6, 7, 8, 8C:
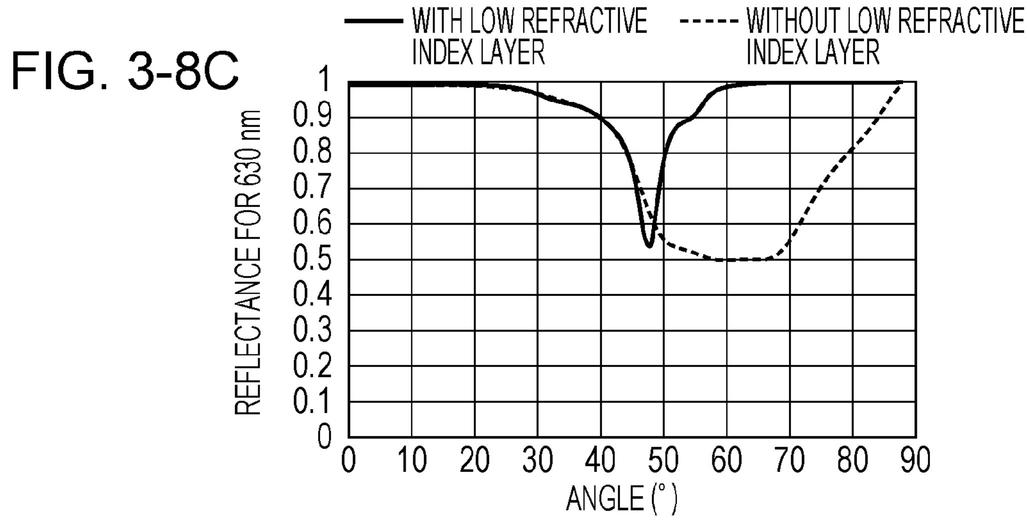

As shown in FIG. 3-4C, a similar configuration may also be provided for the resin portion 3-14 that is a component of the blue sub-pixel region 3-17. In other words, the resin portion 3-14, the low refractive index layer 3-20, the reflective layer 3-21, and the partition wall 3-18 are provided in this order. Blue excitation light that is scattered in the resin portion and enters the partition wall is reflected by the low refractive index layer 3-20 and the reflective layer 3-21 provided on the partition wall 3-18, so the efficiency of extracting light is increased, and the luminance of a blue pixel improves. The same applies to FIG. 3-4D of which arrangement of the low refractive index layer 3-20 and the reflective layer 3-21 is inverted from that of FIG. 3-4C.

Other Configuration Examples

Another configuration example of the display element according to the present embodiment will be described with reference to FIG. 3-5A. In this configuration example, an excitation light reflective layer 3-23 and the low refractive index layer 3-20 that reflect excitation light are provided in a region between the wavelength conversion portion 3-50 and the optical member 3-22. The refractive index of the low refractive index layer 3-20 is lower than the refractive index of any of the optical member 3-22, the first wavelength conversion layer 3-12, and the second wavelength conversion layer 3-13. Hereinafter, the detail will be described.

As shown in FIGS. 3-5A and 3-5B, in addition to the reflective layer 3-21 of the present embodiment, provided on the side surface of the wavelength conversion layer, the reflective layer 3-23 (reflective layer A) and a reflective layer 3-24 (reflective layer B) that reflect blue light and transmit wavelength converted light may be provided on the upper surface of the wavelength conversion layer. In addition, a reflective layer 3-25 (reflective layer C) that transmits blue light that is excitation light and that reflects green light emitted from the green sub-pixel region and red light emitted from the red sub-pixel region, which is emission from the wavelength conversion layer, may be provided on the lower surface of the wavelength conversion layer. When the reflective layers A to D are formed so as to cover the entire surface of the wavelength conversion layer, blue light is trapped in the wavelength conversion layer. As a result, the wavelength conversion efficiency improves. Here, in FIGS. 3-4A to 3-5B, arrangement of the low refractive index layer 3-20 and the reflective layer made of a dielectric multilayer film (the reflective layer 3-21 (reflective layer D), the reflective layer 3-23 (reflective layer A), the reflective layer 3-24 (reflective layer B), and the reflective layer 3-25 (reflective layer C)) may be inverted. In this case as well, similar advantageous effects are obtained. FIG. 3-5B shows a configuration in which the reflective layer 3-25 and the low refractive index layer 3-20 are provided on the lower surface of the resin portion 3-14 that is a component of the blue sub-pixel region 3-17. When light scattering particles are contained in the resin portion 3-14, blue excitation light that is scattered in the resin portion and returns to the blue light emitting element, when the light enters the reflective layer again, has a large amount of component that enters at a high angle larger than or equal to 50 degrees. With the reflective layer 3-25 and the low refractive index layer 3-20, light with a high angle larger than or equal to 50 degrees can be reflected, and blue light that enters the reflective layer again can be reflected again and emitted as blue light, so the luminance of the blue pixel further improves.

Reflective Layer

The reflective layer according to the present embodiment is a layer that selectively reflects light with a designated wavelength. In other words, the reflective layer may also be regarded as having wavelength selectivity with which light with wavelengths other than the designated wavelength reflected is transmitted.

A metal reflective layer or a dielectric multilayer film may be used as the reflective layer according to the present embodiment. A reflective layer containing at least one selected from a group consisting of Al, Ag, Au, Cr, Ni, and alloys of them may be used as the metal reflective layer.

When the reflective layer is a metal reflective layer, an all-angle mean reflectance for green light is preferably higher than or equal to 93% and more preferably higher than or equal to 94%, and an all-angle mean reflectance for red light is preferably higher than or equal to 92% and more preferably higher than or equal to 94%.

When the metal reflective layer is used, the angle dependence of reflectance is small; however, the reflectance is low and ranges from 90% to 95%. A dielectric multilayer film with a higher reflectance, that is, a high reflectance higher than or equal to 98%, may also be used.

Therefore, a dielectric multilayer film can be used as a reflective layer having wavelength selectivity as described above. A dielectric that is a component of the dielectric multilayer film may be an inorganic material, an organic material, or a combination of these materials. At least one selected from a group consisting of a polyester resin, an urethane resin, and an acrylic resin may be used as the organic material. An inorganic material, such as a fluoride material and an oxide material, or the like may be used as the inorganic material. At least one selected from a group consisting of $AlF_2$ (1.36), $MgF_2$ (1.38), and $CaF_2$ (1.43) may be used as the fluoride material. At least one selected from a group consisting of $SiO_2$ (1.45), $Al_2O_3$ (1.64), MgO (1.72), $Y_2O_3$ (1.88), $HfO_2$ (2.05), $SrTiO_3$ (2.44), and $TiO_2$ (2.49) may be used as the oxide material.

Here, the numeric values in the parentheses of the fluoride materials and oxide materials listed above are reference values of refractive indexes. The dielectric multilayer film is a multilayer film in which a low refractive index material and a high refractive index material selected from among these types of materials are alternately laminated. Here, the low refractive index material has a relatively lower refractive index than the high refractive index material, and the high refractive index material has a relatively higher refractive index than the low refractive index material.

At this time, when the thickness d of each of the layers that make up the dielectric multilayer film is set to $d=\lambda_0/4n$ where the refractive index n of the layer for a center wavelength $\lambda_0$ of a reflection band, rays of light reflected at the boundaries of the layers cancel out each other to reduce transmittance, and a reflection band is formed. Where the refractive index of the high refractive index material is $n_H$ and the refractive index of the low refractive index material is $n_L$ ($<n_H$), a reflection band with a width $W=2/\pi\times\sin[(n_H-n_L)/(n_H+n_L)]\times\lambda_0$ is formed on each side of the center wavelength.

In the reflective layer according to the present embodiment, the dielectric multilayer film is designed so as to reflect blue light (460 nm) that is excitation light and transmit green light (530 nm) to be emitted from the green sub-pixel region and red light (630 nm) to be emitted from the red sub-pixel region. The wavelengths of red, green, and blue rays of light described here each are an example of a maximum wavelength in each sub-pixel region and have to be a value within the range of the above-described wavelength band.

Wavelength converted light (green light or red light) radiates isotropically from the wavelength conversion layer, so light enters the partition wall at all the incident angles. Thus, when the reflective layer is designed to reflect wavelength converted light in the entire angular range, leakage of wavelength converted light to an adjacent sub-pixel region is reduced, and the wavelength converted light can be extracted to the wavelength conversion layer.

Here, a micro LED or a micro OLED can be used as an element that produces blue light that is excitation light. Such a light emitting element is a light source having directivity, so an angular range in which blue light is transmitted can range from zero degrees to 30 degrees. Part of a component not absorbed by the wavelength conversion layer in blue light having penetrated through the reflective layer in this angular range is reflected on the upper surface of the wavelength conversion layer and returns to the blue light emitting element side. However, when blue light enters the reflective layer again due to light scattering in the wavelength conversion layer or multiple reflection in the element, there is a large amount of component that enters at a high angle larger than or equal to 30 degrees. For this reason, when the dielectric multilayer film is designed so as to transmit blue light in an angular range of zero degrees to 30 degrees and reflect blue light at a high angle larger than or equal to 30 degrees, blue light that enters the reflective layer again can be reflected and returned to the wavelength conversion layer side, so the wavelength conversion efficiency improves. Wavelength converted light (green light or red light) radiates isotropically, so, when the dielectric multilayer film is designed so as to reflect light in the entire angular range, half of light radiated to the excitation light incident side can be reflected and extracted to a radiation side.

In the reflective layer according to the present embodiment, an all-angle mean reflectance for blue light that enters the reflective layer at an incident angle larger than or equal to 30 degrees and smaller than or equal to 90 degrees is preferably higher than or equal to 89% and more preferably higher than or equal to 95%.

Hereinafter, an example in which the dielectric multilayer film according to the present embodiment includes a laminated body in which a layer made of $SiO_2$ (low refractive index material) and a layer made of $TiO_2$ (high refractive index material) are alternately laminated will be described.

A multilayer film made up of $SiO_2$ and $TiO_2$ was used as an example of the reflective layer D, and the reflective layer in which multilayer films of which the center wavelengths of the reflection bands were respectively 490 nm, 580 nm, 670 nm, and 760 nm were laminated was used. The film thicknesses of $SiO_2$ and $TiO_2$ are 85 nm and 49 nm, 100 nm and 58 nm, 116 nm and 67 nm, and 131 nm and 76 nm. The number of repetitions of each band is five, and the total film thickness of the reflective layer is 3.4 μm. In other words, an alternate laminate of $SiO_2$ and $TiO_2$ is defined as a unit, and a multilayer film is obtained by repeatedly laminating the laminate five times.

In this way, the reflective layer D has a high reflectance at all the incident angles for blue light (460 nm), green light (530 nm), and red light (630 nm). The reflective layer can be prepared by film formation with a sputtering method, an ion beam deposition method, a pulsed laser deposition (PLD) method, or the like.

Here, when, for example, the display element according to the present embodiment is intended to be reduced in size, the size of each sub-pixel region is a few micrometers pitch (greater than or equal to 1 μm and less than or equal to 10 μm), the proportion of occupancy of a non-display part increases as the film thickness of the reflective layer D increases, so the film thickness is desirably reduced. A multilayer film similarly made up of $SiO_2$ and $TiO_2$ was used as an example of the reflective layer D made up of a dielectric multilayer film in the case of a thin film thickness, and the reflective layer in which multilayer films of which the center wavelengths of the reflection bands were respectively 450 nm, 580 nm, 670 nm, and 760 nm were laminated was used. The film thicknesses of $SiO_2$ and $TiO_2$ are 78 nm and 45 nm, 100 nm and 58 nm, 116 nm and 67 nm, and 131 nm and 76 nm. The number of repetitions of each band is two, and the total film thickness of the reflective layer is 1.3 μm. The reflectance slightly decreases; however, when the film thickness of the reflective layer D is thin as well, a reflective layer with a high reflectance at all the incident angles is obtained.

The reflective layer A and the reflective layer B, each of which is provided on the upper surface of the wavelength conversion layer shown in FIG. 3-5A or FIG. 3-5B, reflects blue light, and transmits wavelength converted light, will be described. Here, the reflective layer A is a reflective layer that reflects blue light and transmits green light. The reflective layer B is a reflective layer that reflects blue light and transmits red light. In an example of the reflective layer A, when it is assumed that the center wavelength of the reflection band is 400 nm, the film thickness of $SiO_2$ is 69 nm, the film thickness of $TiO_2$ is 40 nm, and the total film thickness is 1.1 μm. In an example of the reflective layer B, when it is assumed that the center wavelength of the reflection band is 470 nm, the film thickness of $SiO_2$ is 81 nm, the film thickness of $TiO_2$ is 47 nm, and the total film thickness is 1.3 μm.

In addition, the reflective layer C that transits blue light that is excitation light and that reflects green light emitted from the green sub-pixel region and red light from the red sub-pixel region, which is emission from the wavelength conversion layer, may be provided on the lower surface of the wavelength conversion layer. When a multilayer film made up of $SiO_2$ and $TiO_2$ is used as an example of the reflective layer C, and the reflective layer in which multilayer films of which the center wavelengths of the reflection bands are respectively 580 nm, 670 nm, and 760 nm were laminated is used, the film thicknesses of $SiO_2$ and $TiO_2$ are respectively 100 nm and 58 nm, 116 nm and 67 nm, and 131 nm and 76 nm. The number of repetitions of each band is five, and the total film thickness of the reflective layer is 2.7 μm.

Wavelength Conversion Portion, and Wavelength Conversion Layer

The wavelength conversion portion according to the present embodiment is not limited as long as the wavelength conversion portion converts blue light to light with a different wavelength. The wavelength conversion portion according to the present embodiment includes the first wavelength conversion layer that converts excitation light to first wavelength converted light longer in wavelength than the excitation light and the second wavelength conversion layer that converts the excitation light to second wavelength converted light longer in wavelength than the first wavelength converted light. The first wavelength converted light can be green light, and the second wavelength converted light can be red light. The first wavelength conversion layer and the second wavelength conversion layer according to the present embodiment can contain quantum dots. The thickness of each of the first wavelength conversion layer and the second wavelength conversion layer according to the present embodiment is preferably greater than or equal to 4 μm and less than or equal to 20 μm and more preferably greater than or equal to 6 μm and less than or equal to 10 μm.

The wavelength conversion portion is configured to include the wavelength conversion layers in which phosphor particles are dispersed in resin. It does not matter whether the phosphor particles are made of an inorganic material or an organic material, and particularly quantum dots can be used as the phosphor particles. This is because quantum dots exhibit emission with a narrow full width at half maximum of an emission spectrum and excellent color purity.

Inorganic particles used for quantum dots may be referred to as nanoparticles because of their size. Examples of the material of quantum dots include semiconductor crystals and include nanoparticles of group IV semiconductors, group III-V and group II-VI compound semiconductors, and compound semiconductors made of a combination of three or more of group II, group III, group IV, group V, and group VI elements. Specific examples of the material that emits light in a wavelength range for a display element include CsS, CdSe, CdZnSe, CdSeTe, ZnSe, ZnTeSe, ZnTeS, InP, $CuInS_2$, $AgInS_2$, and Pb perovskite. A core shell structure in which the above materials are used as the cores of quantum dots and the cores of quantum dots are coated with a coating compound is applicable. In this case, a ligand is provided in the shell part.

The mean particle diameter of the quantum dots is preferably greater than or equal to 2 nm and less than or equal to 15 nm. In quantum dots, if the particle diameters of quantum dots are reduced to a size less than or equal to the Bohr radius of an intrinsic exciton, there occurs a phenomenon that the bandgap of the quantum dots changes because of quantum size effect. For example, in InP that is a group III-V semiconductor, the Bohr radius is generally about 10 nm to about 14 nm. In other words, when the mean particle diameter of quantum dots is less than or equal to 15 nm, it is possible to control the bandgap due to quantum size effect. When the mean particle diameter of quantum dots is set to greater than or equal to 2 nm, it is possible to easily control the crystal growth of quantum dots in synthesizing quantum dots.

Quantum dots each have a ligand on the surface. A ligand may have a crosslinked structure that, when there are a first quantum dot and a second quantum dot, links the first quantum dot with the second quantum dot. Linking is that one molecule is coupled to the first quantum dot and the second quantum dot. When linking is performed by an organic ligand, it is possible to control the distance between the quantum dots by using the molecule length of the organic ligand. Specific examples of the crosslinked structure may include a hydroxyl group, a thiol group, and a carboxyl group. At least one or more organic molecules can be provided between quantum dots. As the number of organic ligands increases, both ends of the organic molecules tightly coupled to the surfaces of the quantum dots, so heat resistance and environmental resistance improve, and the stability of emission characteristics increases.

Phosphor Particle

Quantum dots having a full width at half maximum of less than 50 nm may be preferably used as phosphor particles to be used for the first wavelength conversion layer and the second wavelength conversion layer according to the present embodiment. For example, generally available quantum dots, such as InP/ZnS quantum dots of product numbers 776769, 776750, 776793, 776777, and 776785, produced by Sigma-Aldrich, may be used as quantum dots. The first wavelength conversion layer can be product number 776750. The second wavelength conversion layer can be product number 776777. Product numbers 905062, 900746, 900747, and 900748 may be used as perovskite quantum dots. The first wavelength conversion layer can be product number 905062 or product number 900746. The second wavelength conversion layer can be product number 900748.

Resin Portion

In the first wavelength conversion layer, the second wavelength conversion layer, and a third wavelength conversion layer (described later) according to the present embodiment, a monofunctional monomer or a bifunctional monomer may be used as the resin portion that is a matrix. Examples of the resin portion include acrylic resin, polyester resin, polyurethane resin, and polyamide resin. By mixing these materials, it is possible to adjust viscosity and surface tension suitable for film formation by means of photolithography and inkjet method (inkjet printing). The resin portion contains a photopolymerization initiator. The proportion of the resin portion ranges from 50 wt % to 70 wt %, and the proportion of the photopolymerization initiator ranges from 2 wt % to 5 wt %. In addition, light scattering particles can be contained in the wavelength conversion layer to improve the efficiency of use of blue light (excitation light) and reduce leakage of blue light. Titanium oxide or the like may be used as the light scattering particles. The proportion of light scattering particles ranges from 10 wt % to 30 wt %.

Low Refractive Index Layer

Refractive Index

The refractive index of the low refractive index layer according to the present embodiment is lower than the refractive index of any of the optical member, the first wavelength conversion layer, and the second wavelength conversion layer. Specifically, when silicon dioxide $SiO_2$ (Refractive index=1.45) is used as a framework material, the refractive index of the low refractive index layer according to the present embodiment may be lower than or equal to 1.45, preferably higher than or equal to 1.10 and lower than or equal to 1.30, and more preferably higher than or equal to 1.10 and lower than or equal to 1.15.

Thickness

The thickness of the low refractive index layer according to the present embodiment may be greater than or equal to 200 nm and may be less than or equal to half the thickness of the wavelength conversion portion or less than or equal to 2 μm. Here, the thickness is a thickness in the z-axis direction in FIGS. 3-2 to 3-5B.

Preferably, the lower limit of the thickness of the low refractive index layer according to the present embodiment is 200 nm, and the upper limit is a smaller one of half the thickness of the wavelength conversion portion and 2 μm. In the present embodiment, to sufficiently increase the reflectance at all angles, the thickness is preferably greater than about half the wavelength used for blue light (excitation light) from a light emitting element, so the above-described lower limit value is determined.

If the low refractive index layer is too thick, a crack or a haze significantly increases, so the thickness is preferably set to a smaller one of half the thickness of the wavelength conversion layer and 2 μm. A surface of the low refractive index layer adjacent to the wavelength conversion portion can be located closer to the wavelength conversion portion than to a surface of the partition wall adjacent to the light source portion. Here, light that exits from the wavelength conversion layer is totally reflected and returned to the wavelength conversion portion side at the interface with the low refractive index layer. At this time, when the surface of the low refractive index layer adjacent to the wavelength conversion portion is provided closer to the light source portion than to the surface of the partition wall adjacent to the light source portion, light is easily diffused in a horizontal direction, and leakage of light to an adjacent sub-pixel region occurs, which may lead to a decrease in resolution. Here, the horizontal direction is x and y-axis directions in FIGS. 3-2 to 3-6B, and 3-8A to 3-8C.

Composition and Configuration

When a solid material of which the refractive index of the low refractive index layer according to the present embodiment is lower than or equal to 1.65 is used as a framework, it is possible to appropriately set a voidage for refractive index and to improve the strength of the low refractive index layer. Hereinafter, an example in which the low refractive index layer contains a solid material will be described.

The solid material may be any of crystalline and amorphous. The solid material may be particles. The particles are not limited. Examples of the particles include spherical particles, indefinite-shape particles, particles in which the spherical or indefinite-shape particles are coupled in a beaded shape or a branched-chain shape, hollow particles having a cavity inside, and particles in which hollow particles are coupled in a beaded shape or a branched-chain shape.

From the viewpoint of refractive index, cost, and chemical stability, the solid material can contain silicon dioxide. In other words, the principal component of the solid material can be silicon dioxide. Here, the state "the principal component of the solid material is silicon dioxide" means that the solid material contains higher than or equal to 50 percent by mass of silicon dioxide. Typically, the solid material contains higher than or equal to 90 percent by mass of silicon dioxide.

Specific examples of silicon dioxide particles include Snowtex series and Organosilicasol made by Nissan Chemical Corporation, THRULYA series produced by JGC Catalysts and Chemicals Ltd., and Aerosil series made by EVONIK and sold by Nippon Aerosil Co., Ltd.

Generally, the refractive index $n_c$ of a composite material C made up of a material A with a refractive index $n_a$ and a material B with a refractive index $n_b$ is approximately expressed by the following expression 3-(1).

$$n_c = [n_a \times v_a / 100] + [n_b \times v_b / 100] \qquad 3-(1)$$

Here, $v_a$ and $v_b$ are respectively volume fractions of the material A and material B that make up the composite material ($v_a+v_b=100$).

According to the expression 3-(1), when a composite material of the solid material and air, that is, when a porous film with a solid material as a framework is used as the low refractive index layer, the refractive index can be lower than the refractive index of the original solid material. At this time, as the refractive index of the solid material that is the framework decreases, or as the voidage of the low refractive index layer increases, the refractive index of the low refractive index layer decreases. To increase the voidage of the low refractive index layer, the low refractive index layer may have a porous structure. From this viewpoint, the low refractive index layer may be referred to as porous film.

In the expression 3-(1), where the material A is air and the material B is silicon dioxide, the refractive index of air $n_a$ is 1.00, the refractive index of silicon dioxide $n_b$ is 1.46, and the volume fraction of silicon dioxide $v_b$ is $100-v_a$. In other words, $v_a$ is a function of the refractive index $n_c$ of the low refractive index layer, and $v_a$ can be obtained. $v_a$ is a voidage.

The voidage of the low refractive index layer according to the present embodiment is preferably higher than or equal to 60.0% and lower than or equal to 95.0% and more preferably higher than or equal to 65.0% and lower than or equal to 90.0%.

For example, according to the expression 3-(1), when the voidage of the low refractive index layer with silicon dioxide (refractive index 1.46) as a framework is lower than 60.0%, the refractive index can possibly exceed 1.15.

On the other hand, when the voidage exceeds 95.0%, the refractive index can be excessively low like the refractive index of the low refractive index layer is lower than 1.05, and the strength can decrease because there is a small amount of the framework that is a component of the low refractive index layer.

Hollow Particle

The case where the low refractive index layer contains hollow particles will be further described; however, the low refractive index layer is not limited thereto. Hollow particles are such that an outer shell is made of a solid material and a particle having a cavity (void) inside is provided inside the outer shell. Hollow particles can contain hollow particles (hereinafter, hollow silica particles) of which the outer shell is made of silicon dioxide. Fumed silica particles may be used other than hollow silica particles. In the following description, hollow silica particles will be described.

The low refractive index layer can contain a plurality of hollow particles. The low refractive index layer containing a plurality of hollow particles may contain solid particles or may contain a binder, other than hollow particles. Where the proportion of a total volume of voids in the plurality of hollow particles to a unit volume of the low refractive index layer is a voidage X (%) and the proportion of a total volume of voids between hollow particles to the unit volume of the low refractive index layer is a voidage Y (%), the relationship $X<Y$ can be satisfied. Here, $(X+Y)$ means the voidage of the low refractive index layer.

The refractive index n of the low refractive index layer is expressed by the following expression 3-(2).

$$n=[n_a\times(X+Y)/100]+[n_s\times(100-X-Y)/100] \qquad 3-(2)$$

Here, $n_a$ is the refractive index of air ($n_a=1$), and $n_s$ is the refractive index of the outer shells of hollow particles ($n_s>1$). According to the expression 3-(2), as $X+Y$ increases or as $n_s$ decreases, n decreases. When the hollow particles are densely disposed, the volume fraction of voids present between hollow particles reduces, and the volume fraction of the outer shells that are a component with a higher refractive index than air increases, so the refractive index of the low refractive index layer increases. On the other hand, when the hollow particles are sparsely disposed, the volume fraction of voids between hollow particles increases, and the volume fraction of the outer shells reduces, so the refractive index of the low refractive index layer decreases. In other words, to further decrease the refractive index of the low refractive index layer, Y/X can be increased. Specifically, the relationship $Y/X>1$, that is, the relationship $X<Y$, can be satisfied.

X and Y preferably satisfy the relationship $X<(100-X-Y)<Y$.

The low refractive index layer may contain particles made of a solid material and a binder that binds the particles for high strength. When a binder is used, solids contained in the low refractive index layer are the outer shells of hollow particles and the binder, and the volume fraction of the solids to the unit volume of the low refractive index layer is expressed by $(100-X-Y)$ (%).

When the relationship $X<(100-X-Y)$ is satisfied, the strength of the low refractive index layer is further improved. When the relationship $(100-X-Y)<Y$ is satisfied, the refractive index of the low refractive index layer further decreases.

A total value of X and Y $(X+Y)$ is preferably higher than or equal to 60.0% and lower than or equal to 95.0% and more preferably higher than or equal to 65.0% and lower than or equal to 90.0%. When $(X+Y)$ is set to the above range, the strength of the low refractive index layer and the refractive index of the low refractive index layer are easily adjusted to desired ranges.

When X and Y are set to the above ranges, the strength of the low refractive index layer and the refractive index of the low refractive index layer are easily adjusted to desired ranges.

Film Formation Method

An example in which hollow particles of which the outer shell is silicon dioxide as a solid material are used will be described; however, the configuration is not limited thereto.

A dispersion solution of hollow particles may be used. The dispersion solution of hollow particles is not limited as long as the dispersion solution of hollow particles satisfies the voidage of the hollow particles, the refractive index of the outer shells of the hollow particles, the number mean particle diameter of primary particles of the hollow particles, and the like.

For example, THRULYA series produced by JGC Catalysts and Chemicals Ltd., which is an isopropanol (hereinafter, also referred to as IPA) dispersion solution of hollow silica particles, is suitably used. Other than commercially available products like THRULYA series, as for hollow silica particles, hollow particles dispersed in a solvent by a similar method to that for a dispersed solvent of fumed silica particles may be used.

The concentration of hollow particles in a solvent, for example, the concentration (solid content concentration) of hollow silica particles in a coating solution is preferably higher than or equal to 1.0 percent by mass and lower than or equal to 30.0 percent by mass and more preferably higher than or equal to 2.0 percent by mass and lower than or equal to 20.0 percent by mass.

When the content (concentration) falls within the above range, it is easy to adjust the film thickness of the low refractive index layer to greater than or equal to 200 nm.

The surface of each hollow silica particle has a hydroxyl group and has an affinity for water, so a solvent with a strong hydrophobicity is not suitable. Specifically, an organic solvent with an octanol-water partition coefficient log $P_{ow}$ less than or equal to two can be used. Examples of the organic solvent include alcohol solvents, such as methanol, ethanol, propanol, and isopropanol, glycol solvents, such as ethylene glycol and propylene glycol, ether solvents, such as dimethyl ether, diethyl ether, ethylene glycol monomethyl ether, ethylene glycol monoethyl ether, propylene glycol monomethyl ether, and propylene glycol monoethyl ether, acetate solvents, such as ethyl acetate, propyl acetate, propylene glycol monomethyl ether acetate, and propylene glycol monoethyl ether acetate, and ketone solvents, such as acetone and methyl ethyl ketone.

Hereinafter, a film formation method for the low refractive index layer will be described. A film is formed by using the coating solution. A bar coating method, a doctor blade method, a squeegee method, a spray method, a spin coating method, a dip coating method, a screen printing method, an ink-jet method may be used as the film formation method. When a film is formed by patterning a selected pixel of a display element, the film can be formed by the ink-jet method.

A binder that binds particles may be used as one of methods for improving the strength of the low refractive index layer. A resin, such as acrylic resin, fluororesin, styrene resin, imide resin, urethane resin, and phenolic resin, may be used as the binder.

Light Source Portion

The light source portion according to the present embodiment is not limited as long as the light source portion emits excitation light. Examples of the light source portion include light emitting elements, such as a light emitting diode (LED) and an organic light emitting diode (OLED). In the present embodiment, a micro LED or a micro OLED can be used.

Light source portions may be respectively provided for the red sub-pixel region, the green sub-pixel region, and the blue sub-pixel region or a common light source portion may be provided for these sub-pixel regions.

Optical Member

The optical member according to the present embodiment is not limited as long as the optical member transmits blue light, green light, or red light. The optical member according to the present embodiment is, for example, a transparent resin capable of shielding the first wavelength conversion layer or the second wavelength conversion layer against an external environment. A transparent resin with a transmittance of higher than or equal to 85% and more preferably higher than or equal to 90% for blue light, green light, and red light may be used as the optical member. The refractive index of resin that is used as the optical member may be higher than or equal to 1.5 and lower than or equal to 1.9. The optical member may be formed as a microlens in each sub-pixel region. In this case, the optical member has a function to converge light emitted from the first wavelength conversion layer 3-12 and the second wavelength conversion layer 3-13. The microlens can be prepared by, for example, photolithography and heat treatment. After resin is applied, the optical member can also be prepared by pressing a pattern die machined in an array shape against the resin. When the optical member is used as a microlens, the refractive index of the optical member can be set to higher than or equal to 1.7 and lower than or equal to 1.9.

Display Apparatus

A display apparatus according to the present embodiment includes the display elements according to the above-described embodiment, and a power supply unit that causes the light source portions to emit light.

Example (Third Embodiment)

Hereinafter, a display element according to an example of the present invention will be described in detail; however, the present invention is not limited to the following example.

Example 3-1

Reflective Layer

Preparation of Reflective Layer

The reflective layer D made up of a dielectric multilayer film was prepared as a reflective layer. Initially, to evaluate only reflectance not including light absorption by the wavelength conversion layer of the reflective layer, reflective layers with the configurations shown in FIGS. 3-6A and 3-6B were prepared. FIG. 3-6A shows the configuration of the present embodiment with a low refractive index layer. FIG. 3-6B is an existing configuration with no low refractive index layer.

The reflective layer D reflects all the wavelengths of blue light (460 nm) that is excitation light, green light (530 nm) from the green sub-pixel region, and red light (630 nm) from the red sub-pixel region, which are emission from the wavelength conversion layers, at all the incident angles. A multilayer film made up of $SiO_2$ and $TiO_2$ was used as the reflective layer D, and the reflective layer in which multilayer films of which the center wavelengths of the reflection bands were respectively 490 nm, 580 nm, 670 nm, and 760 nm were laminated was used. The film thicknesses of $SiO_2$ and $TiO_2$ are 85 nm and 49 nm, 100 nm and 58 nm, 116 nm and 67 nm, and 131 nm and 76 nm. The number of repetitions of each band is five, and the total film thickness of the reflective layer is 3.4 μm. The reflective layer D was formed on a quartz substrate 3-30 as the reflective layer 3-31 by an ion beam deposition method.

A low refractive index layer was prepared by using hollow silica particles. For preparation of a coating solution, THRULYA 4110 (dispersion medium: IPA, the solid content concentration of silica: 20.5 percent by mass, the number mean particle diameter of one hollow particle: 60 nm, the voidage of one hollow particle: 45%, and the refractive index of one hollow particle: 1.25) produced by JGC Catalysts and Chemicals Ltd., was used. Then, a coating solution prepared such that the solid content concentration of silica was 6.0 percent by mass was used. The coating solution was applied to the reflective layer 3-31 and subjected to rotation for 10 seconds with a rotation speed of 1000 rpm by a spin coating method to form a low refractive index layer 3-32 with a thickness of 1.0 μm.

Subsequently, a resin portion 3-33 was formed on the low refractive index layer 3-32. The same resin as the wavelength conversion layer without phosphor particles was used for the resin portion. A material in which 3 wt % of 2,4,6-trimethylbenzoyl)phosphine oxide was contained in benzyl acrylate as a photopolymerization initiator was used as the resin. The resin was applied onto the low refractive index layer 3-32 and subjected to rotation for 10 seconds with a rotation speed of 1000 rpm by a spin coating method to form a film. The resin was cured by applying UV light with an illuminance of 15 $mW/cm^2$ for 30 seconds with a UV lamp (EX250, HOYA) to prepare the resin portion 3-33. The thickness of the resin portion 3-33 was 10 μm.

By changing forming conditions of the low refractive index layer, Configuration 3-1 to Configuration 3-5 with different refractive indexes of the low refractive index layer in the range of 1.10 to 1.30 and Configuration 3-6 with no low refractive index layer were formed on the reflective layer D as shown in Table 3-1.

A multilayer film similarly made up of $SiO_2$ and $TiO_2$ was used as the reflective layer D in the case of a thin film thickness, and the reflective layer in which multilayer films of which the center wavelengths of the reflection bands were respectively 450 nm, 580 nm, 670 nm, and 760 nm were laminated was used. The film thicknesses of $SiO_2$ and $TiO_2$ are 78 nm and 45 nm, 100 nm and 58 nm, 116 nm and 67 nm, and 131 nm and 76 nm. The number of repetitions of each band is two, and the total film thickness of the reflective layer is 1.3 μm. The reflective layer D was formed on the quartz substrate 3-30 as the reflective layer 3-31 by an ion beam deposition method. Configuration 3-7 with a refractive index of the low refractive index layer of 1.15 and Configuration 3-8 with no low refractive index layer were formed on the reflective layer D with a thin film thickness as shown in Table 3-1.

When aluminum (Al) was used as a reflective layer, in the same process, by changing forming conditions of the low refractive index layer, Configuration 3-9 to Configuration 3-13 with different refractive indexes of the low refractive index layer in the range of 1.10 to 1.30 and Configuration 3-14 with no low refractive index layer were formed as shown in Table 3-1. Al with a thickness of 100 nm was deposited by a sputtering method.

In addition to the reflective layer D of this example, a reflective layer (reflective layer A or reflective layer B) that reflects blue light and transmits wavelength converted light was provided on the upper surface, and the reflective layer C that transmits blue light and reflects wavelength converted light was provided on the lower surface. When the reflective layers are formed so as to cover the wavelength conversion layer, blue light is trapped in the wavelength conversion layer, so the wavelength conversion efficiency improves. Furthermore, wavelength converted light can be reflected on the side surface and the lower surface and efficiently extracted, so the wavelength conversion efficiency further improves. The reflective layer A is a reflective layer that reflects blue light and transmits green light. The reflective layer B is a reflective layer that reflects blue light and transmits red light. A reflective layer in which the center wavelength of the reflection band was 400 nm, the film thickness of $SiO_2$ was 69 nm, the film thickness of $TiO_2$ was 40 nm, and the film thickness was 1.1 μm was used as the reflective layer A. A reflective layer in which the center wavelength of the reflection band was 470 nm, the film thickness of $SiO_2$ was 81 nm, the film thickness of $TiO_2$ was 47 nm, and the film thickness was 1.3 μm was used as the reflective layer B.

In addition, the reflective layer C configured to transmit blue light that was excitation light and reflect green light emitted from the green sub-pixel region and red light from the red sub-pixel region, which was emission from the wavelength conversion layers, was provided on the lower surface of the wavelength conversion layer. A reflective layer in which the center wavelengths of the reflection bands were respectively 580 nm, 670 nm, and 760 nm, the film thicknesses of $SiO_2$ and $TiO_2$ were respectively 100 nm and 58 nm, 116 nm and 67 nm, and 131 nm and 76 nm, and the film thickness was 2.7 μm was used as the reflective layer C.

For the reflective layers A to C, reflective layers with a low refractive index layer with a refractive index of 1.15 were prepared in the same process.

Evaluation of Transmittance

Reflective Layer D

FIGS. 3-7A, 3-7B, and 3-7C respectively show the angle dependence of the reflectance of the existing configuration in which the reflective layer D has no low refractive index layer (Configuration 3-6) and the angle dependence of the reflectance of the configuration of the present example in which the reflective layer D has a low refractive index layer with a refractive index of 1.15 (Configuration 3-2) for a wavelength of 460 nm, a wavelength of 530 nm, and a wavelength of 630 nm. For all the wavelengths, with the existing configuration with no low refractive index layer, the reflectance significantly decreased at an incident angle larger than or equal to 50 degrees; whereas with the configuration of the present example with a low refractive index layer, the reflectance significantly improved at an incident angle larger than or equal to 50 degrees.

For blue light, part (10% or lower) of blue light having entered the wavelength conversion layer is mostly a component that enters the partition wall at a high angle larger than or equal to 50 degrees as a result of reflection on the upper surface, lower surface, and side surface of the wavelength conversion layer, light scattering in the wavelength conversion layer, or multiple reflection in the element. Thus, with the existing configuration with no low refractive index layer, blue light leaks into the partition wall and disappears or leaks to an adjacent pixel to illuminate the wavelength conversion layer to cause crosstalk. With the configuration of the present example with a low refractive index layer, light with a high angle larger than or equal to 50 degrees can be reflected, and blue light that enters the reflective layer again can be reflected again and returned to the wavelength conversion layer side, so the wavelength conversion efficiency improves.

For green light and red light, with the existing configuration with no low refractive index layer, the reflectance significantly decreased at an incident angle larger than or equal to 50 degrees, and, with the existing configuration with no low refractive index layer, light leaks into the partition wall to disappear or leaks to an adjacent pixel to cause crosstalk. Wavelength converted light (green light or red light) isotropically radiates, so there is a large amount of high incident angle component in light entering the reflective layer D, so the configuration of the present example with an increased reflectance at a high angle larger than or equal to 50 degrees is adopted. With the above configuration, almost the entire light entering the partition wall can be reflected to a radiation side and extracted.

For the reflective layers of Configuration 3-1 to Configuration 3-14, the angle dependence of reflectance was measured, and an all-angle mean reflectance $R_{int}$ was calculated. Blue light contains a large amount of component that enters the reflective layer in a wide angle because of the influence of light scattering inside the wavelength conversion layer and multiple reflection and total reflection inside the light emitting element. Wavelength converted light contains a large amount of light component that enters the reflective layer at a wide angle because the wavelength converted light radiates isotropically. In consideration of the above, this index is used as a standard value to evaluate the reflectance and transmittance at each wavelength. An all-angle mean transmittance $T_{int}$ can be calculated from the relationship $T_{int}=1-R_{int}$. In the expression 3-(3), $R(\theta)$ denotes an incident angle distribution of reflectance.

Evaluation on reflectance was performed by using an ultraviolet visible near-infrared spectrophotometer "UV-3600" (made by Shimadzu Corporation) equipped with an integrating sphere attachment "ISR-240A" (made by Shimadzu Corporation).

$$R_{int} = \frac{\int_0^{\pi/2} R(\theta)\sin\theta d\theta}{\int_0^{\pi/2} \sin\theta d\theta} \quad 3\text{-}(3)$$

Measurement results are shown in Table 3-1. Initially, the reflective layer D will be described.

For 460 nm blue light, in comparison with the configuration with no low refractive index layer (Configuration 3-6), when the low refractive index layer was provided, an all-angle mean reflectance improved, and, particularly, the reflectance of incident light at a high angle larger than or equal to 50 degrees improved (FIG. 3-7A). As the refractive index of the low refractive index layer decreases, the reflectance increases. When the refractive index of the low refractive index layer is lower than or equal to 1.30, the all-angle mean reflectance is higher than or equal to 92%. When the refractive index of the low refractive index layer is 1.15, the all-angle mean reflectance is higher than or equal to 98%.

For 530 nm green light, in comparison with the configuration with no low refractive index layer (Configuration 3-6), when the low refractive index layer was provided, the all-angle mean reflectance improved, and, particularly, the reflectance of incident light at a high angle larger than or equal to 50 degrees improved (FIG. 3-7B). As the refractive index of the low refractive index layer decreases, the reflectance increases, and, when the refractive index of the low refractive index layer is lower than or equal to 1.30, the all-angle mean reflectance is higher than or equal to 93%. When the refractive index of the low refractive index layer is 1.15, the all-angle mean reflectance is higher than or equal to 99%, and green light is efficiently extracted.

For 630 nm red light, in comparison with the configuration with no low refractive index layer (Configuration 3-6), when the low refractive index layer was provided, an all-angle mean reflectance improved, and, particularly, the reflectance of incident light at a high angle larger than or equal to 50 degrees improved (FIG. 3-7C). As the refractive index of the low refractive index layer decreases, the reflectance increases, and, when the refractive index of the low refractive index layer is lower than or equal to 1.30, the all-angle mean reflectance is higher than or equal to 90%. When the refractive index of the low refractive index layer is 1.15, the all-angle mean reflectance is higher than or equal to 97%, and red light is efficiently extracted.

Reflective Layer D (Configuration with Thin Film Thickness)

FIGS. 3-8A, 3-8B, and 3-8C respectively show the angle dependence of the reflectance of the existing configuration in which the reflective layer D with a thin film thickness has no low refractive index layer (Configuration 3-8) and the angle dependence of the reflectance of the configuration of the present example in which the reflective layer D has a low refractive index layer with a refractive index of 1.15 (Configuration 3-7) for a wavelength of 460 nm, a wavelength of 530 nm, and a wavelength of 630 nm. For all the wavelengths, with the existing configuration with no low refractive index layer, the reflectance significantly decreased at an incident angle larger than or equal to 50 degrees. On the other hand, with the configuration of the present example with a low refractive index layer, the reflectance at an incident angle larger than or equal to 50 degrees significantly improved, and the all-angle mean reflectances for 460 nm, 530 nm, 630 nm were respectively 91% or higher, 96% or higher and 94% or higher.

Reflective Layer A, Reflective Layer B, and Reflective Layer C

The all-angle mean transmittance of the reflective layer A with a low refractive index layer having a refractive index of 1.15 for a wavelength of 460 nm was 19.8%, and the all-angle mean transmittance of the reflective layer B with a low refractive index layer having a refractive index of 1.15 for a wavelength of 460 nm was 6.5%.

The all-angle mean reflectance of the reflective layer C with a low refractive index layer having a refractive index of 1.15 in the range of zero degrees to 30 degrees for a wavelength of 460 nm was 50.5%, and the all-angle mean reflectance in the range of 30 degrees to 90 degrees was 96.6%. The all-angle mean reflectance for a wavelength of 530 nm was 98.7%, and the all-angle mean reflectance for a wavelength of 630 nm was 97.7%.

When Al was Used as Reflective Layer

Measurement results are shown in Table 3-1 (Configuration 3-9 to Configuration 3-14). For all the wavelengths, when the low refractive index layer is provided, light that enters at an incident angle larger than or equal to about 50 degrees totally reflects with no loss, so the reflectance improves.

For 460 nm blue light, as compared to the configuration with no low refractive index layer (Configuration 3-14), as the refractive index of the low refractive index layer decreases, the reflectance increases, and, when the refractive index of the low refractive index layer is lower than or equal to 1.30, the all-angle mean reflectance is higher than or equal to 93%. When the refractive index of the low refractive index layer is 1.15, the all-angle mean reflectance is higher than or equal to 95%.

For 530 nm green light, as compared to the configuration with no low refractive index layer (Configuration 3-14), as the refractive index of the low refractive index layer decreases, the reflectance increases, and, when the refractive index of the low refractive index layer is lower than or equal to 1.30, the all-angle mean reflectance is higher than or equal to 93%. When the refractive index of the low refractive index layer is 1.15, the all-angle mean reflectance is higher than or equal to 94%.

For 630 nm red light, as compared to the configuration with no low refractive index layer (Configuration 3-14), as the refractive index of the low refractive index layer decreases, the reflectance increases, and, when the refractive index of the low refractive index layer is lower than or equal to 1.30, the all-angle mean reflectance is higher than or equal to 92%. When the refractive index of the low refractive index layer is 1.15, the all-angle mean reflectance is higher than or equal to 94%.

TABLE 3-1

| CONFIGURATION | REFLECTIVE LAYER | REFRACTIVE INDEX OF LOW REFRACTIVE INDEX LAYER | ALL-ANGLE MEAN REFLECTANCE (%) FOR 460 nm | ALL-ANGLE MEAN REFLECTANCE (%) FOR 530 nm | ALL-ANGLE MEAN REFLECTANCE (%) FOR 630 nm |
|---|---|---|---|---|---|
| 3-1 | D | 1.10 | 98.8% | 99.6% | 99.0% |
| 3-2 | D | 1.15 | 98.4% | 99.2% | 97.7% |
| 3-3 | D | 1.20 | 97.6% | 98.4% | 96.1% |
| 3-4 | D | 1.25 | 95.3% | 96.5% | 93.6% |
| 3-5 | D | 1.30 | 92.9% | 93.7% | 90.6% |
| 3-6 | D | NOT PROVIDED | 89.5% | 79.8% | 75.7% |
| 3-7 | D(THIN) | 1.15 | 91.9% | 96.3% | 94.7% |
| 3-8 | D(THIN) | NOT PROVIDED | 77.1% | 76.1% | 75.2% |

TABLE 3-1-continued

| CONFIGURATION | REFLECTIVE LAYER | REFRACTIVE INDEX OF LOW REFRACTIVE INDEX LAYER | ALL-ANGLE MEAN REFLECTANCE (%) FOR 460 nm | ALL-ANGLE MEAN REFLECTANCE (%) FOR 530 nm | ALL-ANGLE MEAN REFLECTANCE (%) FOR 630 nm |
|---|---|---|---|---|---|
| 3-9 | Al | 1.10 | 95.7% | 95.2% | 94.8% |
| 3-10 | Al | 1.15 | 95.0% | 94.5% | 94.0% |
| 3-11 | Al | 1.20 | 94.3% | 93.7% | 93.1% |
| 3-12 | Al | 1.25 | 94.3% | 93.7% | 93.1% |
| 3-13 | Al | 1.30 | 93.9% | 93.3% | 92.7% |
| 3-14 | Al | NOT PROVIDED | 91.0% | 90.0% | 89.0% |

Preparation of Display Element

After black resist was applied on a glass substrate, the glass substrate with the black resist was subjected to pre-baking, pattern exposure, development, and post-baking, with the result that a substrate having a patterned partition wall (black matrix) was formed. The width of a sub-pixel was 10 μm by 10 μm, the width of the partition wall was 5 μm, and the depth of the opening was 10 μm. The reflective layer D was formed on the partition wall by oblique evaporation with a similar process to that of preparation of the reflective layer D. After that, a low refractive index layer with a refractive index of 1.10 was formed on the reflective layer D by a spray method to form a reflective layer (Configuration 3-1). The reflective layer C was prepared on a glass substrate with a similar process to that of preparation of the reflective layer C, and a low refractive index layer having a refractive index of 1.15 was formed on the reflective layer C. On top of this, a substrate having an opening partitioned by a partition wall was stacked, and a green wavelength conversion layer (first wavelength conversion layer) with a thickness of 10 μm and a red wavelength conversion layer (second wavelength conversion layer) with a thickness of 10 μm were formed in the opening by an inkjet method. Here, the aspect ratio of the wavelength conversion layer (the ratio of height to width of the wavelength conversion layer) is 1.0. The green wavelength conversion layer and the red wavelength conversion layer were prepared by containing quantum dots and light scattering particles in a resin portion. The UV curing resin was 57 wt % of benzyl acrylate, the photopolymerization initiator was 3 wt % of 2,4,6-trimethylbenzoyl)phosphine oxide, the light scattering particles were 20 wt % of titanium oxide, and the phosphor particles were 20 wt % of InP/ZnS quantum dots. A low refractive index layer having a refractive index of 1.15 was formed on each of the green wavelength conversion layer and the red wavelength conversion layer, and a reflective layer A and a reflective layer B were formed. The optical member with a thickness of 50 μm was formed as a display element. Separately, a resin portion that does not contain quantum dots and that contains only 20 wt % of titanium oxide as light scattering particles was formed with a thickness of 10 μm as the resin portion of the blue sub-pixel region. At this time, the composition of each of the UV curing resin and photopolymerization initiator of the resin portion was the same as those of the green wavelength conversion layer and the red wavelength conversion layer. Furthermore, the optical member with a thickness of 50 μm was formed as a display element. The reason why the display element with only the blue sub-pixel region is separately prepared is to evaluate only the blue sub-pixel region by eliminating the influence of leakage of blue excitation light from the green wavelength conversion layer and the red wavelength conversion layer.

Example 3-2

Except the reflective layer D was Configuration 3-2, the display element was similarly prepared as in the case of Example 3-1.

Example 3-3

Except the reflective layer D was Configuration 3-3, the display element was similarly prepared as in the case of Example 3-1.

Example 3-4

Except the reflective layer D was Configuration 3-4, the display element was similarly prepared as in the case of Example 3-1.

Example 3-5

Except the reflective layer D was Configuration 3-5, the display element was similarly prepared as in the case of Example 3-1.

Example 3-6

Except the reflective layer D was Configuration 3-7, the display element was similarly prepared as in the case of Example 3-1.

Example 3-7

Except the reflective layer D was Configuration 3-2 and the aspect ratio of the wavelength conversion layer was set to 0.5, the display element was similarly prepared as in the case of Example 3-1. The aspect ratio of the wavelength conversion layer was changed by preparing a patterned partition wall substrate with a changed opening width of a sub-pixel.

Example 3-8

Except the reflective layer D was Configuration 3-2 and the aspect ratio of the wavelength conversion layer was set to 1.5, the display element was similarly prepared as in the case of Example 3-1. The aspect ratio of the wavelength conversion layer was changed by preparing a patterned partition wall substrate with a changed opening width of a sub-pixel.

Example 3-9

Except the reflective layer D was Configuration 3-2 and the aspect ratio of the wavelength conversion layer was set to 2.0, the display element was similarly prepared as in the case of Example 3-1. The aspect ratio of the wavelength conversion layer was changed by preparing a patterned partition wall substrate with a changed opening width of a sub-pixel.

Example 3-10

Except the reflective layer D was Configuration 3-2 and the aspect ratio of the wavelength conversion layer was set to 3.0, the display element was similarly prepared as in the case of Example 3-1. The aspect ratio of the wavelength conversion layer was changed by preparing a patterned partition wall substrate with a changed opening width of a sub-pixel.

Example 3-11

Except the reflective layer D was Configuration 3-9, the display element was similarly prepared as in the case of Example 3-1.

Example 3-12

Except the reflective layer D was Configuration 3-10, the display element was similarly prepared as in the case of Example 3-1.

Example 3-13

Except the reflective layer D was Configuration 3-11, the display element was similarly prepared as in the case of Example 3-1.

Example 3-14

Except the reflective layer D was Configuration 3-12, the display element was similarly prepared as in the case of Example 3-1.

Example 3-15

Except the reflective layer D was Configuration 3-13, the display element was similarly prepared as in the case of Example 3-1.

Example 3-16

Except the reflective layer D was Configuration 3-10 and the aspect ratio of the wavelength conversion layer was set to 3.0, the display element was similarly prepared as in the case of Example 3-1. The aspect ratio of the wavelength conversion layer was changed by preparing a patterned partition wall substrate with a changed opening width of a sub-pixel.

Comparative Example 3-1

Except the reflective layer D was Configuration 3-6, the display element was similarly prepared as in the case of Example 3-1.

Comparative Example 3-2

Except the reflective layer D was Configuration 3-8, the display element was similarly prepared as in the case of Example 3-1.

Comparative Example 3-3

Except the reflective layer D was Configuration 3-6 and the aspect ratio of the wavelength conversion layer was set to 0.5, the display element was similarly prepared as in the case of Example 3-1. The aspect ratio of the wavelength conversion layer was changed by preparing a patterned partition wall substrate with a changed opening width of a sub-pixel.

Comparative Example 3-4

Except the reflective layer D was Configuration 3-6 and the aspect ratio of the wavelength conversion layer was set to 3.0, the display element was similarly prepared as in the case of Example 3-1. The aspect ratio of the wavelength conversion layer was changed by preparing a patterned partition wall substrate with a changed opening width of a sub-pixel.

Comparative Example 3-5

Except the reflective layer D was Configuration 3-14, the display element was similarly prepared as in the case of Example 3-1.

Comparative Example 3-6

Except the reflective layer D was Configuration 3-14 and the aspect ratio of the wavelength conversion layer was set to 3.0, the display element was similarly prepared as in the case of Example 3-1. The aspect ratio of the wavelength conversion layer was changed by preparing a patterned partition wall substrate with a changed opening width of a sub-pixel.

Evaluation of Luminance

A blue LED (peak emission wavelength: 460 nm) was used, an integrating sphere was connected to a multichannel spectrometer C10027-01 (Hamamatsu Photonics), and the integrating sphere was installed above the blue LED. A display element made up of a wavelength conversion layer was inserted between the blue LED and the integrating sphere, the blue LED was turned on, and an integral value of emission spectrum at 530 nm±30 nm of the prepared green wavelength conversion layer and an integral value of emission spectrum at 630 nm±30 nm of the prepared red wavelength conversion layer were measured as luminances. A display element made up of a blue sub-pixel region was inserted between the blue LED and the integrating sphere, the blue LED was turned on, and an integral value of spectrum at 460 nm±30 nm was measured as a luminance. Here, the luminance value of the green wavelength conversion layer and the luminance value of the red wavelength conversion layer each are a value normalized by the volume of the wavelength conversion layer. Table 3-2 shows the relative luminance values of green, red, and blue. Even in any example, no reflective layer is provided on the upper surface of the resin portion of the blue sub-pixel region.

When comparison is made in the case where a dielectric multilayer film is used as a reflective layer D for a wavelength conversion layer with an aspect ratio of one (Example 3-1 to Example 3-5), the luminances of green and red with the configuration of the present example improve as compared to Comparative Example 3-1 with no low refractive index layer. When the low refractive index layer with a refractive index lower than or equal to 1.15 is used (Configuration 3-1 or Configuration 3-2), the luminances of green and red both improve by 15% or higher.

When a thin dielectric multilayer film is used as a reflective layer D (Example 3-6) as well, the luminances of green and red improve by 15% or higher as compared to Comparative Example 3-2 with no low refractive index layer.

When comparison is made in the case where a dielectric multilayer film is used as a reflective layer D and the aspect ratio is changed, a change in luminance in the case where the aspect ratio is changed from 0.5 to 3.0 (Example 3-7 to Example 3-10) falls within 5% in the present example. On the other hand, in the case where no low refractive index layer was provided (Comparative Example 3-3 or Comparative Example 3-4), as the aspect ratio increased, the luminance decreased. This is because, as the aspect ratio increases, the number of reflections on the partition wall increases before light is extracted and, therefore, when the reflectance is low at the partition wall, a loss increases accordingly.

When comparison is made in the case where Al is used as a reflective layer D for a wavelength conversion layer with an aspect ratio of one (Example 3-11 to Example 3-15), the luminances of green and red with the configuration of the present example improve as compared to Comparative Example 3-5 with no low refractive index layer. When the low refractive index layer with a refractive index of lower than or equal to 1.15 is used (Configuration 3-1 or Configuration 3-2), the luminances of green and red both improve by 4% or higher.

A decrease in luminance in the case where Al was used as the reflective layer D and the aspect ratio was changed to 3.0 (Example 3-16) was about 10%. On the other hand, with Comparative Example 3-6 with no low refractive index layer with an aspect ratio of 3.0, the luminance decreased by about 20%. This is because, as the aspect ratio increases, the number of reflections on the partition wall increases before light is extracted and, therefore, when the reflectance is low at the partition wall, a loss increases when Al is used.

TABLE 3-2

| | REFLECTIVE LAYER D | ASPECT RATIO (THICKNESS TO WIDTH OF WAVELENGTH CONVERSION LAYER) | GREEN LUMINANCE RELATIVE VALUE | RED LUMINANCE RELATIVE VALUE | BLUE LUMINANCE RELATIVE VALUE |
|---|---|---|---|---|---|
| EXAMPLE 3-1 | CONFIGURATION 3-1 | 1.0 | 100 | 99 | 99 |
| EXAMPLE 3-2 | CONFIGURATION 3-2 | 1.0 | 99 | 98 | 99 |
| EXAMPLE 3-3 | CONFIGURATION 3-3 | 1.0 | 99 | 97 | 98 |
| EXAMPLE 3-4 | CONFIGURATION 3-4 | 1.0 | 98 | 96 | 97 |
| EXAMPLE 3-5 | CONFIGURATION 3-5 | 1.0 | 96 | 94 | 95 |
| EXAMPLE 3-6 | CONFIGURATION 3-7 | 1.0 | 98 | 96 | 95 |
| EXAMPLE 3-7 | CONFIGURATION 3-2 | 0.5 | 100 | 100 | 100 |
| EXAMPLE 3-8 | CONFIGURATION 3-2 | 1.5 | 99 | 97 | 98 |
| EXAMPLE 3-9 | CONFIGURATION 3-2 | 2.0 | 99 | 96 | 97 |
| EXAMPLE 3-10 | CONFIGURATION 3-2 | 3.0 | 98 | 94 | 96 |
| EXAMPLE 3-11 | CONFIGURATION 3-9 | 1.0 | 97 | 97 | 97 |
| EXAMPLE 3-12 | CONFIGURATION 3-10 | 1.0 | 96 | 96 | 97 |
| EXAMPLE 3-13 | CONFIGURATION 3-11 | 1.0 | 96 | 95 | 96 |
| EXAMPLE 3-14 | CONFIGURATION 3-12 | 1.0 | 96 | 95 | 96 |
| EXAMPLE 3-15 | CONFIGURATION 3-13 | 1.0 | 96 | 95 | 96 |
| EXAMPLE 3-16 | CONFIGURATION 3-10 | 3.0 | 85 | 84 | 86 |
| COMPARATIVE EXAMPLE 3-1 | CONFIGURATION 3-6 | 1.0 | 87 | 84 | 93 |
| COMPARATIVE EXAMPLE 3-2 | CONFIGURATION 3-8 | 1.0 | 84 | 83 | 85 |
| COMPARATIVE EXAMPLE 3-3 | CONFIGURATION 3-6 | 0.5 | 96 | 96 | 98 |
| COMPARATIVE EXAMPLE 3-4 | CONFIGURATION 3-6 | 3.0 | 53 | 46 | 73 |
| COMPARATIVE EXAMPLE 3-5 | CONFIGURATION 3-14 | 1.0 | 93 | 93 | 94 |
| COMPARATIVE EXAMPLE 3-6 | CONFIGURATION 3-14 | 3.0 | 74 | 72 | 77 |

Embodiments of the present invention are not limited to the above-described embodiments. Various changes or modifications are applicable without departing from the spirit and scope of the present invention. Therefore, the following claims are attached to show the scope of the present invention.

With the display element according to the aspects of the present invention, for a display element that includes a sub-pixel region including a wavelength conversion layer that converts the wavelength of excitation light, leakage of excitation light in the sub-pixel region is reduced. As a result, it is possible to provide a display element and a display apparatus capable of implementing a high color purity and a high luminous efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A display element comprising:

a light source portion that emits excitation light;

a wavelength conversion portion that converts the excitation light to light with a wavelength longer than a wavelength of the excitation light;

an excitation light reflective layer that reflects the excitation light having penetrated through the wavelength conversion portion; and an optical member that transmits light converted by the wavelength conversion portion, in this order, wherein the wavelength conversion portion includes a first wavelength conversion layer that converts the excitation light to first wavelength converted light with a wavelength longer than the wavelength of the excitation light, and a second wavelength conversion layer that converts the excitation light to second wavelength converted light with a wavelength longer than the wavelength of the first wavelength converted light, the display element is a component of a pixel that includes a green sub-pixel region including the first wavelength conversion layer, a red sub-pixel region including the second wavelength conversion layer, and a blue sub-pixel region not including the first wavelength conversion layer or the second wavelength conversion layer, the display element further comprises a low refractive index layer provided in a region between the wavelength conversion portion and the optical member, a surface of the low refractive index layer adjacent to the wavelength conversion portion is an interface at which the low refractive index layer is in contact with a region having a higher refractive index than the low refractive index layer, the excitation light is blue light, the blue sub-pixel region has a resin portion containing light scattering particles that scatter the blue light, and an all-angle mean transmittance of the excitation light reflective layer for the blue light is lower than or equal to 32%.

2. The display element according to claim 1, wherein the excitation light reflective layer is a dielectric multilayer film.

3. The display element according to claim 2, wherein the dielectric multilayer film includes a laminated body in which a layer containing $TiO_2$ and a layer containing $SiO_2$ are alternately laminated.

4. The display element according to claim 1, wherein the all-angle mean transmittance of the excitation light reflective layer for the blue light is lower than or equal to 20%.

5. The display element according to claim 1, wherein the excitation light reflective layer is provided one by one for each of the red sub-pixel region and the green sub-pixel region, and an all-angle mean transmittance of the excitation light reflective layer for the blue light, provided for the red sub-pixel region, is lower than or equal to 15%.

6. The display element according to claim 1, wherein the excitation light reflective layer is provided one by one for each of the red sub-pixel region and the green sub-pixel region, and an all-angle mean transmittance of the excitation light reflective layer for the blue light, provided for the red sub-pixel region, is lower than or equal to 7%.

7. The display element according to claim 1, wherein the refractive index of the low refractive index layer is higher than or equal to 1.10 and lower than or equal to 1.30.

8. The display element according to claim 1, wherein the refractive index of the low refractive index layer is higher than or equal to 1.10 and lower than or equal to 1.15.

9. The display element according to claim 1, wherein a thickness of the low refractive index layer is greater than or equal to 200 nm.

10. The display element according to claim 1, wherein a thickness of the low refractive index layer is less than or equal to one-half a thickness of the wavelength conversion portion.

11. The display element according to claim 1, wherein a thickness of the low refractive index layer is less than or equal to 2 μm.

12. The display element according to claim 1, wherein the low refractive index layer contains fumed silica particles.

13. The display element according to claim 1, wherein a voidage of the low refractive index layer is higher than or equal to 60.0% and lower than or equal to 95.0%.

14. The display element according to claim 1, wherein the low refractive index layer is formed by an inkjet method.

15. The display element according to claim 1, wherein the first wavelength conversion layer and the second wavelength conversion layer contain quantum dots.

16. The display element according to claim 1, wherein a thickness of each of the first wavelength conversion layer and the second wavelength conversion layer is greater than or equal to 6 μm and less than or equal to 10 μm.

17. The display element according to claim 1, further comprising a partition wall provided between any adjacent two of the green sub-pixel region, the red sub-pixel region, and the blue sub-pixel region, wherein a surface of the low refractive index layer adjacent to the wavelength conversion portion is located closer to the wavelength conversion portion than to a top surface of the partition wall adjacent to the optical member.

18. The display element according to claim 1, wherein the optical member includes a microlens.

19. The display element according to claim 1, wherein the excitation light is ultraviolet light, the wavelength conversion portion includes a third wavelength conversion layer that converts the excitation light to third wavelength converted light with a wavelength longer than the wavelength of the excitation light and shorter than the wavelength of the first wavelength converted light, and the blue sub-pixel region includes the third wavelength conversion layer.

* * * * *